United States Patent [19]
Mori et al.

[11] Patent Number: 5,641,054
[45] Date of Patent: Jun. 24, 1997

[54] MAGNETIC LEVITATION CONVEYOR APPARATUS

[75] Inventors: Satoshi Mori; Masao Matsumura; Yoichi Kanemitsu; Takeshi Yoshioka; Masaaki Kajiyama; Fumio Kondo; Yuji Shirao; Masato Eguchi; Hiroyuki Shinozaki, all of Kanagawa-ken; Yukio Ikeda, Tokyo; Masayoshi Hirose, Tokyo; Masaru Nakaniwa, Tokyo; Norio Kimura, Tokyo; Katsuaki Usui, Tokyo; Katsuyuki Aoki, Tokyo, all of Japan

[73] Assignee: Ebara Corporation, Tokyo, Japan

[21] Appl. No.: 362,451

[22] PCT Filed: Jul. 6, 1993

[86] PCT No.: PCT/JP93/00930

§ 371 Date: Mar. 7, 1995

§ 102(e) Date: Mar. 7, 1995

[87] PCT Pub. No.: WO94/01354

PCT Pub. Date: Jan. 20, 1994

[30] Foreign Application Priority Data

| Jul. 7, 1992 | [JP] | Japan | 4-202989 |
| Jul. 9, 1992 | [JP] | Japan | 4-206010 |
| Jul. 13, 1992 | [JP] | Japan | 4-208472 |
| Jul. 15, 1992 | [JP] | Japan | 4-210954 |
| Jul. 18, 1992 | [JP] | Japan | 4-213624 |
| Aug. 4, 1992 | [JP] | Japan | 4-228042 |
| Oct. 8, 1992 | [JP] | Japan | 4-296405 |
| Oct. 16, 1992 | [JP] | Japan | 4-304640 |
| Nov. 19, 1992 | [JP] | Japan | 4-333715 |
| Jan. 19, 1993 | [JP] | Japan | 5-023721 |
| Feb. 17, 1993 | [JP] | Japan | 5-049895 |

[51] Int. Cl.⁶ .................................... B65G 35/00

[52] U.S. Cl. ............ 198/619; 198/465.1; 104/284; 104/292

[58] Field of Search ............ 198/465.1, 465.2, 198/619; 104/281, 284, 290, 292

[56] References Cited

U.S. PATENT DOCUMENTS

| 4,766,993 | 8/1988 | Kita et al. | |
| 4,825,773 | 5/1989 | Morishita | 104/281 |
| 5,222,436 | 6/1993 | Coffey | 104/281 |
| 5,360,470 | 11/1994 | Ono et al. | 104/284 |

FOREIGN PATENT DOCUMENTS

| 0239266 | 9/1987 | European Pat. Off. |
| 0480547A1 | 4/1992 | European Pat. Off. |
| 0640373 | 3/1995 | European Pat. Off. |
| 53-34272 | 3/1978 | Japan |
| 59-146326 | 3/1978 | Japan |
| 60-36222 | 2/1985 | Japan |
| 61-88707 | 6/1986 | Japan |
| 61-277303 | 12/1986 | Japan |

(List continued on next page.)

OTHER PUBLICATIONS

Patent Abstracts of Japan; vol. 9; No. 162 (M-394) [1885]; Jul. 6, 1985 re: Japanese Application No: 60-36222.

*Primary Examiner*—Joseph E. Valenza
*Attorney, Agent, or Firm*—Armstrong, Westerman, Hattori, McLeland & Naughton

[57] ABSTRACT

A magnetic levitation conveyor apparatus has levitation electromagnets, linear motors, and displacement sensors which are disposed outside of a tunnel, and a carriage of simple structure which is movable in the tunnel. The carriage is of canned structure for preventing gases from being generated. The carriage of canned structure allows the tunnel to have a reduced cross-sectional area and to be filled with a highly purified atmosphere such as of a high vacuum. The tunnel has substantially orthogonal branches at a branched point. In the branched point, the carriage can move, while being lifted out of contact with the tunnel partition, with a directional change from a main conveyor passage into a branched conveyor passage. The magnetic levitation conveyor apparatus is highly practical as it can control the carriage to be lifted and moved as described above.

16 Claims, 38 Drawing Sheets

FOREIGN PATENT DOCUMENTS

| | | |
|---|---|---|
| 61-295926 | 12/1986 | Japan . |
| 63-194502 | 8/1988 | Japan . |
| 1-134998 | 9/1989 | Japan . |
| 1-228530 | 9/1989 | Japan . |
| 1-299119 | 12/1989 | Japan . |
| 3-190507 | 8/1991 | Japan . |
| 4-75404 | 3/1992 | Japan . |
| 624559 | 2/1994 | Japan ..................... 198/619 |
| 624561 | 2/1994 | Japan ..................... 198/619 |

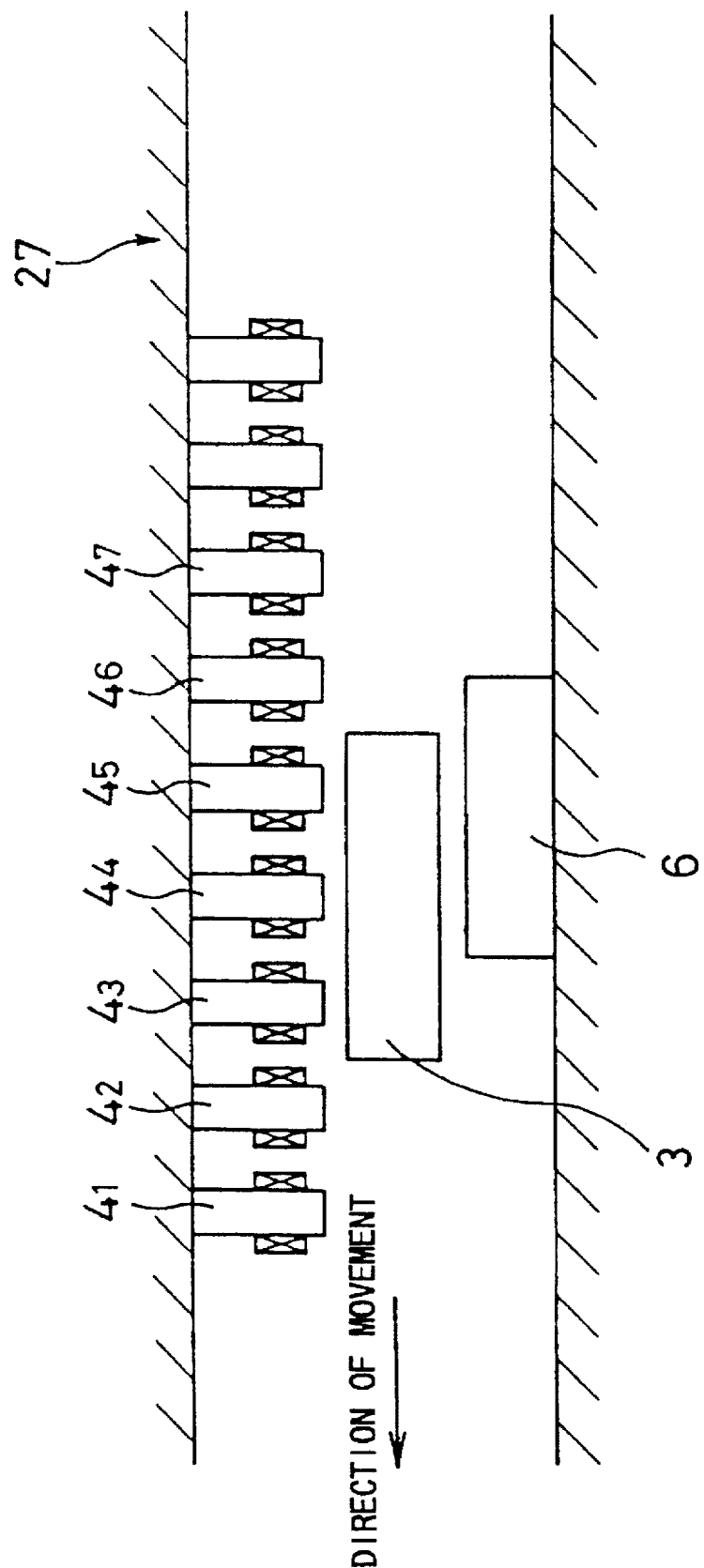

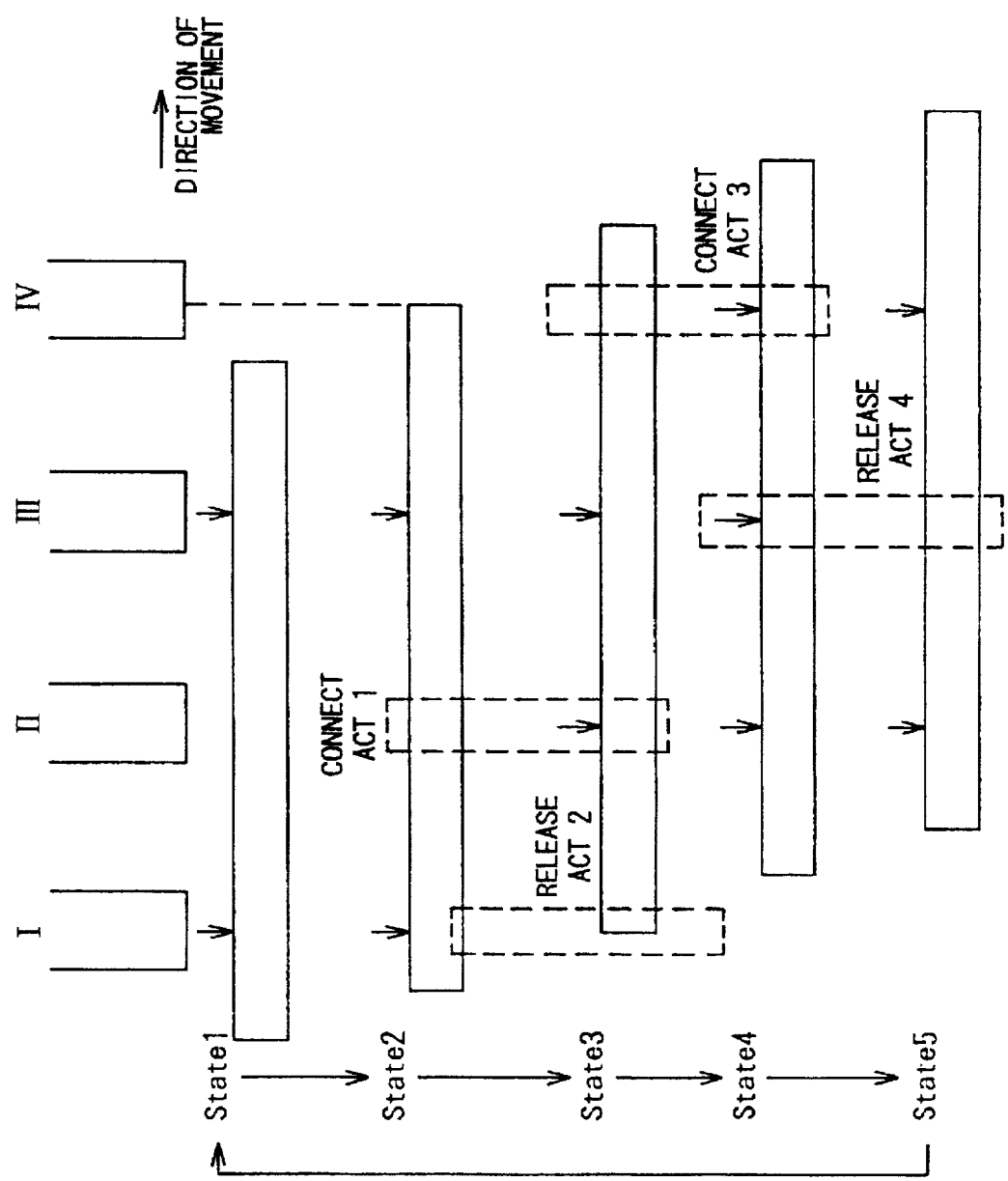

MAGNETIC LEVITATION CONVEYOR APPARATUS

TECHNICAL FIELD

The present invention relates to a magnetic levitation conveyor apparatus, and more particularly to a magnetic levitation conveyor apparatus having a carriage for carrying a workpiece such as a wafer or the like in a tunnel that is kept in a highly clean atmosphere such as a vacuum or the like, the carriage being magnetically levitated for movement out of contact with a partition.

BACKGROUND ART

There have been growing demands in the process of semiconductor fabrication for transferring and receiving a wafer between various processing steps entirely in a clean space. Since semiconductor products tend to become easily defective when contaminated by impurities, they should preferably be conveyed in a clean room which is highly purified. As semiconductors are processed to smaller dimensions, the diameter of particles which cause problems is smaller. Therefore, it is difficult to produce desirable purified spaces in conventional clean rooms. It has been considered to convey a wafer or the like in a vacuum where particles are not suspended in the space because of less Brownian motion. Specifically, there has heretofore been proposed a magnetic levitation conveyor apparatus having a carriage for carrying a workpiece such as a wafer or the like in a vacuum maintained in a tunnel, the carriage being magnetically levitated for movement out of contact with a partition.

There has also been proposed a magnetic levitation conveyor apparatus having a carriage movable out of contact with a partition of a tunnel which is filled with a clean nitrogen gas or the like, rather than a vacuum.

For example, Japanese laid-open patent publications Nos. 61-295926 and 1-299119 disclose magnetic levitation vacuum conveyor apparatus in which a carriage that is magnetically levitated is movable along a conveyor passage in a partition maintained in a highly purified vacuum environment. Japanese laid-open patent publication No. 63-194502 and Japanese laid-open utility model publication No. 1-134998 disclose magnetic levitation vacuum conveyor apparatus of the type in which members that possibly produce dirt and dust particles are housed in the tunnel, i.e., levitating electromagnets, displacement sensors, and linear motors which are arrayed in a conveyor passage are housed in the tunnel (can), and a carriage is movable in a vacuum (purified atmosphere) outside of the tunnel (can).

Japanese laid-open patent publications Nos. 53-34272, 61-277303, 4-75404, and Japanese laid-open utility model publication No. 59-146326 disclose magnetic levitation conveyor apparatus having a carriage (movable body) suspended under magnetic attractive forces produced by levitating electromagnets arrayed along a conveyor passage for movement while being levitated off the conveyor passage.

In the magnetic levitation conveyor apparatus in which the carriage in a vacuum tunnel (partition) is movable while being suspended by levitating electromagnets disposed outside of the partition as disclosed in Japanese laid-open patent publication No. 61-295926, however, it is necessary to install a permanent magnet on the carriage, and the partition is required to be of a complex cross-sectional shape. Since various parts of the carriage and the partition itself discharge various gases and produce fine particles, it has been difficult to create a high degree of vacuum, and the workpiece carried by the carriage tends to be contaminated.

In the case where a purified space is produced by passing a nitrogen gas in a tunnel, it has been customary to place levitating electromagnets, linear motors, etc. in the tunnel. However, inasmuch particles deposited in gaps between electromagnet coils cannot fully be removed, these particles are discharged into the tunnel. Because the electromagnets are disposed in the tunnel, it has been quite laborsome to replace any of the electromagnet coils which is broken.

In the magnetic levitation vacuum conveyor apparatus of the type in which members that possibly produce dirt and dust particles are housed in the tunnel, cables for supplying a control current to the levitating electromagnets, the displacement sensors, or the linear motors in the tunnel (can) are exposed in a highly purified atmosphere such as a vacuum. Such an arrangement poses a problem on the handling of the cables, and the maintenance of components in the tunnel (can).

The present invention has been made in view of the above drawbacks. It is an object of the present invention to provide a magnetic levitation conveyor apparatus which has levitating electromagnets, linear motors, displacement sensors, etc. that are disposed outside of a tunnel, and a carriage movable in the tunnel, the carriage being of a simple structure, i.e., a canned structure, for preventing gases from being produced, the tunnel having a reduced cross section for being highly purified therein, and the carriage being well controllable to be levitated and moved in the tunnel.

The process of semiconductor fabrication employs a variety of processing apparatus for carrying out lithography, growing various films, and diffusing materials. These processing apparatus have to be interconnected by tunnels in which semiconductor wafers or the like need to be conveyed through a highly purified (high vacuum) atmosphere.

Accordingly, it is another object of the present invention to provide a practical magnetic levitation conveyor apparatus including a tunnel which has a branch, and a carriage that can be levitated in the tunnel and moved from a main conveyor passage into a branched conveyor passage at the branched point while being held out of contact with a partition of the tunnel.

DISCLOSURE OF THE INVENTION

A first aspect of the present invention is concerned with a tunnel structure in a magnetic levitation conveyor apparatus having a tunnel defined by a partition, a carriage disposed in said tunnel, a plurality of levitation electromagnets for lifting the carriage out of the partition, linear motors for moving the carriage, and displacement sensors for detecting a vertical distance up to said carriage, characterized in that said levitation electromagnets, said linear motors, and said displacement sensors are disposed outside of said partition, and housed in respective thin-wall casings extending through said partition and partly exposed in said tunnel.

A second aspect of the present invention is concerned with the structure of a conveyor passage and a carriage in a magnetic levitation conveyor apparatus comprising a tunnel defined by a partition and having substantially orthogonal branched passages, a carriage movable in a levitated state through said tunnel for conveying a workpiece, levitation electromagnets having at least two rows of magnetic poles disposed on an upper portion of said partition for lifting the carriage out of contact with the partition, electromagnets serving as linear motors and having at least one row of magnetic poles disposed on said partition for moving said carriage out of contact with the partition, at least two rows of displacement sensors disposed on said partition for detecting a levitated position of said carriage, and control circuits for controlling exciting currents supplied to said levitation electromagnets based on output signals from said displacement sensors, said carriage having, on an upper surface thereof, two parallel magnetic elements corresponding to said two rows of magnetic poles of the levitation electromagnets and two parallel magnetic elements perpendicular to the first-mentioned two parallel magnetic elements, and also having, on a lower surface thereof, an electrically conductive member corresponding to the magnetic poles of the electromagnets serving as the linear motors.

BRIEF DESCRIPTION OF THE DRAWINGS

FIG. 1 is a cross-sectional view of the structure of a tunnel; FIG. 2 is an enlarged cross-sectional view showing the relation between a levitating electromagnet and a thin-wall cap; and FIG. 3 is an enlarged cross-sectional view showing the relation between a displacement sensor and a thin-wall cap.

FIG. 4 is a set of cross-sectional views of the structures of a tunnel; FIG. 5 is a plan view of FIG. 4; and FIG. 6 is an enlarged fragmentary cross-sectional view of FIG. 5.

FIG. 7 is a sectional front elevational view of the structure of a conveyor passage and a carriage; FIG. 8 is an enlarged partial front elevational view illustrative of the relative positional relation between a plate member 20 of magnetic material and magnetic poles of a levitating electromagnet 4; FIG. 9 is a perspective view of the carriage used in the conveyor apparatus shown in FIGS. 7 and 8; FIG. 10 is a view showing the layout of magnetic pole surfaces of levitating electromagnets at a branched point of a tunnel which has a substantially orthogonal branch; FIG. 11 is illustrative of the structure of a magnetic member fixed to an upper surface of the carriage, (A) being a plan view showing the relation between the magnetic member and magnetic pole surfaces of levitating electromagnets, (B) being a side elevational view showing the relation between the magnetic member and magnetic pole surfaces of levitating electromagnets, and (C) being a perspective view of the magnetic member; FIG. 12 is illustrative of the structure of the magnetic member fixed to the upper surface of the carriage, (A) being a plan view showing the relation between the magnetic member and magnetic pole surfaces of levitating electromagnets, (B) being a side elevational view showing the relation between the magnetic member and magnetic pole surfaces of levitating electromagnets, and (C) being an enlarged partial view of (B); FIG. 13 is illustrative of the structure of a grooved magnetic member, (A) being a plan view showing the shape of the magnetic member, (B) being a side elevational view showing the positional relation between the magnetic member and C-shaped magnetic poles of levitating electromagnets, and (C) being an enlarged view of (B); and FIGS. 14, 15, and 16 are perspective views of various configurations of magnetic members fixed to the upper surface of the carriage in this embodiment.

FIGS. 17 through 24 show a magnetic levitation conveyor apparatus according to a sixth embodiment of the present invention. FIG. 17 is a plan view of the structure of a conveyor passage at a branched point, showing a condition prior to switching directions of movement; FIG. 18 is an elevational view of the conveyor passage shown in FIG. 17; FIG. 19 is an enlarged partial perspective view of FIG. 17, showing a condition in which a carriage moves in a main conveyor passage; FIG. 20 is an enlarged partial perspective view of FIG. 17, showing a condition in which the carriage is positioned in a branched point; FIG. 21 is a block diagram of a control system; FIG. 22 is a set of views showing a procedure for switching operative/inoperative magnetic poles of levitating electromagnets; and FIGS. 23 and 24(A), 24(B) are diagrams showing the manner in which the gain of the levitating electromagnets is controlled, the horizontal axis representing the magnetic pole switching time and the vertical axis representing the value of gain.

FIGS. 25 through 30 show a magnetic levitation conveyor apparatus according to a seventh embodiment of the present invention. FIG. 25 is a cross-sectional view along a conveyor passage; FIG. 26 is a block diagram of a control system of the magnetic levitation conveyor apparatus; FIG. 27 is a diagram illustrative of a sequence of switching conventional levitation magnetic poles; FIG. 28 is a set of diagrams illustrative of switching of the conventional magnetic poles; FIG. 29 is a diagram illustrative of switching of magnetic poles according to the present invention; and FIG. 30 is a set of diagrams illustrative of switching of magnetic poles according to another arrangement of the present invention.

FIG. 31 is a block diagram of a control system; FIG. 32 is a diagram showing time-depending characteristics of an offset voltage at the time a carriage is landed; and FIG. 33 is a diagram showing time-depending characteristics of an offset voltage at the time the carriage is levitated.

FIG. 35 is a cross-sectional view of the structure of a conveyor passage and a carriage; and FIG. 36 is a plan view of the structure of the conveyor passage and the carriage.

FIG. 37 is a cross-sectional view of a conveyor passage structure having a vertical conveyor passage; and FIG. 38 is a view illustrating in detail the structure of a table and a carriage.

FIG. 39 is a view showing a connection between a tunnel and a processing apparatus; FIG. 40 is a view showing a connection between a tunnel and a processing apparatus according to another arrangement; and FIG. 41 is a view showing a connection between a tunnel and a processing apparatus according to a conventional arrangement.

BEST MODE FOR CARRYING OUT THE INVENTION

The present invention will be described in detail with reference to the accompanying drawings. In embodiments described below, the interior space of a tunnel is kept in a vacuum condition. However, the present invention is also applicable to an arrangement in which a clean gas such as a nitrogen (N$_2$) gas or the like is flowed in a tunnel to create a purified space isolated from the exterior.

(1st embodiment)

Figure 1:
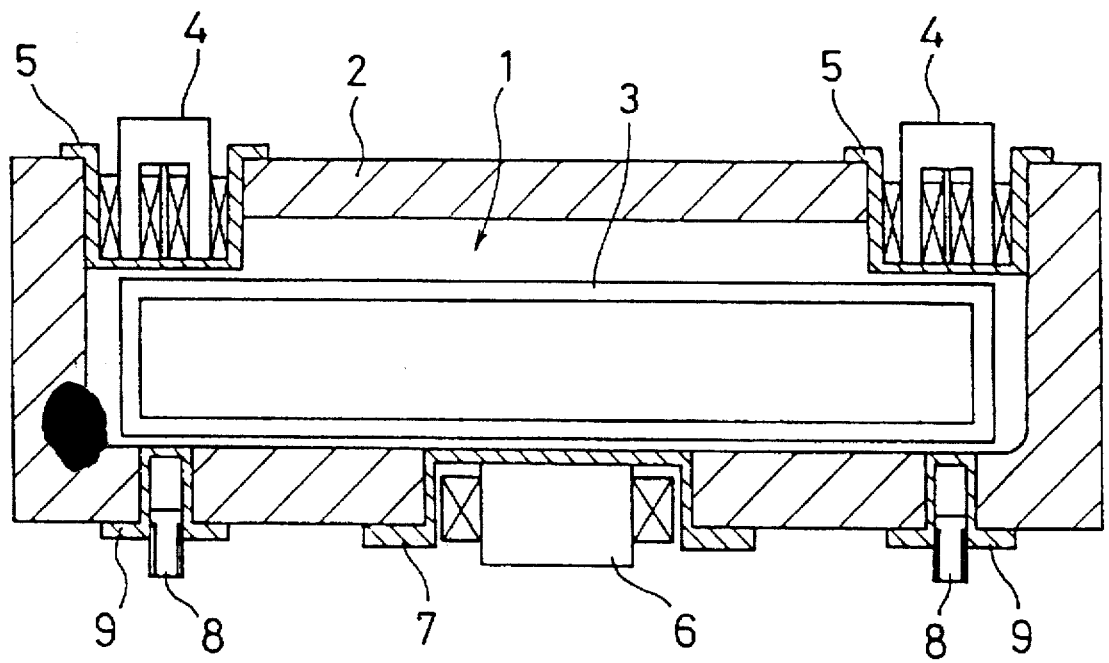
FIGS. 1 through 3 show a magnetic levitation conveyor apparatus according to a first embodiment of the present invention.

A magnetic levitation conveyor apparatus according to a first embodiment of the present invention will be described below with reference to FIGS. 1 through 3. As shown in FIG. 1, the magnetic levitation conveyor apparatus has a tunnel 1 constructed of a partition 2 and a carriage 3 disposed in the tunnel 1. Levitating electromagnets 4 are disposed upwardly of the tunnel 1 for levitating and supporting the carriage 3 out of contact with the partition 2. The levitating electromagnets 4 are positioned on the atmospheric side, and housed respectively in thin-wall caps 5 which serve as housing members in the form of thin-wall casings. The thin-wall caps 5 extend through the partition 2 and have respective bottoms exposed in the tunnel 1.

Figure 2:
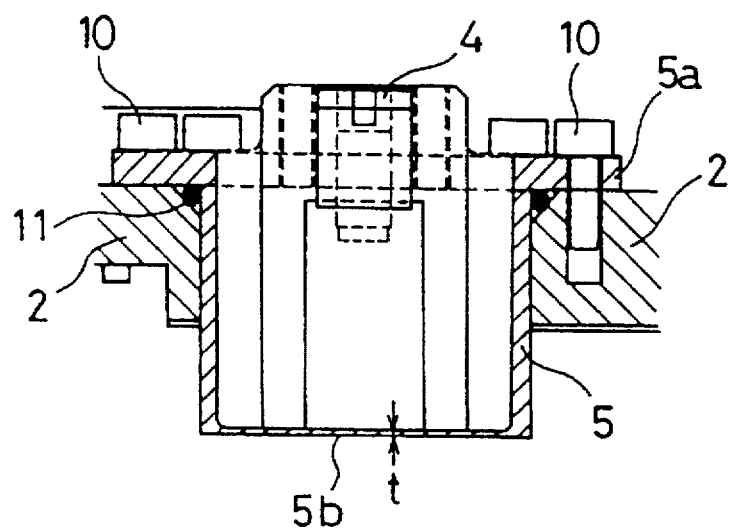
Figure 3:
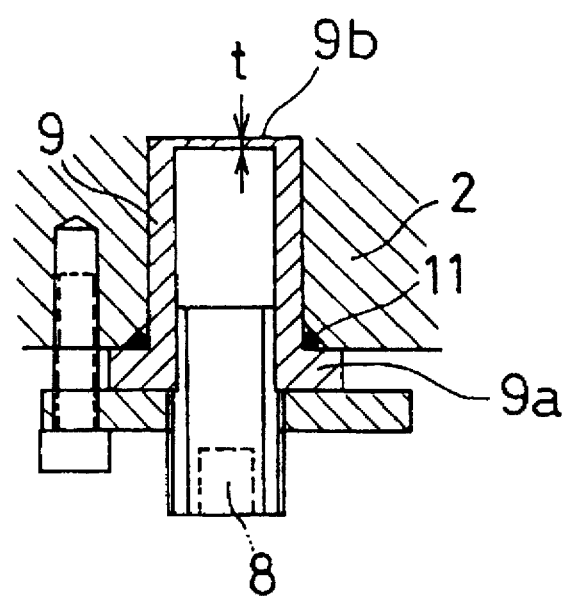

FIG. 2 shows in detail the levitating electromagnet 4 (the coil is omitted from illustration) and the thin-wall cap 5. The thin-wall cap 5 has a flange 5a on its upper portion, and the flange 5a is fixed to the partition 2 by bolts 10 with an O-ring 11 interposed between the flange 5a and the partition 2 for sealing the vacuum condition in the tunnel 1. The thin-wall cap 5 has a thin bottom wall 5b having a thickness t=1–2 mm so as not to impede magnetic forces of the levitating electromagnet 4. The thin-wall cap 5 is made of a nonmetallic material such as ceramics or a metallic material which is paramagnetic and has larger electric resistance than aluminum, e.g., stainless steel (SUS304).

Electromagnet 6 of linear motors for moving the carriage 3 are disposed downwardly of the tunnel 1. Each of the electromagnets 6 is positioned on the atmospheric side, and housed in a thin-wall cap 7 which serves as a housing member in the form of a thin-wall casing. The thin-wall cap 7 extends through the partition 2 and has a bottom exposed in the tunnel 1. The thin-wall cap 7 is made of a nonmetallic material such as ceramics or a metallic material which is paramagnetic and has larger electric resistance than aluminum, e.g., stainless steel (SUS304).

Displacement sensors 8 are disposed on left and right sides of the bottom of the tunnel 1. The displacement sensors 8 are housed in respective thin-wall caps 9 in the form of thin-wall casings which extend through the partition 2 and have tops exposed in the tunnel 1. Each of the displacement sensors 8 comprises an eddy-current sensor, and each of the thin-wall caps 9 is made of ceramics for not impeding the sensing action of the eddy-current sensor. FIG. 3 shows in detail the displacement sensor 8 and the thin-wall cap 9. The thin-wall cap 9 has a flange 9a, and an O-ring 11 is interposed between the flange 9a and the partition 2 for sealing the vacuum condition in the tunnel 1. The thin-wall cap 9 has a thin top wall 9b having a thickness t=1–2 mm, so that the distance between the displacement sensor 8 and the carriage 3 falls in a sensing range of the displacement sensor 8.

Although not shown, the levitating electromagnets 4, the electromagnet 6, and the displacement sensors 8 are arranged at equal intervals in the direction in which the carriage 3 is movable forward (the direction normal to the sheet of FIG. 1). An electromagnet (not shown) of an electromagnetic brake is disposed in a position where the carriage 3 is to stop.

In the magnetic levitation conveyor apparatus of the above structure, the displacement sensors 8 detect the vertical distance from the displacement sensors 8 to the carriage 3, and outputs the detected distance to a levitation control circuit (not shown). In response to the output signal from the displacement sensors 8, the levitation control circuit increases or reduces an exciting current supplied to the levitating electromagnets 4 to control magnetic attractive forces acting on the carriage 3. Accordingly, the carriage 3 can stably be levitated vertically out of contact with the partition 2. The electromagnets 6 of the linear motors generate an eddy current in an electrically conductive member (not shown) on the lower surface of the carriage 3 for propelling and moving the carriage 3 in the forward direction (the direction normal to the sheet of FIG. 1).

In this embodiment, the levitating electromagnets 4, the linear motors 6, and the displacement sensors 8 are disposed outside of the partition of the tunnel 1, and housed respective in the thin-wall caps 5, 7, 9 in the form of thin-wall casings which extend through the partition 2 and are partly exposed in the tunnel 1. Since no other components than the carriage 3 are disposed in the tunnel 1, neither gases or fine particles are produced in the tunnel 1, thus preventing a workpiece carried by the carriage 3 from being contaminated. Since no gases are produced in the tunnel 1, a high degree of vacuum can be achieved in the tunnel 1.

While the O-rings are used to provide a seal between the thin-wall caps and the partition in the above embodiment, metal seals may be interposed between the thin-wall caps and the partition. Alternatively, the thin-wall caps may be welded to the partition to seal the vacuum condition in the tunnel.

Inasmuch as the levitating electromagnets, the linear motors, and the displacement sensors are disposed outside of the tunnel, the maintenance of the coils and the displacement sensors can be facilitated. In addition, the maintenance of these parts can be carried out while the vacuum condition is being kept in the tunnel.

(2nd embodiment)

Figure 4A:
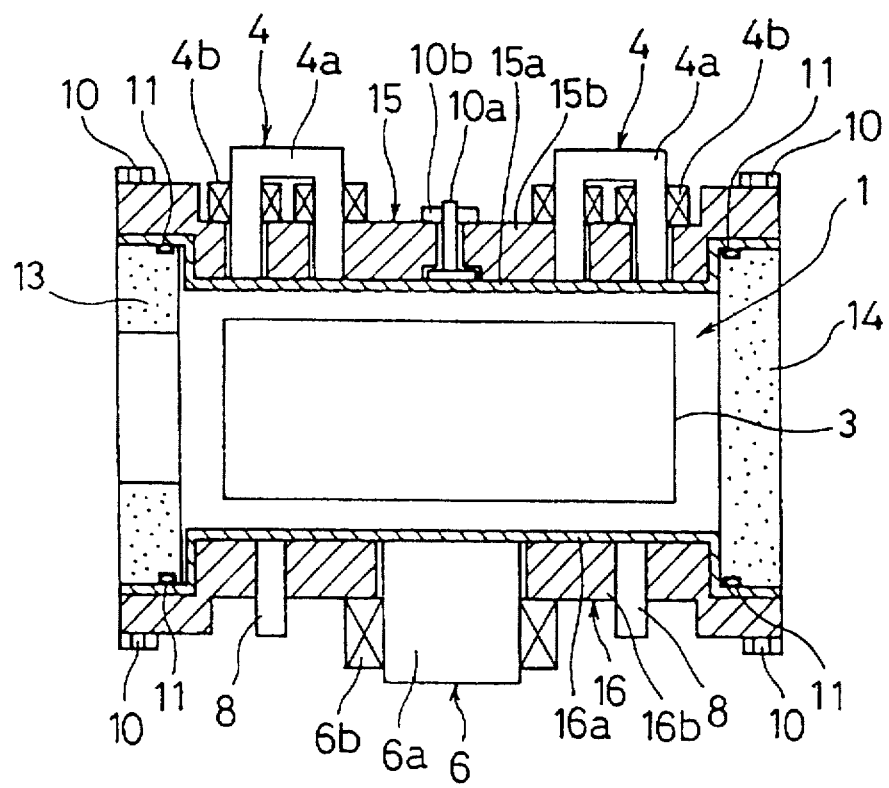
FIGS. 4 through 6 show a magnetic levitation conveyor apparatus according to a second embodiment of the present invention.
Figure 4B:
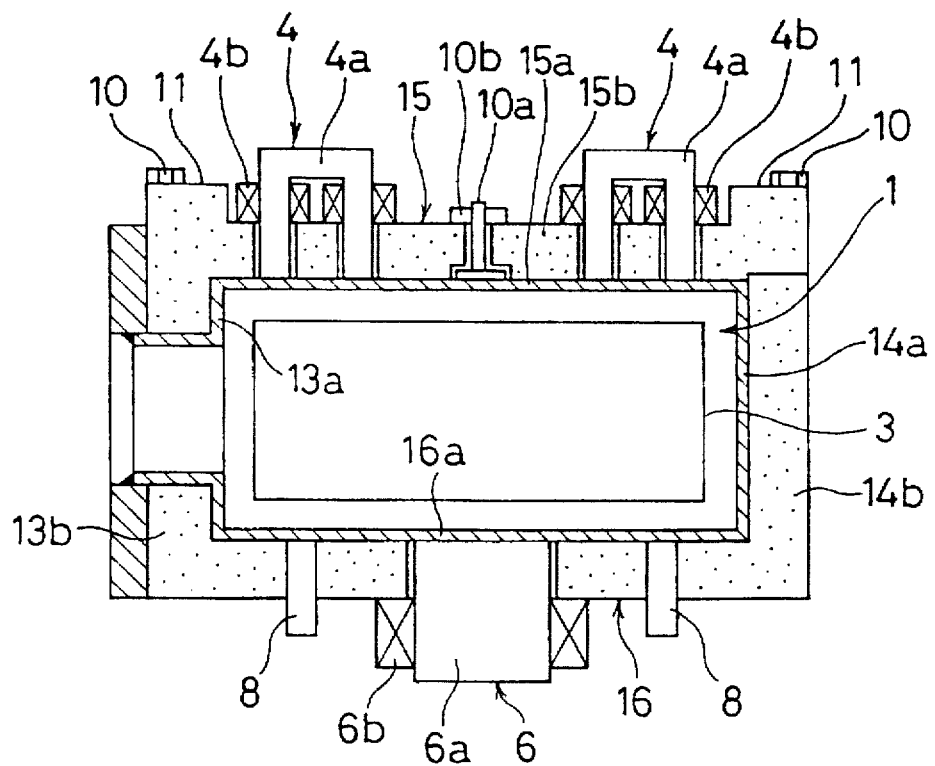
Figure 5:
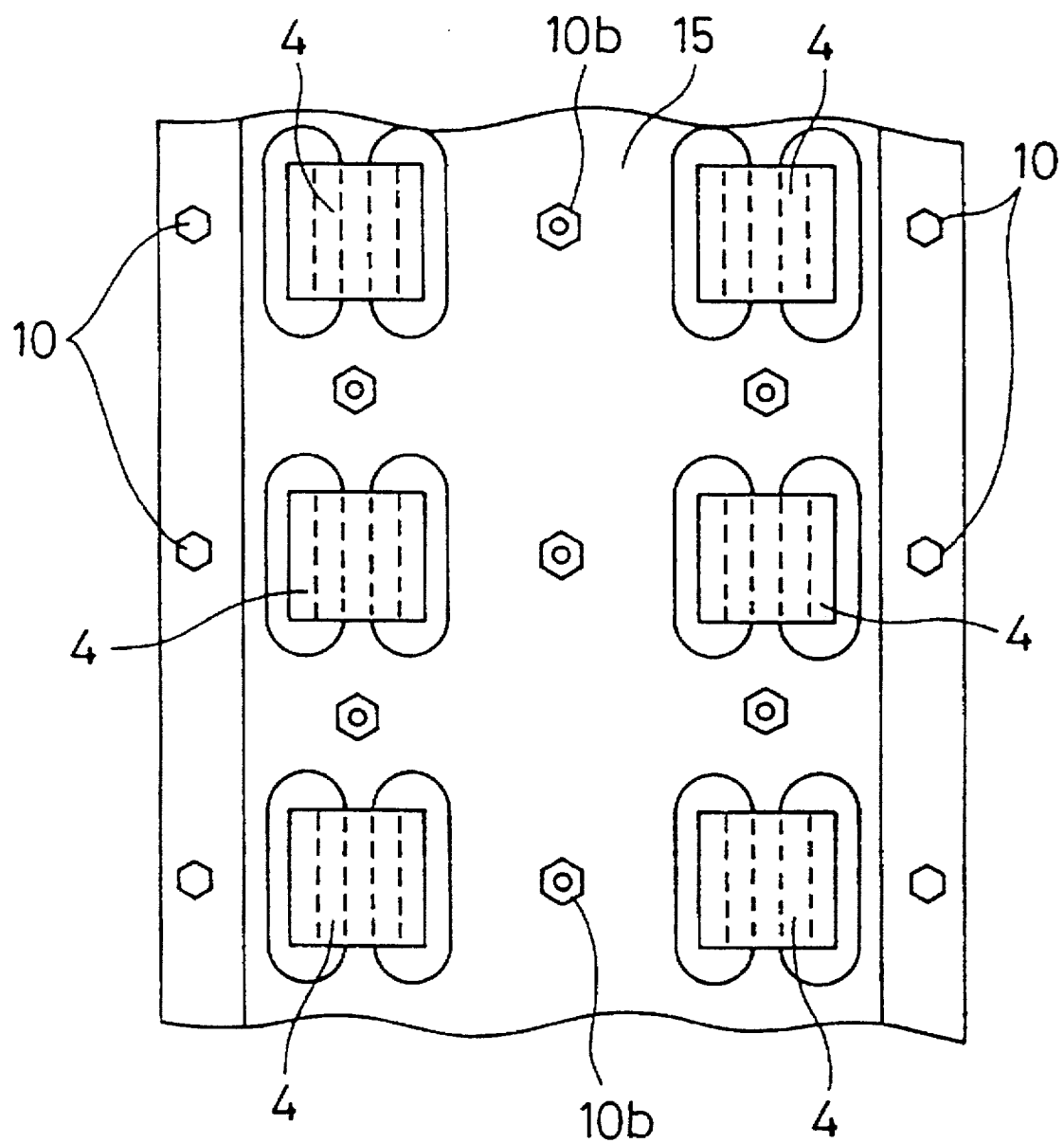

A magnetic levitation conveyor apparatus according to a second embodiment of the present invention will be described below with reference to FIGS. 4 through 6. FIG. 4 is a set of vertical cross-sectional views of tunnel structures (A), (B) of the magnetic levitation conveyor apparatus, and FIG. 5 is a plan view of the tunnel structures. As shown in FIGS. 4(A), (B), the magnetic levitation conveyor apparatus comprises a tunnel 1 constructed of partitions with a vacuum maintained therein, and a carriage 3 disposed in the tunnel 1.

In the tunnel structure (A), the partitions of the tunnel 1 include left and right partitions 13, 14 and upper and lower partitions 15, 16. The upper and lower partitions 15, 16 comprise respective thin plates 15a, 16a in the form of stainless steel sheets (SUS304) disposed on the vacuum side for shielding the vacuum, and respective thick reinforcing plates 15b, 16b in the form of thick stainless steel sheets disposed on the atmospheric side and rigid enough to reinforce the thin plates 15a, 16a. The left and right partitions 13, 14 comprise respective thick aluminum sheets. Each of the thin plates 15a, 16a has a thickness t of about 1 mm.

In the tunnel structure (B), the partitions of the tunnel 1 include thin plates 13a, 14a, 15a, 16a in the form of stainless steel sheets disposed on the vacuum side and reinforcing plates 13b, 14b, 15b in the form of rigid thick aluminum sheets disposed on the atmospheric side. The thin plates 13a, 14a, 15a, 16a are welded or brazed to each other to provide a hermetic seal. The reinforcing plate 15b and the reinforcing plates 13b, 14b are separate from each other, and fastened to each other by an adhesive or bolts.

In the tunnel structure (A), O-rings 11 for sealing the vacuum are interposed between the upper and lower partitions 15, 16 and the left and right partitions 13, 14. The upper and lower partitions 15, 16 and the left and right partitions 13, 14 are fastened to each other by bolts 10.

Figure 6:
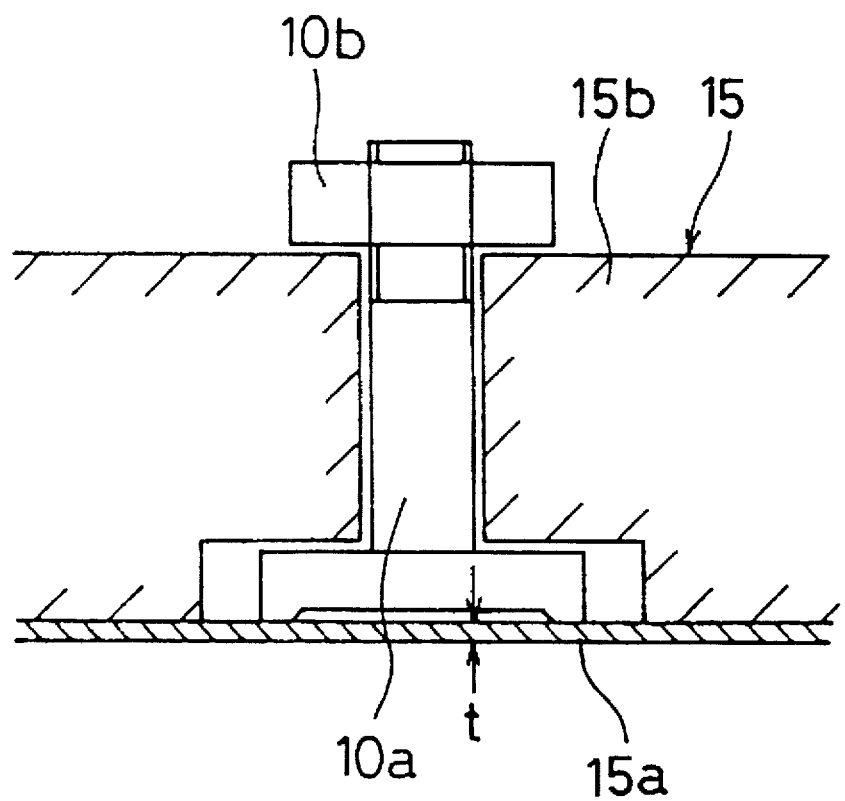

As shown in FIG. 6, an anchor bolt 10a is welded to the thin plate 15a, and the thin plate 15a and the reinforcing plate 15b are integrally fastened to each other by a nut 15b threaded over the anchor bolt 10a. The thin plate 15a and the reinforcing plate 15b of the upper partition 15 are integrally bonded to each other in a region other than the anchor bolt 10a. The thin plate 16a and the reinforcing plate 16b of the lower partition 16 are integrally bonded to each other.

Levitating electromagnets 4 for levitating and supporting the carriage 3 out of contact with the partitions of the tunnel 1 are arrayed on the upper partition 15 at equal intervals in the direction in which the carriage 3 is moved forward (see FIG. 5). The levitating electromagnets 4 have magnetic poles 4a extending through the reinforcing plate 15b and disposed adjacent to the thin plate 15a, and coils 4b disposed outside of the reinforcing plate 15b.

Linear motors 6 composed of electromagnets for moving the carriage 3 are mounted on the lower partition 16. The linear motors 16 are arrayed at equal intervals in the direction in which the carriage 3 is moved forward. The linear motors 6 have magnetic poles 6a extending through the reinforcing plate 16b and disposed adjacent to the thin plate 16a, and coils 6b disposed outside of the reinforcing plate 16b. Displacement sensors 8 for detecting the vertical distance therefrom to the carriage 3 are mounted on the lower partition 16.

The magnetic levitation conveyor apparatus shown in FIG. 4(A) or (B) operates as follows: The levitating electromagnets 4 are first energized by a control circuit (not shown) to apply magnetic attractive forces through the thin plate 16a to the carriage 3 with a magnetic member (not shown) disposed on an upper surface thereof for thereby levitating the carriage 3. The distance by which the carriage 3 is lifted is detected by the displacement sensors 8 through the thin plate 15a, and an exciting current supplied to the levitating electromagnets 4 is controlled depending on the output signal from the displacement sensors 8. While the carriage 3 remains lifted by the levitating electromagnets 4, the carriage 3 is propelled and moved by the linear motors 6 in the forward direction (the direction normal to the sheet of FIG. 1).

In this embodiment, each of at least the upper and lower partitions of the tunnel comprises a thin plate for shielding the vacuum and a reinforcing plate which reinforces the thin plate, and the thin plate and the reinforcing plate are joined to each other by an adhesive or a bolt and nut. Therefore, the partitions are highly rigid to minimize any deformation of the tunnel. Since each of the partitions of the tunnel is composed of two pieces, they can be machined in a manner to match the characteristics of the components, can easily be machined, and can be manufactured with a reduced cost. The number of O-rings used is minimized, and a high degree of vacuum can be achieved.

(3rd embodiment)

The structure of a conveyor passage and a carriage of a magnetic levitation conveyor apparatus according to a third embodiment of the present invention will be described below with reference to FIGS. 7 through 16.

Figure 7:
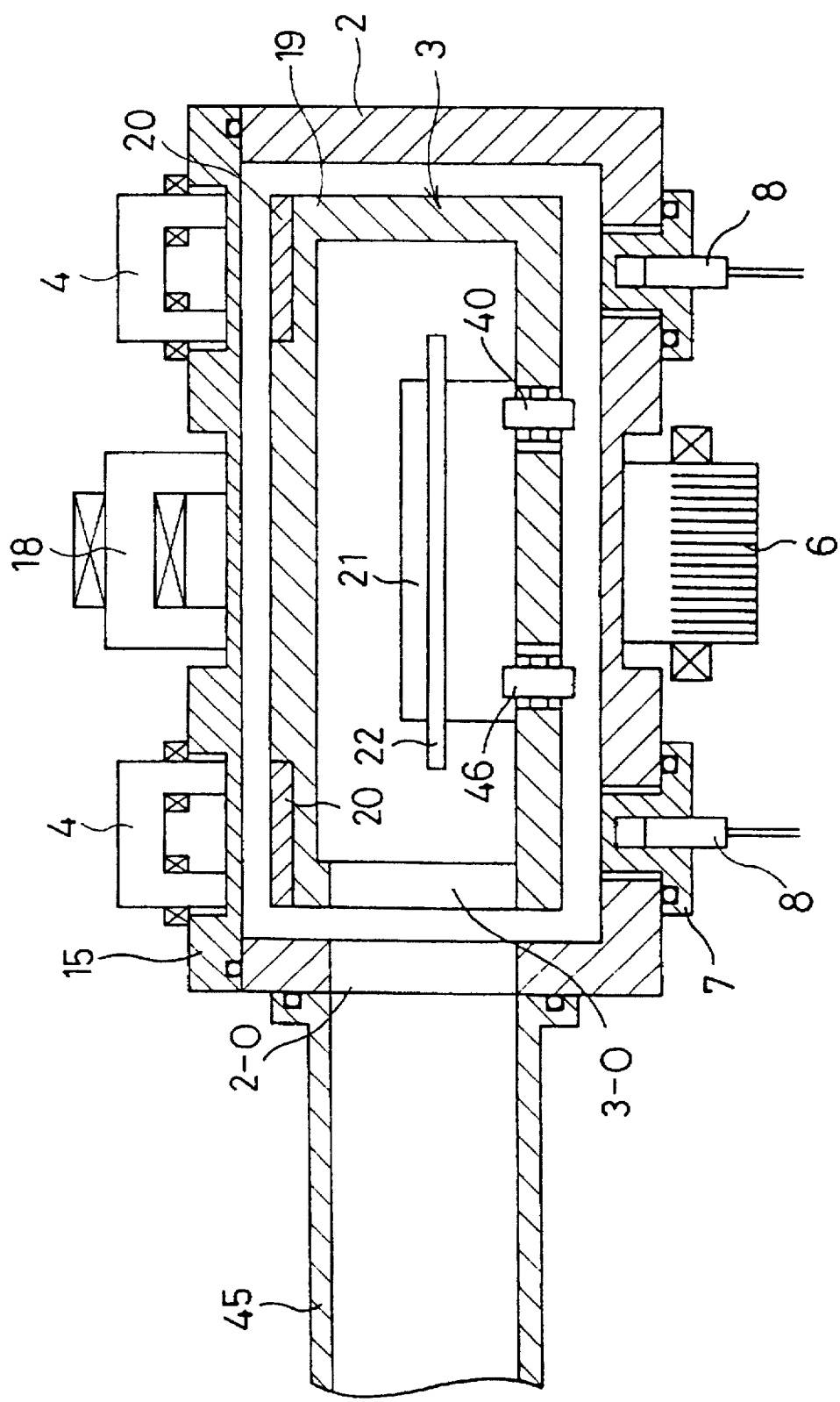
FIGS. 7 through 16 show a magnetic levitation conveyor apparatus according to a third embodiment of the present invention.

FIG. 7 shows the structure of a conveyor passage and a carriage. A carriage 3 is moved in a tunnel surrounded by a partition 2 made of a nonmagnetic material such as stainless steel or the like. The partition 2 includes an upper partition plate 15 on which levitating electromagnets 4 are arrayed in two rows. Displacement sensors 8 and electromagnets 6 of linear motors are arrayed on a lower surface of the partition 2.

The carriage 3 has an outer shell 19 made of aluminum which serves as a secondary conductor (electrically conductive member) in a lower portion of the carriage 3 which confronts the linear motors 6. The carriage 3 is thus propelled in the direction normal to the sheet of FIG. 7.

Figure 8:
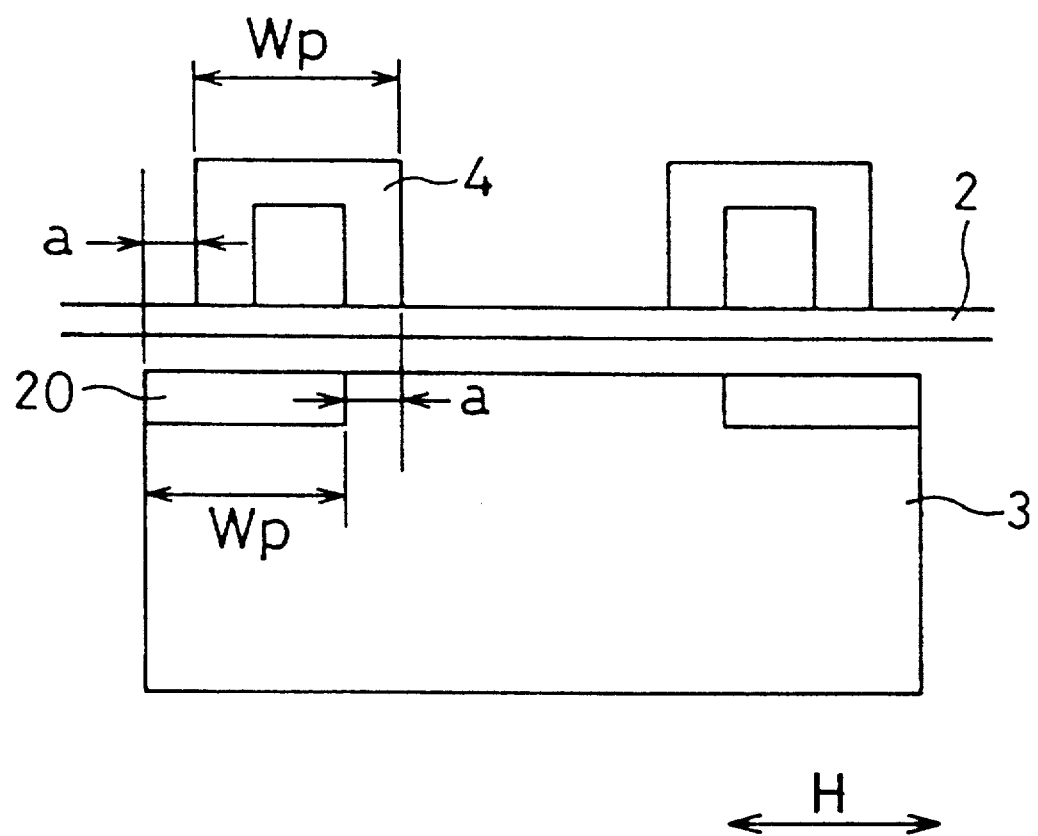

A plate member (magnetic member) 20 made of a magnetic material is mounted on an upper surface of the outer shell 19 of the carriage 3. As shown in FIG. 8, the magnetic member 20 has a width equal to the width Wp of the magnetic poles of the levitating electromagnets 4. The magnetic member 20 is displaced a distance "a" in a guiding direction (the direction indicated by the arrow H in FIG. 8) toward the respective opposite sides of the carriage 3 (outwardly in the direction indicated by the arrow H in FIG. 8). The distance "a" may be nil.

In FIG. 7, the displacement sensors 8 that are disposed below the carriage 3 in confronting relation to the levitating electromagnets 4 detect the vertical distance therefrom to the lower surface of the carriage 3, and output the detected distance to a levitation control circuit (not shown). In response to the output signal from the displacement sensors 8, the levitation control circuit increases or reduces an exciting current supplied to the levitating electromagnets 4 to control magnetic attractive forces acting on the plate member 20 of magnetic material on the upper surface of the carriage 3. Therefore, the carriage 3 can be suspended vertically and stably levitated to a target position out of contact with the partition.

When the levitating electromagnets 4 are supplied with a current to apply magnetic attractive forces therefrom to the plate member 20 of magnetic material, since the plate member 20 of magnetic material and the magnetic pole surfaces of the levitating electromagnets 4 are positioned relatively to each other as described above, the plate member 20 of magnetic material is subjected to forces tending to move the plate member 20 of magnetic material toward the center of the carriage 3. As a result, the carriage 3 is passively positioned in the guiding direction (the direction H in FIG. 8).

As can be seen from FIG. 7, the outer shell 19 of the carriage 3 has a carriage opening 3-0 defined in a side wall thereof, and the partition 2 has a partition opening defined in a side wall thereof. A workpiece can be taken into and out of the carriage 3 through the carriage opening 3-0 and the partition opening 2-0. The positional relation of the plate member 20 of magnetic material, the carriage 3, and the carriage opening 3-0 is shown by way of example in FIG. 9.

In the embodiment shown in FIG. 7, the displacement sensors 8 are of the eddy-current type for detecting the vertical position of the lower surface of the carriage based on an eddy current produced in the lower surface of the carriage which is made of an aluminum plate. To prevent the partition 2 from electromagnetically affecting the displacement sensors 8, the displacement sensors 8 are encased in nonconductive sensor caps made of ceramics, for example. The carriage 3 has emergency wheels 46.

In FIG. 7, an electromagnetic brake 18 comprising an electromagnet is disposed midway between the levitation electromagnets 4. The electromagnet of the electromagnetic brake 18 cooperates with a brake target (not shown) fixed to the center of the upper surface of the carriage 3 in defining a magnetic path for positioning the carriage 3 under magnetic attractive forces.

A mount member 21 is disposed in the carriage 3 for holding a semiconductor wafer 22 or the like as a workpiece so that the semiconductor wafer 22 will not be damaged during movement.

Although not shown, the levitating electromagnets 4 disposed on the left and right sides of the partition 2, the linear motors 6 disposed on the lower side of the partition 2, and the displacement sensors 8 disposed on the lower side of the partition 2 in alignment with the levitating electromagnets 4 are arranged at equal intervals in the direction in which the carriage 3 is movable forward (the direction normal to the sheet of FIG. 7). The electromagnet brake 18 is disposed only in a position where the carriage 3 is to stop. The position shown in FIG. 7 is such a position where the carriage 3 is to stop, i.e., a position where there is an installation for processing the wafer 22 that has been conveyed. However, no electromagnet brake 18 is disposed in locations where the carriage 3 does not stop. The partition 2 is elongate in the direction in which the carriage 3 is movable forward (the direction normal to the sheet of FIG. 7).

In operation, while the carriage 3 is being lifted by the levitating electromagnets 4, the carriage 3 is propelled and move in the forward direction by the linear motors 6 out of contact with the partition 2. At the stop position, the carriage 3 is stopped by the electromagnetic brake 18, and a robot arm (not shown) or the like is used to take the wafer 22 into or out of the carriage 3 through the partition opening 2-0 and the carriage opening 3-0.

Figure 9:
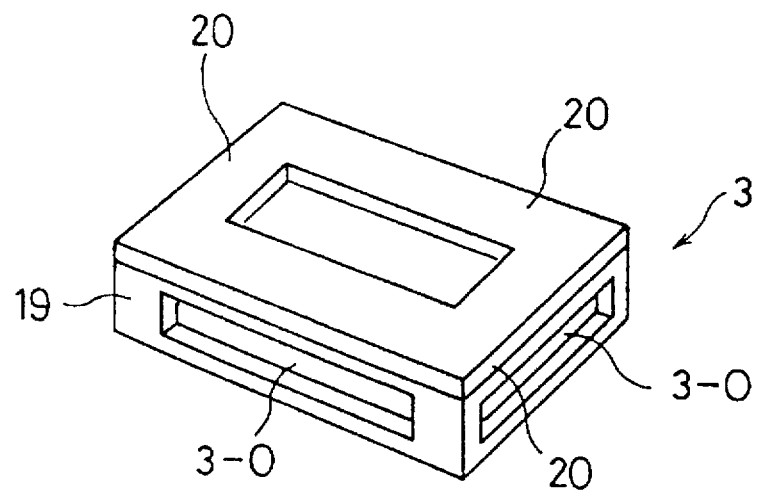

As shown in FIG. 9, the plate member 20 of magnetic material in the shape of a centrally open rectangle is fixed to the upper surface of the outer shell of the carriage 3. The carriage opening 3-0 is defined in each of the four side walls of the outer shell of the carriage 3.

Figure 14A:
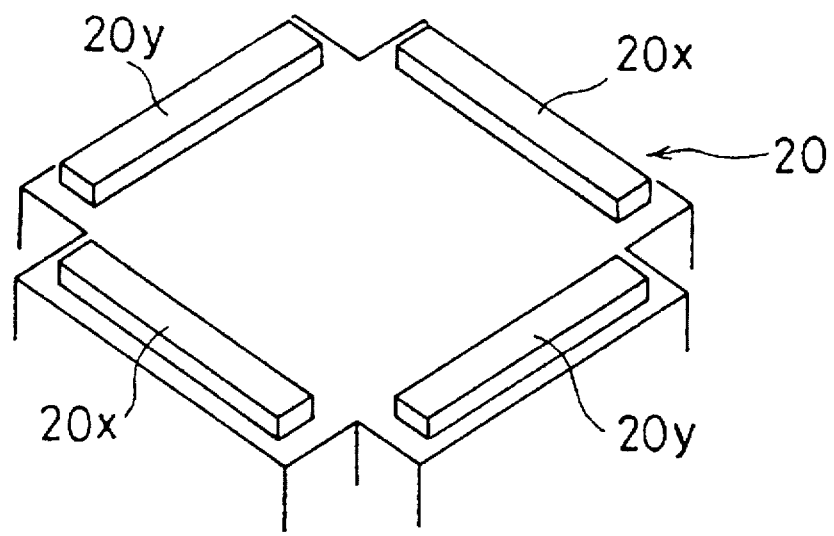
Figure 14B:
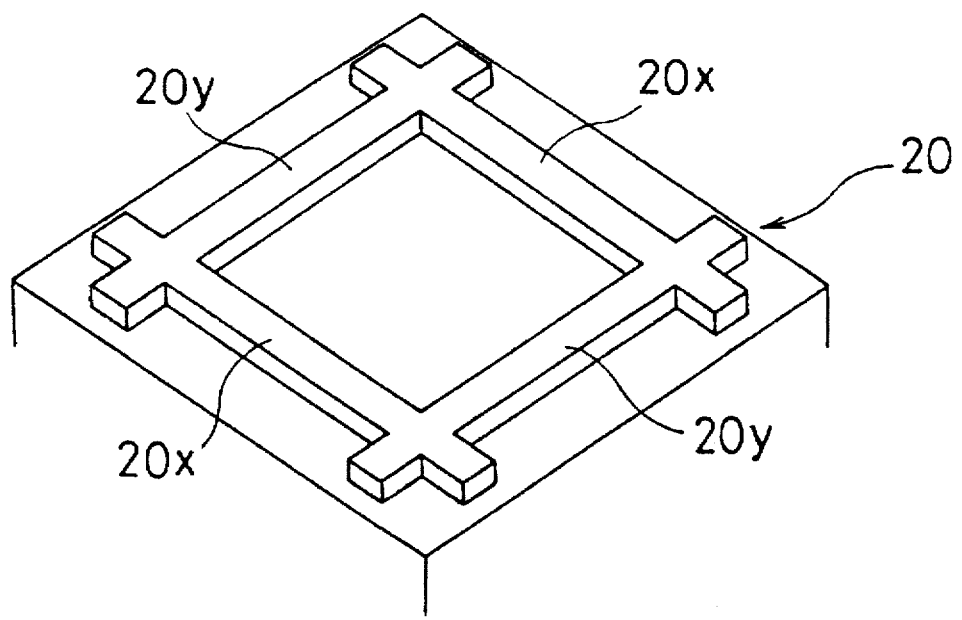

The plate member 20 of magnetic material comprises, as shown in FIGS. 14(A), (B), two parallel magnetic pieces 20x and two parallel magnetic pieces 20y extending perpendicularly to the magnetic pieces 20x so as to correspond to the magnetic pole surfaces of the levitation electromagnets arrayed in two rows.

Figure 10:
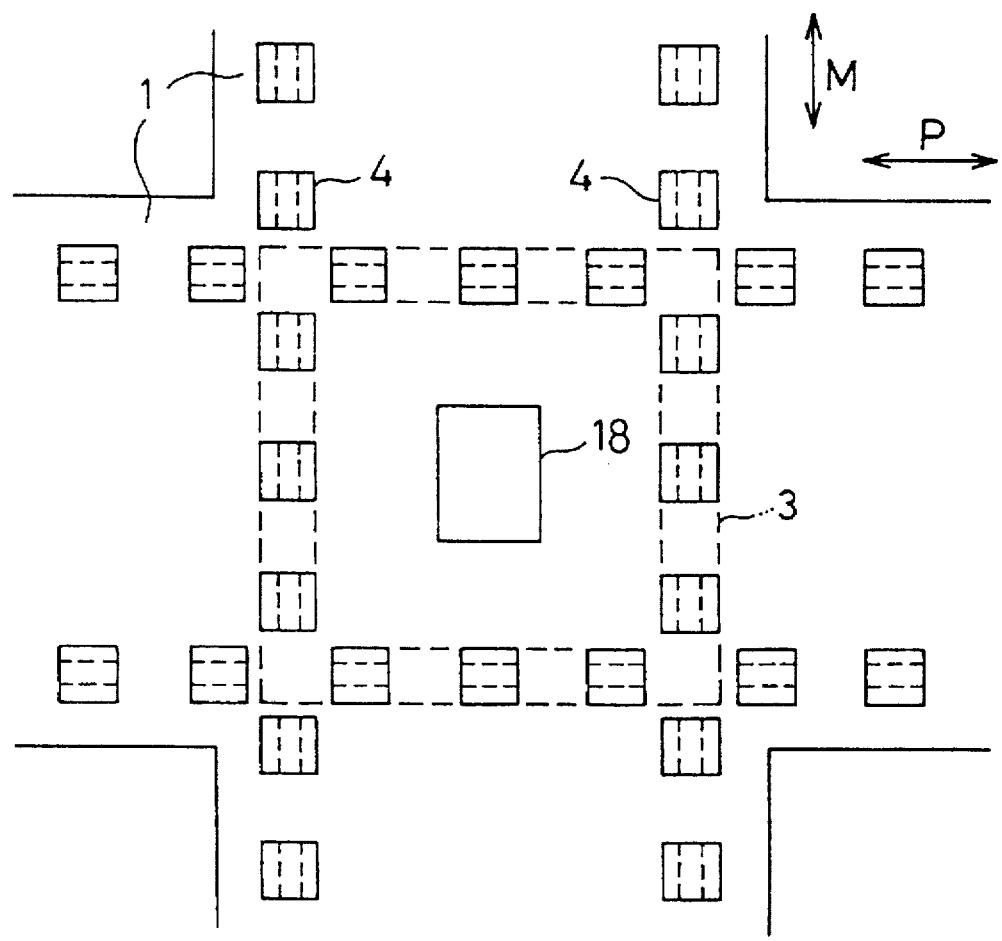

FIG. 10 shows a branched point of the tunnel where the conveyor passage is branched orthogonally. In the branched point, the tunnel 1 is branched along the directions M, P of movement, and two rows of levitation electromagnets 4 are arrayed along each of main and branched conveyor passages. Since the carriage 3 has on its upper surface the plate member 20 of magnetic material which is composed of two parallel magnetic pieces extending in the direction in which the carriage 3 conveys a workpiece and two parallel magnetic pieces extending perpendicularly thereto, so as to correspond to the magnetic pole surfaces of the levitation electromagnets 4, it is possible for the carriage 3 to change its directions from M to P or P to M while it is being levitated.

With the plate member 20 of magnetic material in the shape of a centrally open rectangle being fixed to the upper surface of the carriage 3, as shown in FIG. 9, since the linear motors for moving the carriage are also electromagnets for generating a moving magnetic field, if the linear motors were mounted on the center of the upper partition, then they would apply magnetic attractive forces to the plate member 20 of magnetic material, which would not be preferable. The linear motors should preferably be positioned at the center of the carriage in view of a space factor and stability of the thrust imposed by the linear motors. Therefore, the linear motors 6 are necessarily disposed on the central area of the lower partition.

The displacement sensors 8 comprise eddy-current sensors or inductive sensors, and have better sensitivity or linearity if the vertical gap between themselves and the target, i.e., the lower surface of the carriage to be detected, is smaller. The carriage is required to be controlled properly when it falls downwardly (in the direction of gravity). Consequently, the vertical position of the carriage can be controlled with greater accuracy by positioning the displacement sensors 8 on the lower surface of the partition 2. If the displacement sensors were mounted on the upper surface of the partition, then they would have to be disposed between the magnetic poles of the levitation electromagnets, and such an arrangement would require the magnetic poles to be increased in width, resulting in a larger size of the levitation electromagnets. Therefore, the displacement sensors 8 should preferably be disposed on the lower surface of the partition 2 in lower positions corresponding to the levitation electromagnets. The electromagnet 18 of the electromagnetic brake is disposed in a remaining space, i.e., on the upper partition plate 15 of the partition 2 between the levitation electromagnets 4. The components are thus arranged so as to provide a compact conveyor passage which is well balanced as a whole as shown in FIG. 7.

Figure 11A:
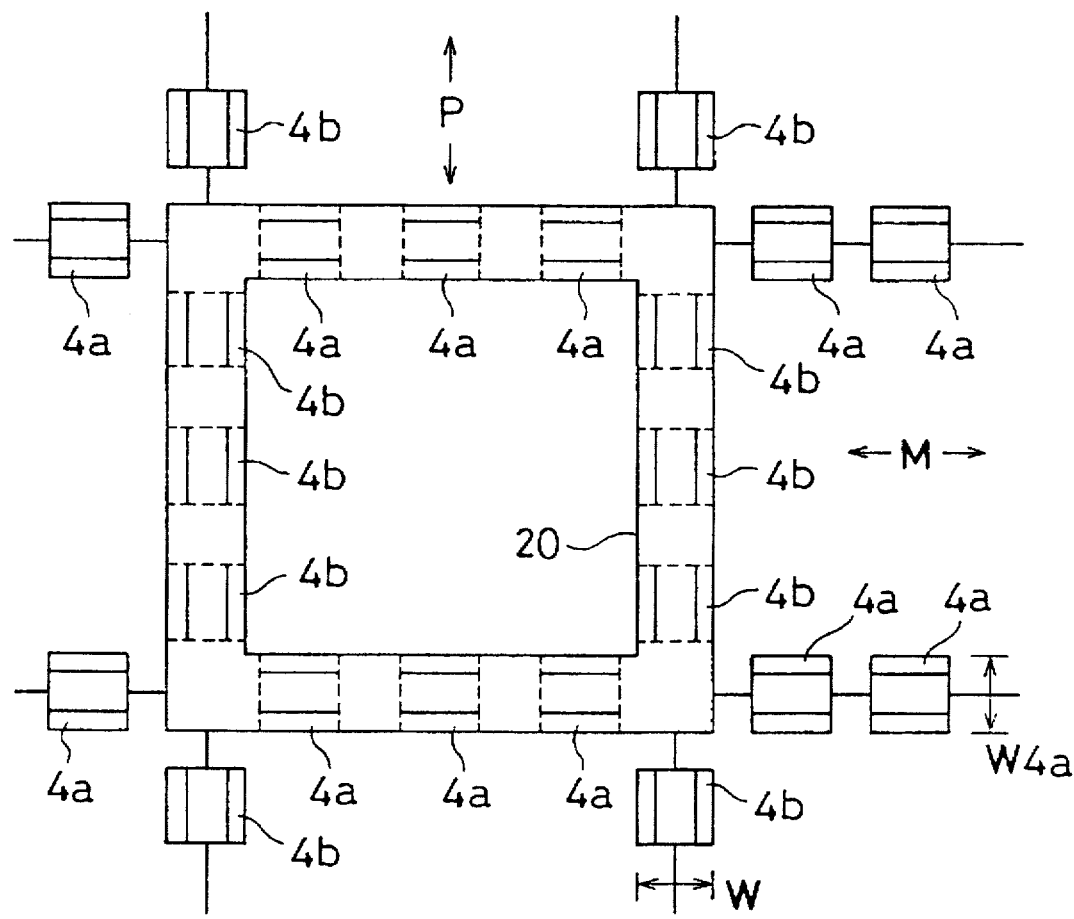

The plate member 20 of magnetic material (magnetic member) mounted on the upper surface of the carriage will be described in detail below. FIG. 11(A) shows the positional relation between the magnetic pole surfaces 4 of the levitation electromagnets and the magnetic member 20 on the upper surface of the carriage at a branched point of the conveyor passage. The carriage to which the magnetic member 20 in the shape of a centrally open rectangle is fixed is lifted by magnetic attractive forces produced from magnetic pole surfaces 4a, 4b of the levitation electromagnets that are arrayed along main and branched conveyor passage along which the carriage is movable, and is propelled by the linear motors (not shown) to move in the tunnel while being held out of contact with the partition. FIG. 11(A) illustrates a branched location of the conveyor passage, where the main conveyor passage in the direction M and the branched conveyor passage in the direction P intersect with each other. FIG. 11(C) shows in perspective the magnetic member 20 fixed to the carriage 3. The magnetic member 20 has sides whose widths Wa, Wb are substantially the same as the width W of the magnetic pole of each of the levitation electromagnets.

Figure 11B:
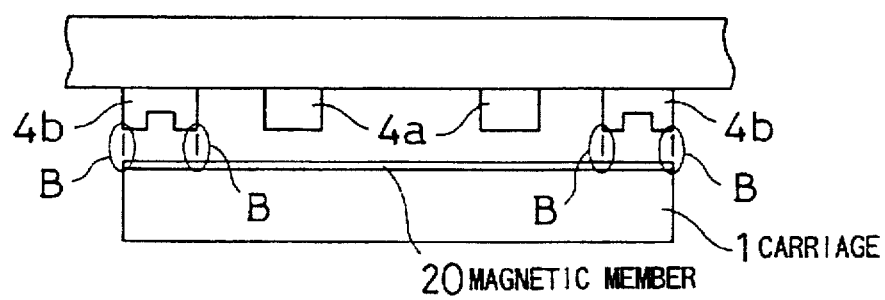
Figure 11C:
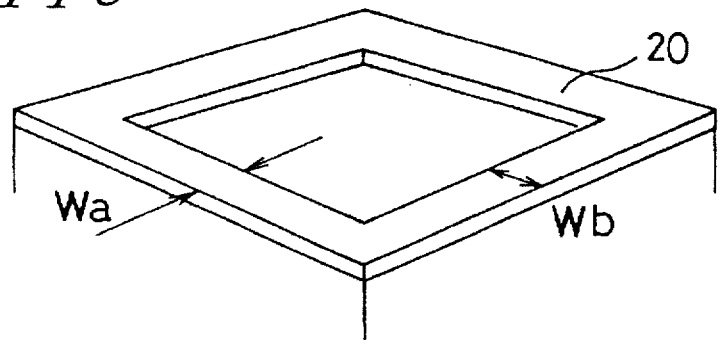

FIG. 11(B) is a side elevational view of FIG. 11(A), illustrating the manner in which the carriage is lifted by the levitation electromagnets. The levitation electromagnets are arrayed on a main frame of the conveyor apparatus, and the magnetic pole surfaces 4a, 4b of the levitation electromagnets are disposed in confronting relation to the magnetic member 20 that is fixed to the upper surface of the carriage. Each of the levitation electromagnets has a C-shaped magnetic pole. As shown in FIG. 12(C), a closed magnetic path (magnetic flux Φ) is formed in the magnetic member 20 from the magnetic pole surfaces of the electromagnets through the partition (not shown) and gaps. Therefore, magnetic shearing forces B are generated between the ends of the magnetic pole surfaces 4a, 4b and the ends of sides of the magnetic member 20, thus producing a so-called guiding rigidity for guiding the carriage passively toward the magnetic center.

Figure 12A:
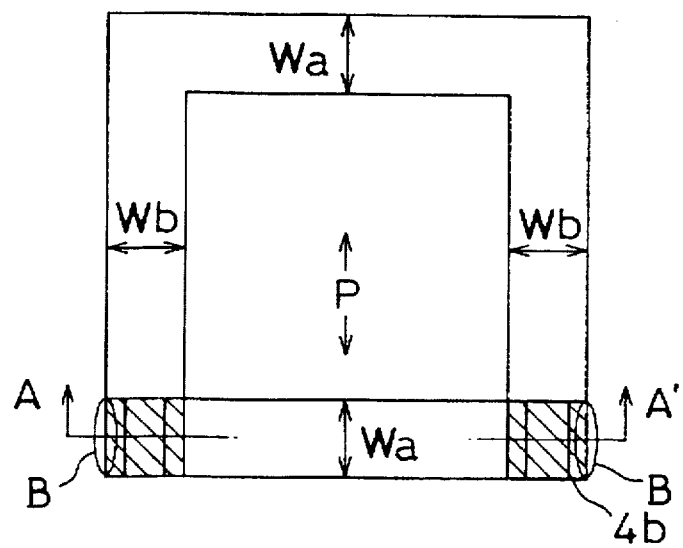
Figure 12B:
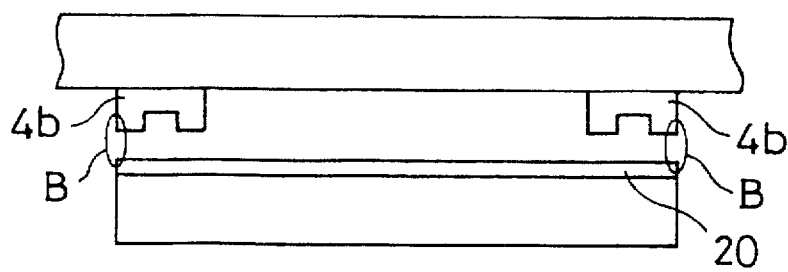
Figure 12C:
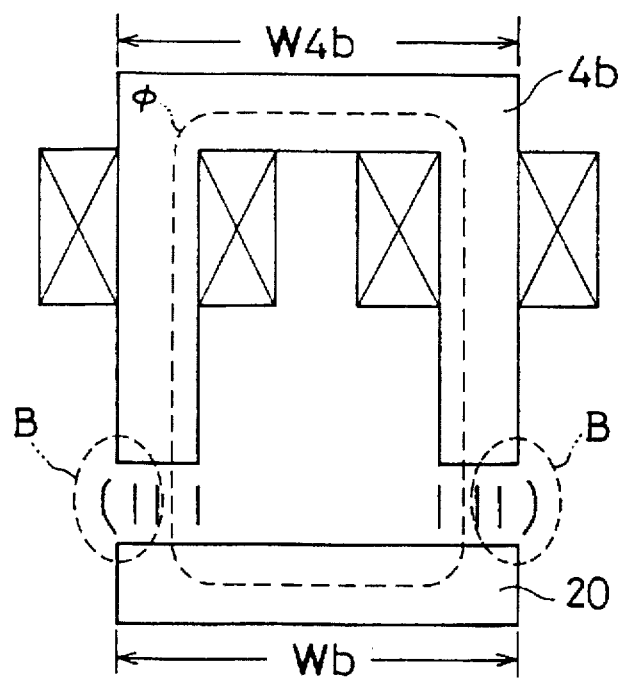

FIG. 12(A) is a plan view showing by way of example the positional relation between the magnetic member 20 fixed to the upper surface of the carriage and the magnetic pole surfaces 4b of the electromagnets, the view being illustrative of the magnetic pole surfaces 4b positioned at corners of the magnetic member 20 as shown hatched. FIG. 12(B) is a cross-sectional view taken along line A–A' of FIG. 12(A). When the electromagnets are energized, two areas indicated at B' are located at the magnetic poles 4b and the ends of the magnetic member 20, where magnetic shearing forces B are generated for guiding the carriage 3 toward the magnetic center while the carriage 3 is moving in the direction P.

The carriage to which the magnetic member 20 in the shape of a centrally open rectangle is fixed is moved along the main conveyor passage in the direction M, and stopped by the non-illustrated electromagnetic brake at the point of intersection between the main conveyor passage in the direction M and the branched conveyor passage in the direction P. At the point of intersection, the magnetic pole surfaces for keeping the carriage lifted are switched from 4a to 4b, and a propelling means such as non-illustrated linear motors is actuated to propel the carriage in the direction P. The carriage is now moved in the direction P along the branched conveyor passage. While the directional change from the direction M to the direction P has been described above, the carriage may change its direction from P to M. Accordingly, the carriage to which the magnetic member in the shape of a centrally open rectangle is fixed can change its direction easily by switching the conveyor passages to which the electromagnets for keeping the carriage lifted belong. A process of switching the electromagnets for keeping the carriage lifted will be described in detail later on with respect to a sixth embodiment.

(4th and 5th embodiments)

Figure 13A:
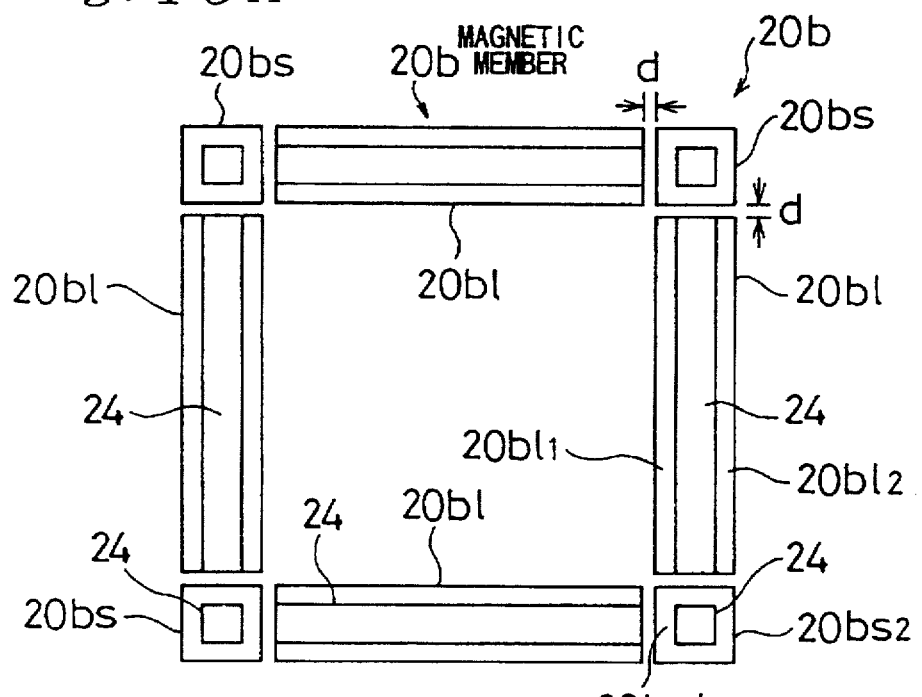
Figure 15A:
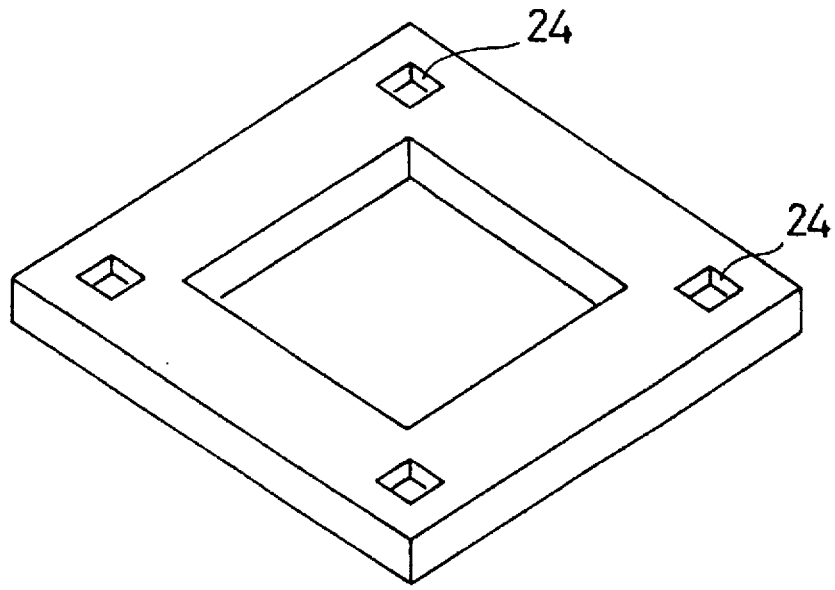
Figure 15B:
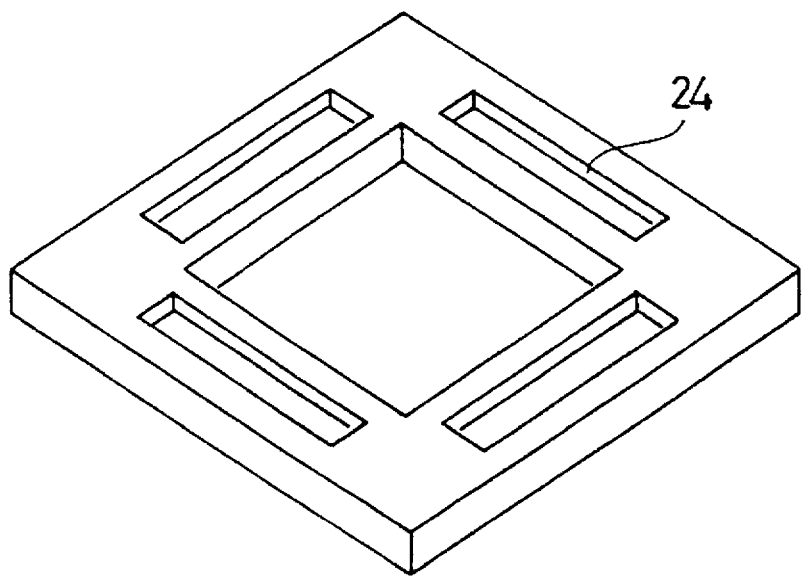
Figure 16:
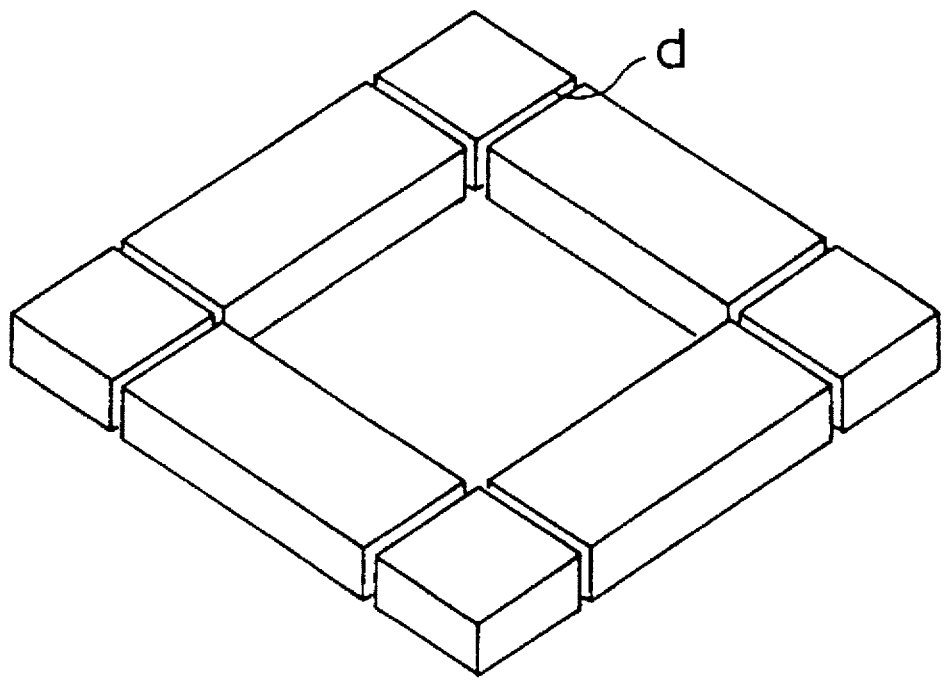

FIGS. 13, 15, and 16 show magnetic levitation conveyor apparatus according to fourth and fifth embodiments of the present invention. FIG. 13(A) shows in plan the shape of a magnetic member 20b. The magnetic member 20b which is in the shape of a centrally open rectangle comprises elements 20b1 serving as four sides and elements 20bs serving as four corners. These elements 20b1, 20bs are spaced by gaps "d" therebetween. Thus, the magnetic member 20b is composed of four side elements 20b1 and four corner elements 20bs, each having ridges, with gaps "d" or grooves present between these elements. The gaps (grooves) "d" extend in the direction in which the carriage moves and the direction perpendicular thereto.

The four side elements 20b1 have respective recesses (grooves) 24 defined centrally therein which extend in the direction in which the carriage moves and the direction perpendicular thereto. The four corner elements 20bs also have respective recesses (grooves) 24 defined centrally therein.

Figure 13B:
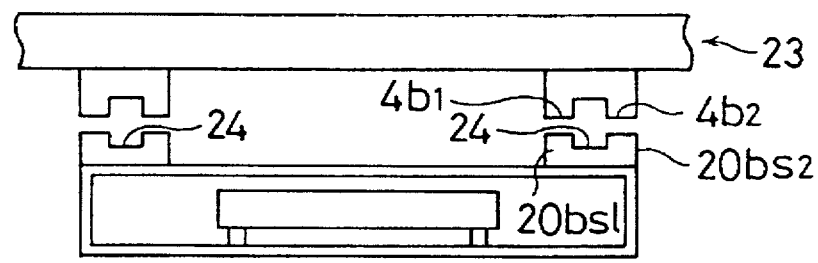
Figure 13C:
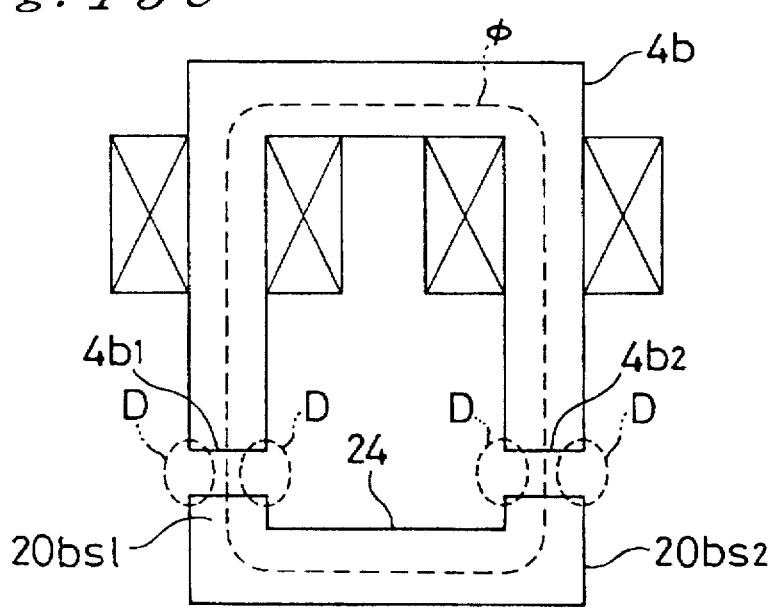

FIG. 13(B) is a sectional side elevational view showing the positional relation between the magnetic poles of levitation electromagnets and the magnetic member, and FIG. 13(C) is an enlarge partial view thereof. Levitation electromagnets 4a, 4b have cross-sectionally C-shaped magnetic poles as shown each divided into magnetic pole surfaces 4b1, 4b2. A magnetic flux Φ flows in a closed loop which extends from the magnetic pole 4b1 through a ridge 20b11 or 20bs1, below the groove 24, through a ridge 20b12 or 20bs2 and the magnetic pole 4b2. Each of the four side elements and the four corner elements has a recess (groove) 24 in its central region, with the gap "d" between adjacent ones of the elements. Therefore, magnetic shearing forces are produced at four locations indicated at D with respect to one electromagnet having a cross-sectionally C-shaped magnetic pole. The so-called guiding rigidity for guiding the carriage passively to the magnetic center is greatly increased as compared with the first embodiment. Since the magnetic member 20b is substantially in the shape of a centrally open rectangle also in this embodiment, the carriage can easily change its directions at a branched point of the conveyor passage.

FIGS. 15 and 16 show modifications of the magnetic member 20. In each of the modifications, four corners or four sides of the magnetic members have recesses (grooves) 24 or gaps "d" In these recesses 24 or the gaps "d", magnetic shearing forces are generated between the magnetic member and the magnetic pole surfaces of cross-sectionally C-shaped magnetic poles of levitation electromagnets, thus increasing so-called guiding rigidity for guiding the carriage passively to the magnetic center under magnetic centripetal forces. Since the magnetic member is substantially in the shape of a centrally open rectangle also in these modifications, the carriage can easily change its directions at a branched point of the conveyor passage.

(6th embodiment)

Changing the directions of a carriage of a magnetic levitation conveyor apparatus according to a sixth embodiment of the present invention, at a branched point having substantially orthogonal branched passages will be described below with reference to FIGS. 17 through 24.

Figure 17:
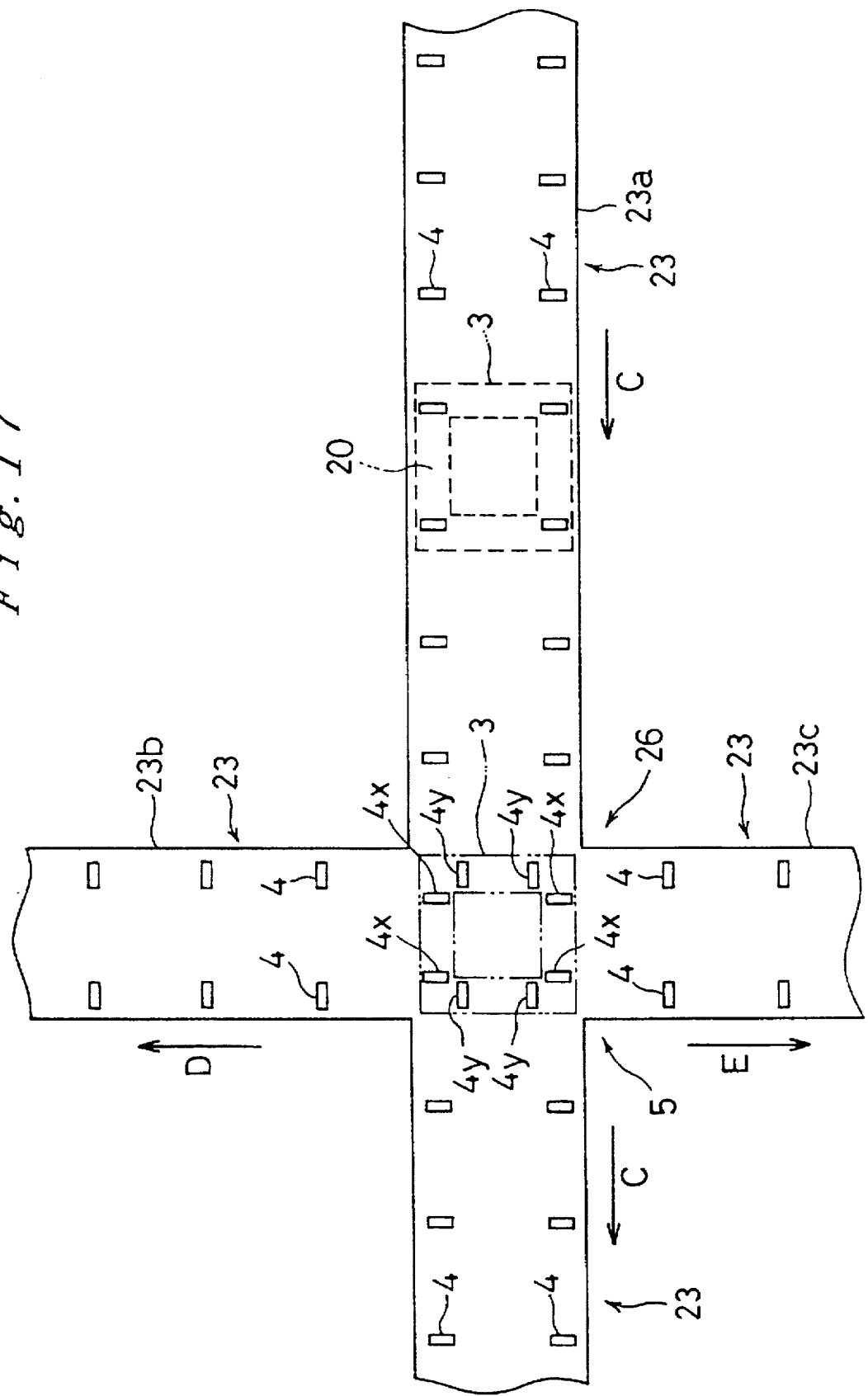
Figure 18:
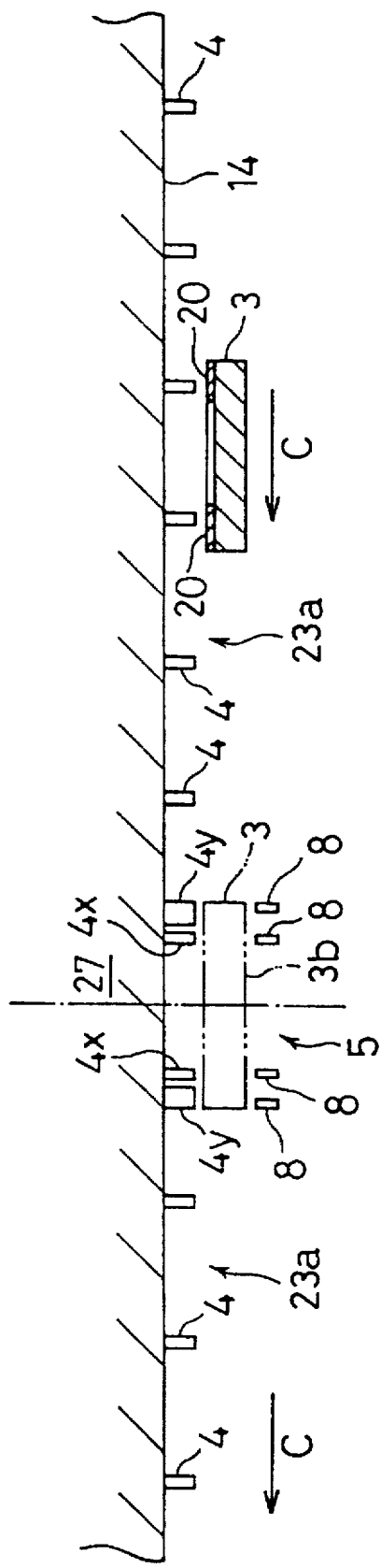

As shown in FIGS. 17 and 18, the magnetic levitation conveyor apparatus has a number of arrayed levitation electromagnets 4, a conveyor passage 23 including a main conveyor passage 23a and branched conveyor passages 23b, 23c branched from the main conveyor passage 23a at a branched point 26, a carriage 3 levitated under magnetic forces from the levitation electromagnets 4 and movable by propelling forces generated by linear motors (not shown) along the conveyor passage 23 in a tunnel (not shown) defined by a partition, and a switching means 25 for changing the directions of movement of the carriage 3 at the branched point 26. The switching means 25 includes a plurality of (four in FIGS. 7 and 8) levitation electromagnets 4 arrayed in the direction of the main conveyor passage 23a and a plurality of as many levitation electromagnets 4 arrayed in another direction and disposed adjacent respectively to the above levitation electromagnets 4. When the carriage 3 reaches the branched point 26 from one of the conveyor passages (e.g., the main conveyor passage 23a), the switching means 25 switches successively from one set of levitation electromagnets (e.g., electromagnets 4x) in an operative condition to the other set of levitation electromagnets (e.g., electromagnets 4y) in an inoperative condition.

The main conveyor passage 23a is oriented in a main conveying direction C, and the branched conveyor passages 23b, 23c are oriented in respective directions D, E perpendicular to the main conveying direction C in a T-shaped or cross-shaped pattern. Only one of the branched conveyor passages 23b, 23c may be employed, and the branched conveyor passages 23b, 23c may be oriented not perpendicularly to the main conveying direction C. If the branched conveyor passages 23b, 23c were oriented not perpendicularly to the main conveying direction C, then the levitation electromagnets would be arrayed out of alignment with the perpendicular directions. Therefore, the branched conveyor passages 23b, 23c should be oriented at about 90° with respect to the main conveying direction C.

Figure 19:
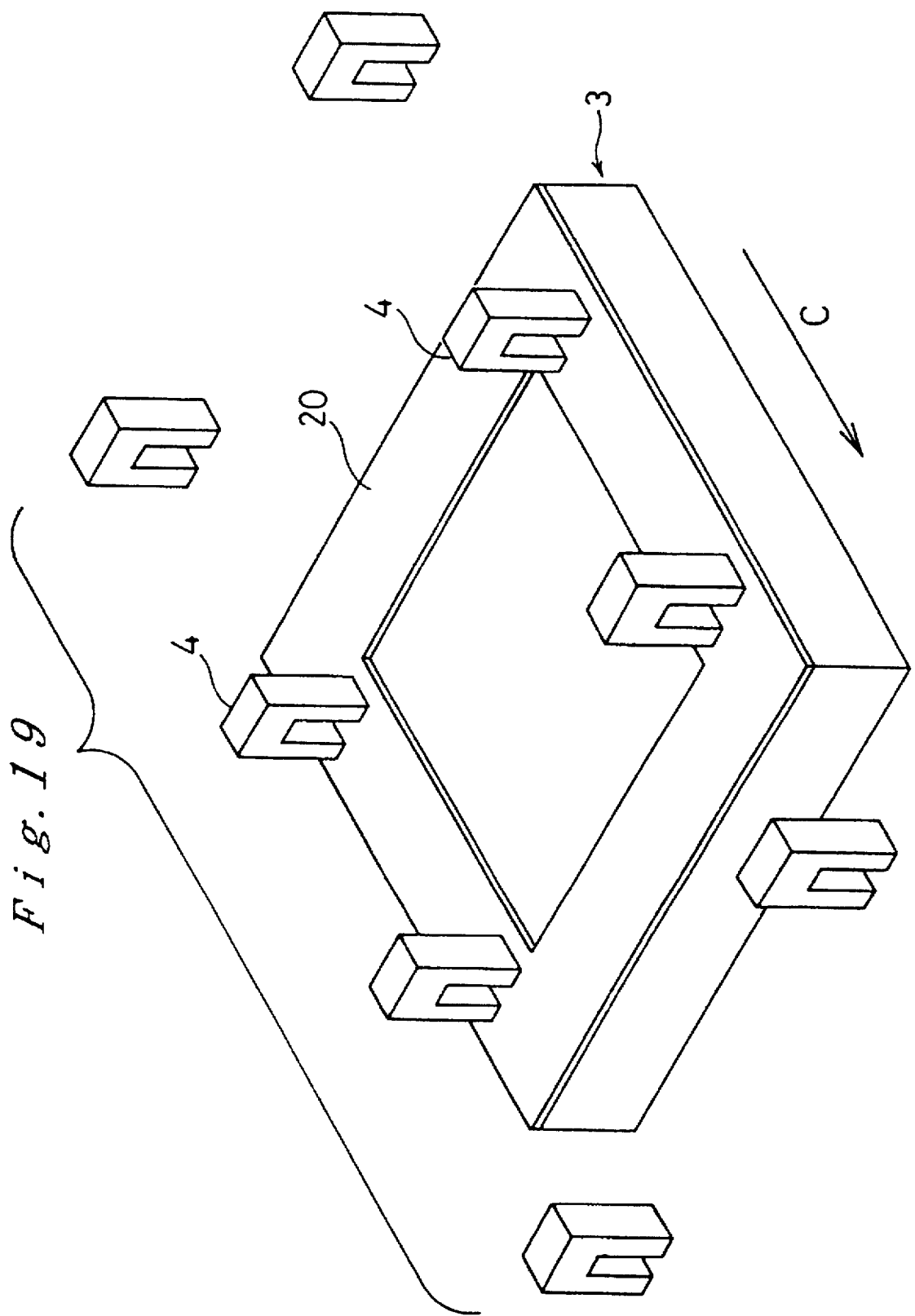

As shown in FIGS. 17 through 19, a pair of left and right rows of levitation electromagnets 4, which serve as magnetic bearings and are also called levitation magnetic poles, are arrayed on a lower surface of a main frame 27 of the conveyor passage 23 at a predetermined pitch in the conveying direction C, D, or E. Each of the electromagnets 4, as a primary side, comprises a coil and a magnetic yoke, whereas the magnetic member 20, as a secondary side, described in detail in the previous embodiment, is mounted on the peripheral edge of an upper surface of the carriage 3, the magnetic member 20 being composed of a yoke which serves as a target to be levitated. The magnetic member 20 is positioned below the electromagnets 4 with a non-illustrated tunnel partition interposed therebetween so that the carriage 3 can be lifted out of contact with the tunnel under magnetic attractive forces produced by the electromagnets 4. The electromagnets 4 as the primary side and the magnetic member 20 as the secondary side jointly constitute an array of magnetic levitation devices extending in the conveying directions C, D, E.

The carriage 3 is moved when propelled out of contact with the partition by non-illustrated linear motors. The linear motors include respective stators (electromagnets) arrayed on a lower surface of a tunnel partition. An electrically conductive member such as an aluminum plate is mounted on a lower surface of the carriage 3. A spatial moving magnetic field generated by the stators of the linear motors causes an eddy current to be produced in the electrically conductive member mounted on the lower surface of the carriage 3, which is then subjected to propelling forces to move the carriage 3 out of contact with the tunnel partition.

Only those of the levitation electromagnets 4 which are required to lift the carriage 3 are energized. Specifically, the arrayed electromagnets 4 are switched successively into and out of an operative condition along the direction in which the carriage 3 is to move, according to a detected signal indicative of the position of the carriage, thereby switching the magnetic poles on and off to successively generate magnetic attractive forces applied to the magnetic member 20 on the carriage 3. The carriage 3 now moves in the conveying direction C, D, or E while keeping a predetermined gap below the lower surface of the partition of the conveyor passage. Switching of the levitation electromagnets as the carriage moves will be described in detail later on with respect to an eighth embodiment of the present invention.

Figure 20:
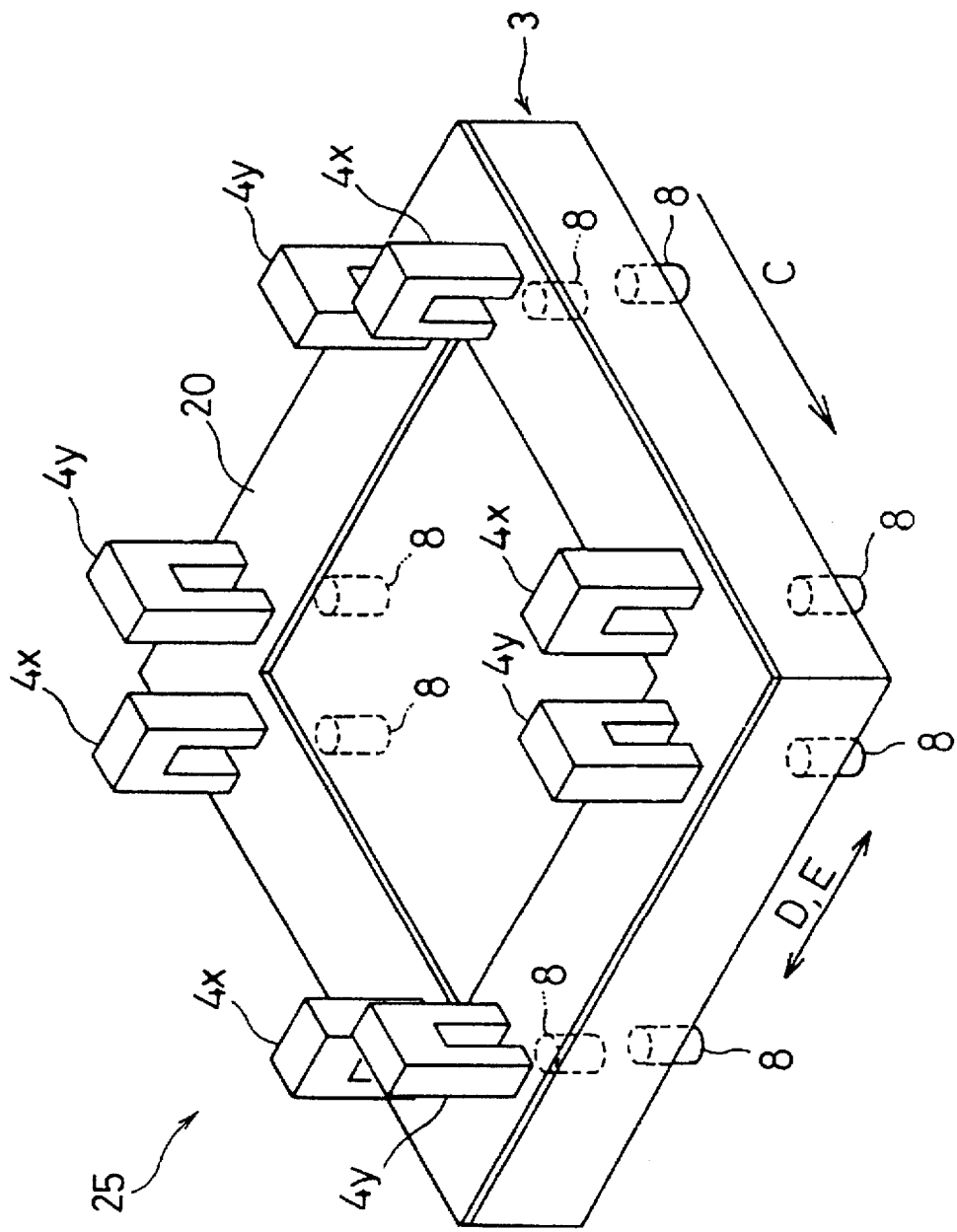

A mechanical arrangement of the switching means 25 which is operated at the branched point 26 will be described below with reference to FIG. 20. At the branched point 26, electromagnets 4x arrayed in the direction of the main conveying passage 23a at regular intervals in the same orientation as the levitation electromagnets 4 in the main conveyor passage 23a, and electromagnets 4y arrayed in the directions of the branched conveying passages 23b, 23c at regular intervals in the same orientations as the levitation electromagnets 4 in branched conveying passages 23b, 23c are mounted on an upper partition surface of the tunnel with the magnetic pole surfaces facing downwardly. The electromagnets 4x, 4y are positioned perpendicularly to each other and disposed adjacent to each other to prevent the carriage from vibrating when the levitation electromagnets are switched to change the conveying directions. Displacement sensors 8 for detecting the levitated position of the carriage 3 are mounted on a tunnel partition (not shown) directly below the respective levitation electromagnets 4x, 4y.

Figure 21:
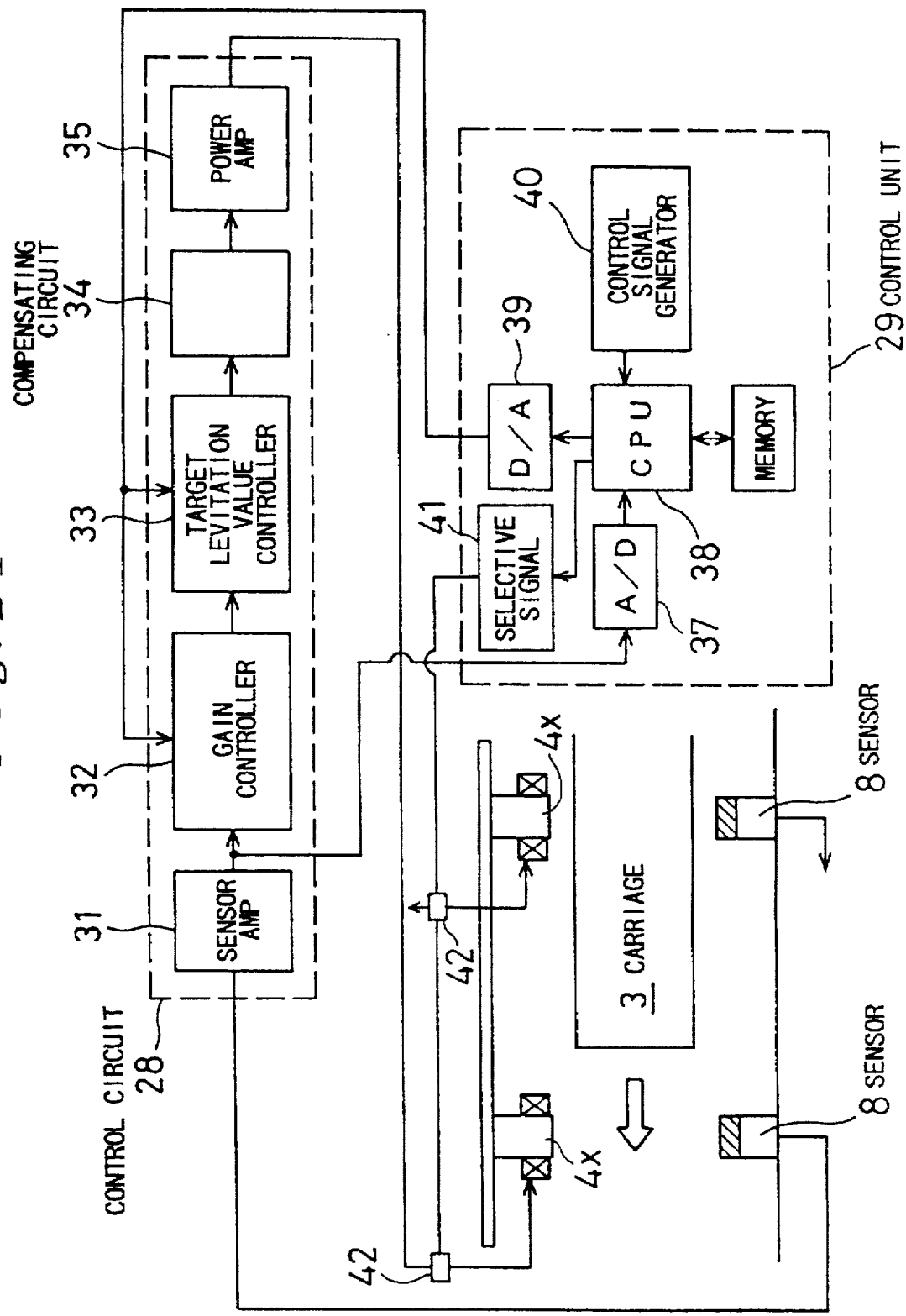

FIG. 21 shows in block form a control system for the levitation electromagnets of the magnetic levitation conveyor apparatus. A process for controlling the switching on and off of the magnetic poles to lift the carriage and the levitated position of the carriage will be described below with reference to FIG. 21.

A control circuit 28 is a closed-loop control circuit for controlling an exciting current to be supplied to the levitation electromagnets 4x based on an output signal from the displacement sensors 8. The signal from the displacement sensors 8 which is indicative of the detected levitated position (displacement) of the carriage 3 is amplified by a sensor amplifier 31. The gain of the control circuit 28 which is preset by a control unit 29 is adjusted by a gain controller 32. The detected levitated position is compared with a target levitation value which is preset by the control unit 29 by a target levitation value controller 33. A compensating circuit 34 adjusts the phase of the closed-loop control circuit. An output signal from the compensating circuit 34 is amplified by a power amplifier 35, and the amplified signal is supplied as an exciting current to the levitation electromagnets 4x. The levitation electromagnets 4x then generate magnetic attractive forces corresponding to the supplied exciting current, for thereby attracting the magnetic member target on the carriage 3 to control the levitated position of the carriage 3.

The control unit 29 comprises an A/D converter 37, a D/A converter 39, a control signal generator 40 for generating a gain signal and a target levitation value signal, and a CPU 38. The control unit 29 serves to control the switching on and off of the magnetic poles to lift the carriage 3. After the output signal from the displacement sensors 8 is amplified by the sensor amplifier 31, it is converted by the A/D converter 37 into a digital signal which is supplied to the CPU 38 for detecting the position of the carriage 3 with respect to the magnetic poles to lift the carriage 3. For example, the control unit 29 can produce a signal indicative of a detected carriage position for switching a certain levitation electromagnet from an inoperative condition into an operative condition to lift the carriage as it moves. The control signal generator 40 supplies the gain controller 32 and the target levitation value controller 33 respectively with a signal indicative of a loop gain of the control circuit 28 and a signal indicative of a target levitation value of the carriage 3. Therefore, when the gain is varied from 0 to a certain preset value (or when the target levitation value is varied from a certain preset value corresponding to an inoperative condition to a certain preset value corresponding to an operative condition) by the control signal generator 40, a levitation electromagnet can be switched from an inoperative condition into an operative condition with the given gain and target levitation value.

Figure 26:
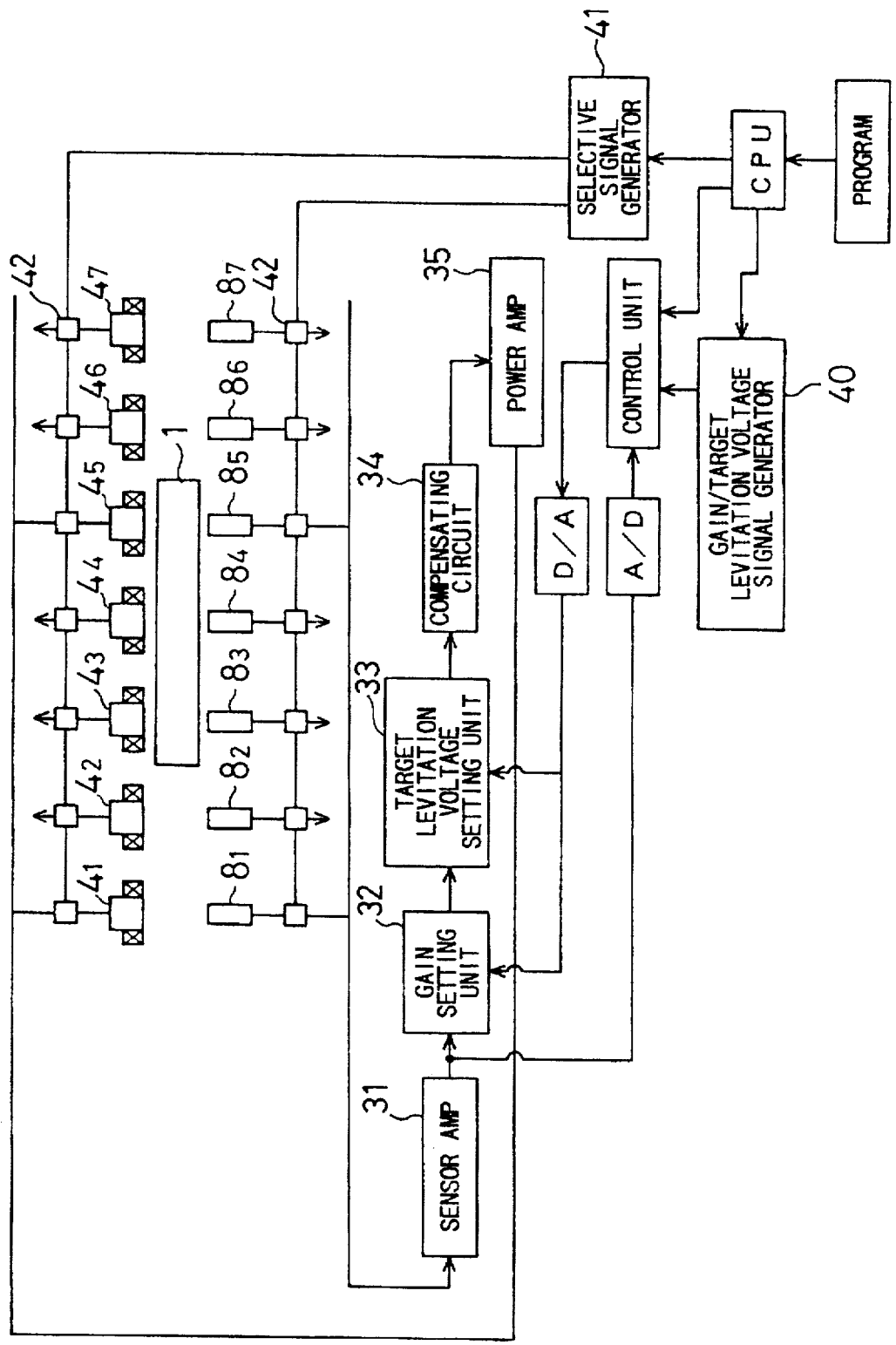

As shown in FIG. 26, the levitation electromagnets and the displacement sensors arrayed in the direction in which the carriage moves are successively switched on and off in that direction as the carriage moves, for thereby keeping the carriage lifted. The magnetic levitation conveyor apparatus has eight control circuits for detecting the levitated position with sensor amplifiers 8 and lifting the carriage to a target position with the energization of power amplifiers 35 to control adjacent four pairs of electromagnets of the two rows of electromagnets. The pairs of electromagnets to be controlled are selected when switches 42 are closed according to a signal from a selective signal generator 41.

When the levitation electromagnets 4 in the main conveyor passage 23a are controlled by a control signal from the control unit 29 and the control circuit 28, the magnetic member 20 is attracted by magnetic attractive forces produced by the energization of the levitation electromagnets 4, lifting the carriage 3, and the carriage 3 is propelled by the linear motors to move in the direction C in the main conveyor passage 23a until it arrives at the branched point 26. If the carriage 3 is to move straight in the main conveyor passage 23a, then the electromagnets 4x of the switching means 25 at the branched point 26, which are arrayed in the direction of the main conveyor passage, are controlled in the same manner as the levitation electromagnets 4. The carriage 3 as it remains lifted passes through the branched point 26, and is transferred to and lifted by the levitation electromagnets 4 in a forward section of the main conveyor passage 23a. The carriage 3 is continuously moved by switching these levitation electromagnets according to a signal representative of a detected carriage position. If, however, the direction of the carriage 3 is to change from the direction C of the main conveyor passage 23a to the direction D or E of the branched conveyor passage 23b or 23c at the branched point 26, then the switching means 25 is controlled by the control unit 29 and the control circuit 28 as follows:

A switching sequence will be described below with reference to FIGS. 22 and 23. Reference characters I, III, 1, 3 in FIGS. 22(A) through (D) represent positions of electromagnets 4x arrayed in the direction of the main conveyor passage, and reference characters I', III' 1', 3' represent positions of electromagnets 4y arrayed in the direction of the branched conveyor passage.

Figure 22A:
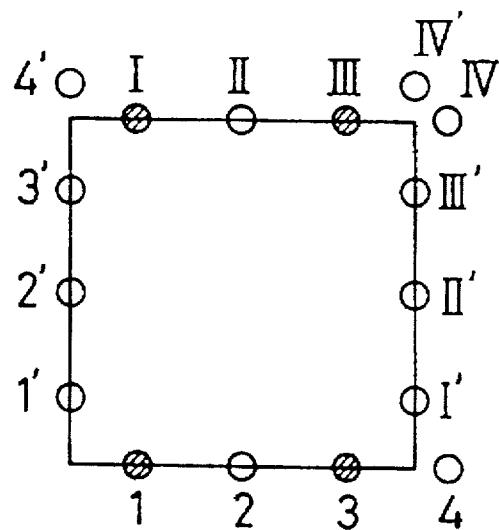
Figure 22B:
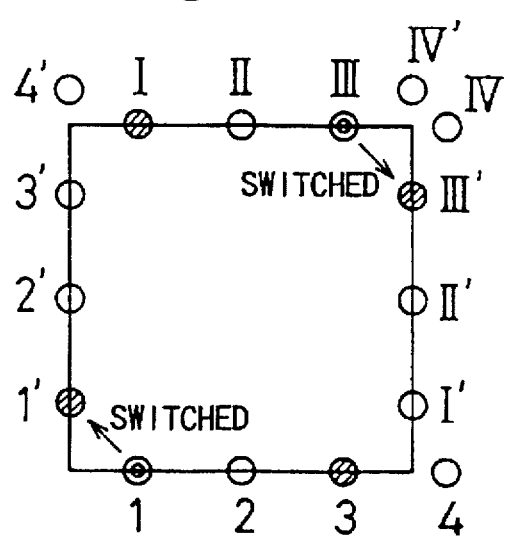
Figure 22C:
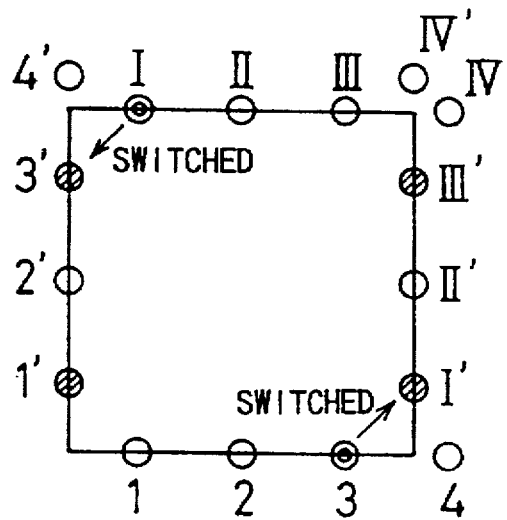

As shown in FIG. 22, when the carriage 3 arrives at the branched point 26, the carriage 3 is supported out of contact with the tunnel partition while remaining levitated by magnetic attractive forces and guiding rigidity produced by the electromagnets 4x that are controlled to lift the carriage 3 in the main conveying direction and located at the positions indicated by I, III, 1, 3 (the condition shown in FIG. 22(A)).

The control signal generators 40 of levitation control systems (loops) associated with the electromagnets 4y located at the positions indicated by III', 1' output a target levitation voltage, the gain of the levitation control systems are set to 0, and switches 42 which have been open are closed.

The gain is progressively increased from 0 to a preset value for an operative condition over a preset period of time by the control signal generators 40 of the levitation control systems (loops) associated with the electromagnets 4y located at the positions indicated by III', 1', thereby gradually flowing a current to the electromagnets 4y to put the electromagnets 4y into an operative condition. At the same time, the gain is progressively decreased from a preset value for an operative condition to 0 over a preset period of time by the control signal generators 40 of levitation control systems (loops) associated with the electromagnets 4x located at the positions indicated by III, 1, after which the switches 42 which have been closed are opened (see FIG. 22(B), FIG. 23).

After elapse of a preset waiting time, the control signal generators 40 of levitation control systems (loops) associated with the electromagnets 4y located at the positions indicated by I', 3' output a target levitation voltage, the gain of the levitation control systems are set to 0, and switches 42 which have been open are closed.

The gain is progressively increased from 0 to a preset value for an operative condition over a preset period of time by the control signal generators 40 of the levitation control systems (loops) associated with the electromagnets 4y located at the positions indicated by I', 3', thereby gradually flowing a current to the electromagnets 4y to put the electromagnets 4y into an operative condition. At the same time, the gain is progressively decreased from a preset value for an operative condition to 0 over a preset period of time by the control signal generators 40 of levitation control systems (loops) associated with the electromagnets 4x located at the positions indicated by I, 3, after which the switches 42 which have been closed are opened (see FIG. 22(C), FIG. 23).

Figure 22D:
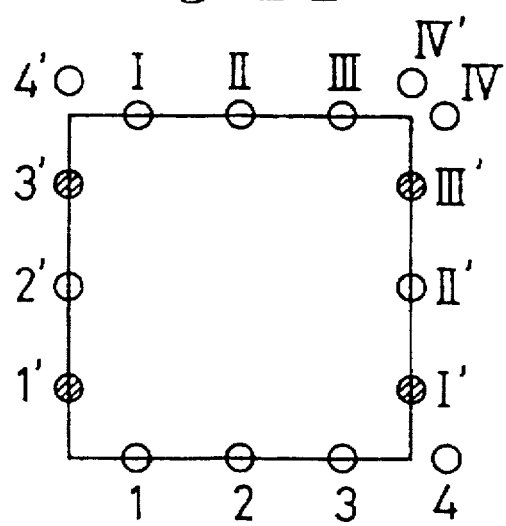
Figure 23:
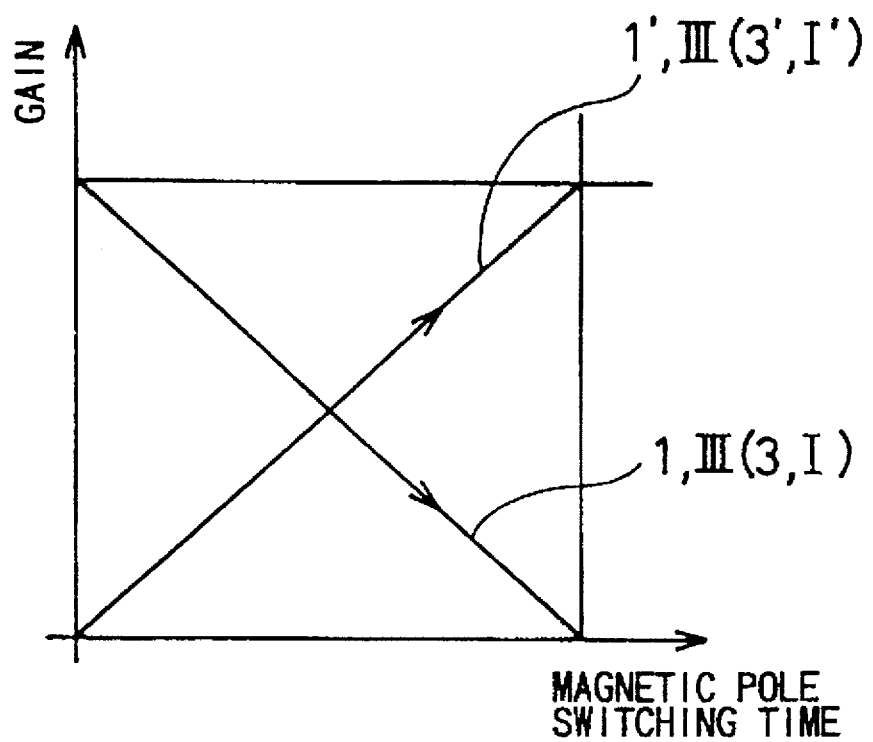

Through the above sequence, the carriage 3 is now suspended by magnetic attractive forces generated by the four electromagnets 4y that are newly controlled to lift the carriage 3 and located at the positions indicated by I', III', 1', 3' (see FIG. 22(D)). The magnetic poles to lift the carriage 3 are now switched from the electromagnets 4x arrayed in the main conveying direction, which have initially been magnetic poles to lift the carriage 3, to the electromagnets 4y arrayed in the direction of the branched conveyor passage which is angularly spaced about 90° from the main conveying direction. The carriage 3 moves in the direction D or E of the branched conveyor passage 23b or 23c In this embodiment, when the gains of the electromagnets 4x, 4y at the branched point 26 are controlled, diagonally opposite electromagnets are handled as sets, and they are switched from III to III' and from 1 to 1' at the same time, and then switched from I to 3' and from 3 to I' at the same time. Since the gains are gradually changed in a crossover relation to each other, any vibration which the carriage 3 tends to suffer upon switching can greatly be reduced.

Figure 24A:
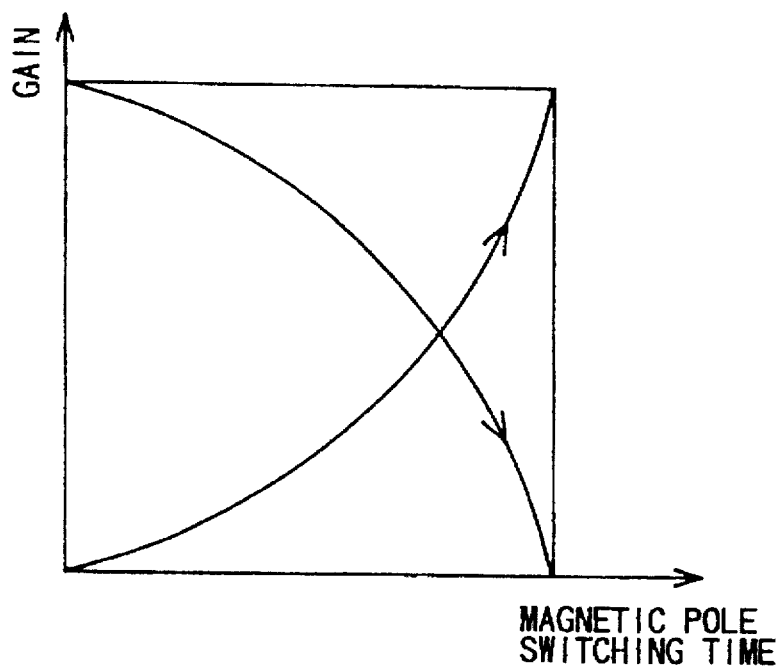
Figure 24B:
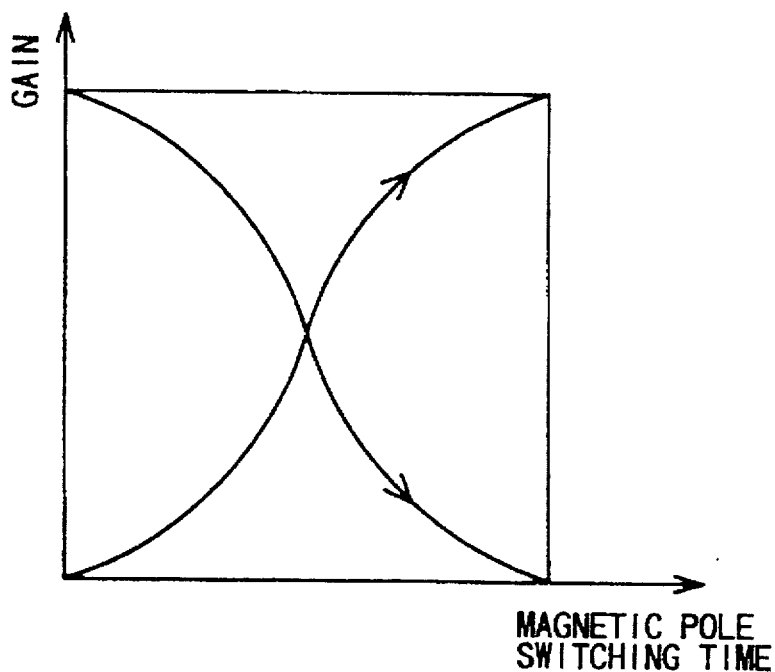

In the above embodiment, the control means has been described which causes the control unit 29 to gradually change the gains of the control circuits over the preset periods of time when the levitation electromagnets in an operative condition are brought into an inoperative condition and the levitation electromagnets in an inoperative condition are brought into an operative condition. The same result can be achieved by causing the control unit 29 to gradually vary the target levitation voltage representative of a target levitation value for the carriage, or by gradually varying the gains of the control circuits and simultaneously gradually varying an offset voltage representative of a target levitation value for the carriage. In FIG. 23, the voltage indicative of the gain or the target levitation value is linearly varied in a time $t_0$. However, the voltage may be varied along a curve, as shown in FIG. 24(A) or 24(B).

When the levitation electromagnets in an operative condition are brought into an inoperative condition and the levitation electromagnets in an inoperative condition which are arranged in a different conveying direction are brought into an operative condition, closest electromagnets in operative and inoperative conditions, respectively, are handled as a set and switched from one to the other. In the above sequence, the two sets of electromagnets are switched from III to III' and from 1 to 1' at the same time, and then from I to 3' and from 3 to I' at the same time.

However, the electromagnets may be switched in various combinations of sets. For example, sets of electromagnets may be switched from III to III', then from 1 to 1', then from I to 3', and finally from 3 to I'. By programming the control unit 29 to select a suitable sequence for switching sets of electromagnets, it is possible to select an optimum combination of sets of electromagnets while observing how the carriage vibrates upon switching.

Since the electromagnets are switched from magnetic poles which are controlled to lift the carriage to those magnetic poles which are angularly spaced about 90° from the magnetic poles, the carriage can move in a T-shaped or cross-shaped pattern. Inasmuch as the gains of the magnetic poles are controlled in a crossover relation to each other, any vibration which the carriage tends to suffer upon switching can effectively be reduced.

The carriage 3 can also be easily controlled to move from the branched conveyor passage 23b or 23c to the main conveyor passage 23a.

According to this embodiment, the direction of the carriage 3 can be switched to a desired one of the branched conveyor passages 23b, 23c other than the main conveyor passage 23a, and hence the carriage 3 can be moved with 2 degrees of orthogonal freedom while being lifted in a horizontal plane.

(7th embodiment)

Switching levitation electromagnets for suspending a carriage as it moves according to a seventh embodiment of the present invention will be described below with reference to FIGS. 25 through 30.

FIG. 25 is a cross-sectional view along a conveyor passage of the above magnetic levitation conveyor apparatus. The carriage 3 is propelled by the linear motors 6 to move in the direction indicated by the arrow in a tunnel defined by a partition while it remains lifted by levitation electromagnets $4_1$, $4_2$, . . . At this time, the levitation electromagnets $4_3$, $4_5$ are in an operative condition, and the levitation electromagnets $4_1$, $4_2$, $4_4$, $4_6$, $4_7$, $4_8$, $4_9$ are in an inoperative condition. As the carriage 3 moves, an exciting current is supplied to these levitation electromagnets to switch their magnetic poles from an inoperative condition to an operative condition, and cut off to switch their magnetic poles from an operative condition to an inoperative condition, for keeping the carriage lifted while the carriage is moving. For example, when the carriage 3 is moved to the left from the illustrated position, the magnetic poles $4_2$, $4_4$ are switched from an inoperative condition to an operative condition, and the magnetic poles $4_3$, $4_5$ are switched from an operative condition to an inoperative condition.

FIG. 26 show in block form a control system of the magnetic levitation conveyor apparatus. The levitated position of the carriage and the switching of the magnetic poles between operative and inoperative conditions are controlled by the block diagram of FIG. 26. A signal from displacement sensors $8_1$, $8_5$, . . . is amplified by a sensor amplifier 31, and the gain of a control circuit loop is adjusted by a gain setting unit 32. The gain is compared with a preset voltage by a target levitation voltage setting unit 33 to achieve a given target levitation value. The phase is adjusted by a compensating circuit 34, and an output signal from the compensating circuit 34 is amplified by a power amplifier 35, which supplies an exciting current to the magnetic poles $4_1$, $4_5$, . . . of the levitation electromagnets. The magnetic levitation conveyor apparatus has eight control circuits (for four pairs of rows of electromagnets as the electromagnets are arrayed in two rows in each conveyor passage) each including the components ranging from the sensor amplifier 31 to the power amplifier 35. Only a control circuit for a pair of rows of levitation electromagnets $4_1$, $4_5$, . . . is illustrated. The levitation electromagnets $4_2$, $4_3$, $4_4$, $4_6$, $4_7$, . . . are controlled by non-illustrated control circuits. In the closed-loop control circuit, the target levitated position for the carriage and the gain of the control loop are given by a signal from a gain/target levitation voltage signal generator 40. The magnetic poles are switched from an operative condition to an inoperative condition or from an inoperative condition to an operative condition by amplifying a signal from the displacement sensors $8_1$, $8_2$, . . . with the sensor amplifier 31, converting the amplified signal into a digital signal with an A/D converter, and applying the digital signal to a control unit. Specifically, movement of the carriage 3 is detected by a signal from the displacement sensors $8_1$, $8_2$, . . . , and a position selection signal is generated for switching the magnetic poles from an inoperative condition to an operative condition or from an operative condition to an inoperative condition. A signal indicative of the gain of the control circuit or a target levitation voltage is applied from the gain/target levitation voltage signal generator 40 to the gain setting unit 32 and the target levitation value controller 33 for thereby controlling each of the magnetic poles to switch between operative and inoperative conditions.

FIG. 27 is a diagram showing a sequence of switching conventional levitation magnetic poles. Levitation magnetic poles arranged in the direction of movement of the carriage are successively switched from an operative condition to an inoperative condition in that direction through the selective signal generator 41 and the switch group 42 as the carriage moves. When the levitation magnetic poles are thus switched, a control time in which the gain varies from a preset value to 0 or from 0 to a preset value with respect to each individual magnetic pole is set depending on the speed at which the carriage moves, and the control times are individually varied gradually to bring the magnetic poles from an operative condition to an inoperative condition or from an inoperative condition to an operative condition for thereby successively switching the levitation magnetic poles.

Figure 28A:
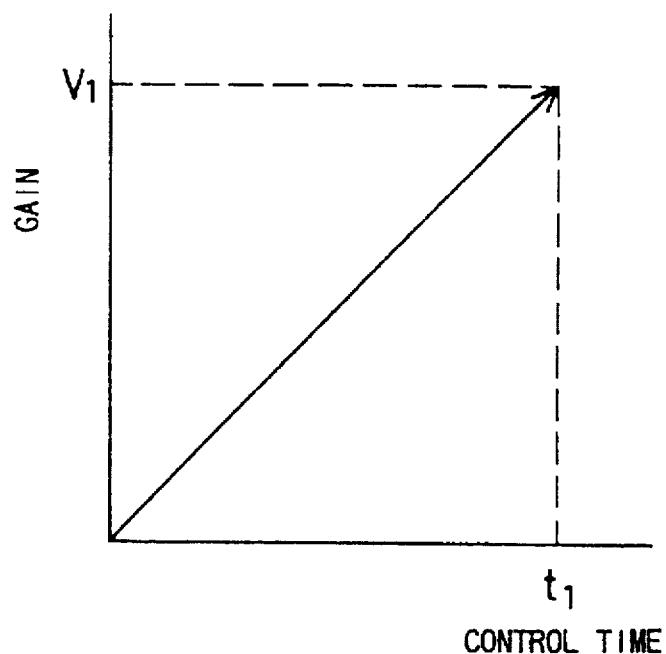
Figure 28B:
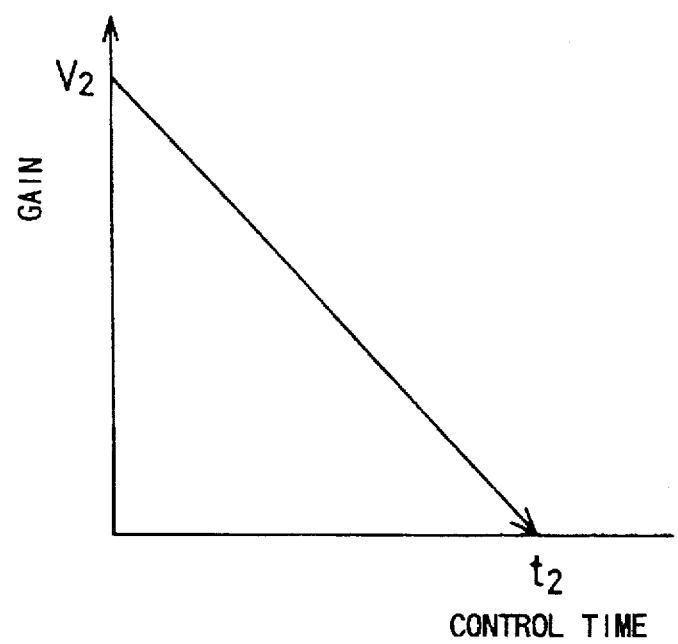

FIG. 28(A) is a diagram illustrative of switching of the conventional magnetic poles from an inoperative condition to an operative condition. In this example, when switches of the switch group 42 are closed, and the gain varies from 0 to a preset value $V_1$ (from a target levitation value $V_{s1}$ to a target levitation value $V_{s2}$) in a control time $t_1$, the magnetic poles are switched from an inoperative condition to an operative condition. FIG. 28(B) is a diagram illustrative of switching of the conventional magnetic poles from an operative condition to an inoperative condition. In this example, when switches of the switch group 42 are opened, and the gain varies from a preset value $V_2$ to 0 (from the target levitation value $V_{s2}$ to the target levitation value $V_{s1}$) in a control time $t_2$, the magnetic poles are switched from an operative condition to an inoperative condition. Heretofore, as described above, the magnetic poles arranged in the conveying direction are individually switched from an inoperative condition to an operative condition or from an operative condition to an inoperative condition as the carriage moves.

The magnetic levitation conveyor apparatus requires that the carriage move smoothly in the conveyor passage and be started and stopped as smoothly as possible. One problem which is imposed more severely at this time is that the carriage itself tends to vibrate upon switching of the levitation magnetic poles. According to the present invention, there is disclosed a process of switching levitation electromagnets for moving the carriage smoothly while solving the problem of vibration of the carriage in switching the levitation electromagnets from an operative condition to an inoperative condition or from an inoperative condition to an operative condition.

In this embodiment, when levitating electromagnets arrayed in the direction in which the carriage moves are successively switched from an operative condition to an inoperative condition or from an inoperative condition to an operative condition as the carriage moves, switching of at least one set of magnetic poles arranged in that direction is gradually carried out simultaneously from an operative condition to an inoperative condition and from an inoperative condition to an operative condition.

Figure 29:
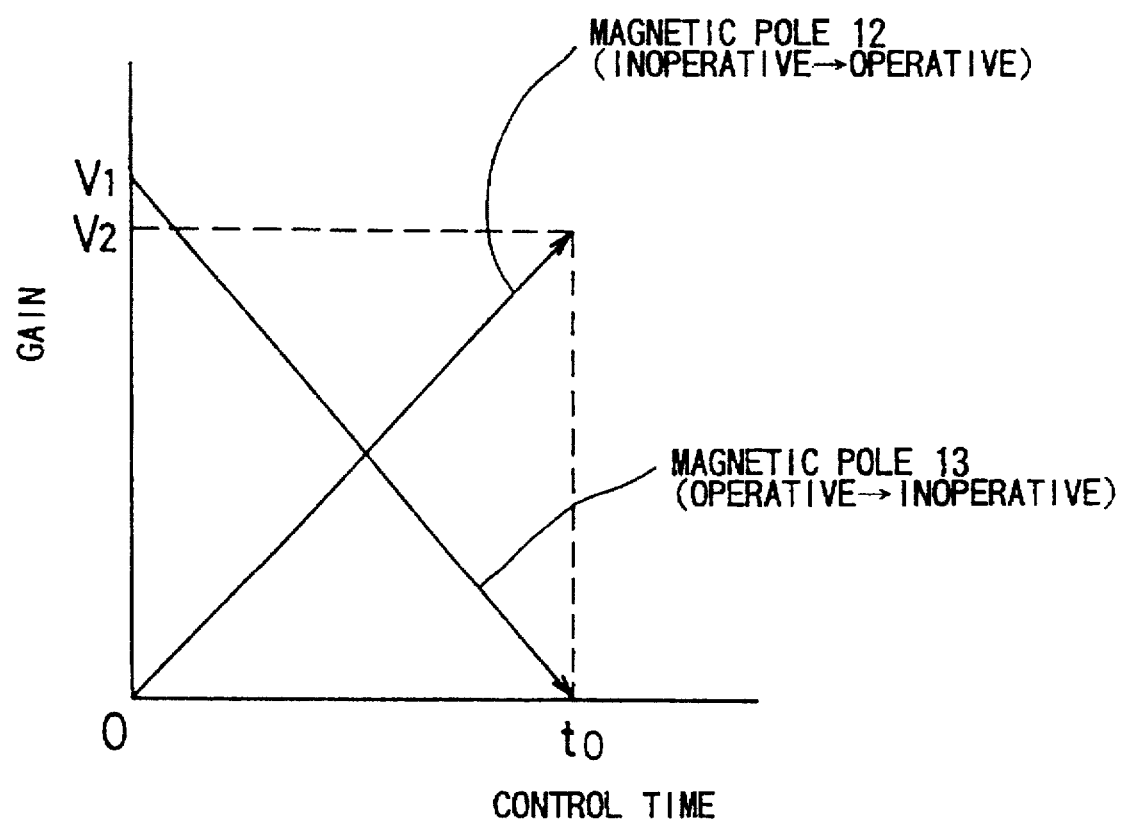

FIG. 29 shows the manner in which switching of one set of adjacent magnetic poles arranged in the direction in which the carriage moves is gradually carried out simultaneously from an operative condition to an inoperative condition and from an inoperative condition to an operative condition at the time the levitation electromagnets are successively switched from an operative condition to an inoperative condition or from an inoperative condition to an operative condition. In FIG. 26, when the carriage 3 moves to the left, the displacement sensor $8_2$ associated with the magnetic pole $4_2$ detects arrival of the carriage 3. As shown in FIG. 29, the magnetic pole $4_3$ and the magnetic pole $4_2$ which is positioned adjacent thereto in the conveying direction are gradually switched simultaneously from an operative condition to an inoperative condition and from an inoperative condition to an operative condition, respectively.

Figure 30A:
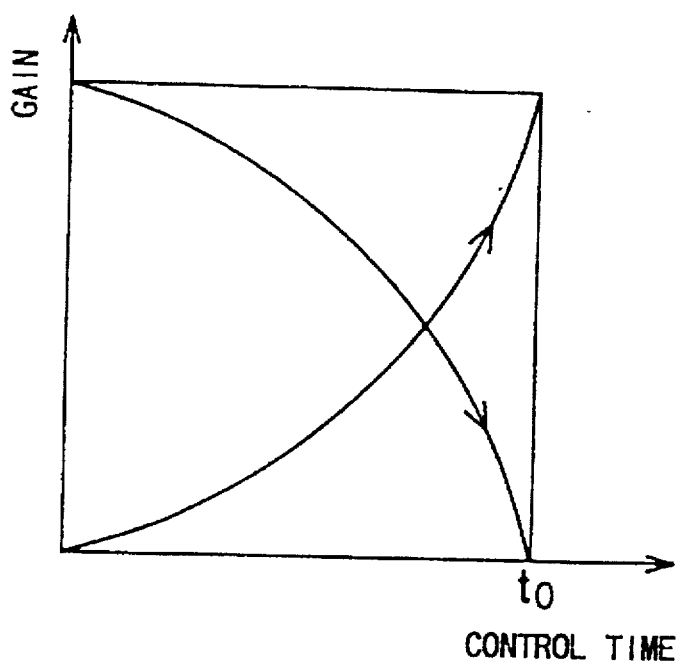
Figure 30B:
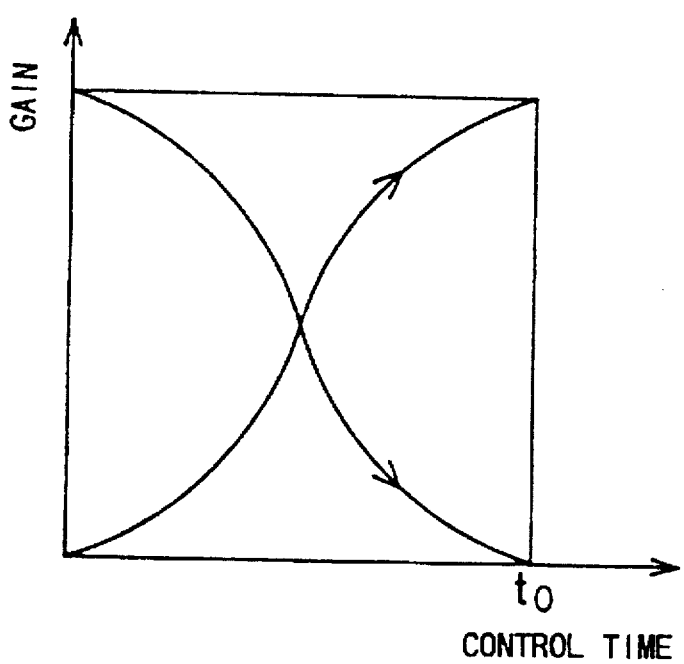

The switching operation gradually progresses in the control time $t_0$. While the switching operation shown in FIG. 29 is linear, it may be effected along curves as shown in FIG. 30(A) or 30(B).

The process of controlling the switching of the levitation electromagnets is carried out in the control system shown in FIG. 26 by gradually increasing the total gain of the control circuit from 0 to a preset value $V_2$ for the magnetic pole $4_2$ and gradually reducing the total gain from a present value $V_1$ to 0 for the magnetic pole $4_3$ with the gain setting unit 32. The target levitation value controller 33 may increase an offset voltage, which is a parameter of a target levitation voltage, from a value $V_{s1}$ to a preset value $V_{s2}$ for the magnetic pole $4_2$, and reduce the offset voltage from a present value $V_{s3}$ to a value $V_{s4}$ for the magnetic pole $4_3$ simultaneously gradually in the control time $t_o$. Alternatively, the gain of the control circuit may be varied by the gain setting unit 32, and then the offset voltage which is a target levitation value of the target levitation value controller 33 may be varied.

In the above description, one set of magnetic poles arranged in the conveying direction, i.e., the magnetic poles $4_2$, $4_3$ are simultaneously switched from an inoperative condition to an operative condition and from an operative condition to an inoperative condition, respectively. Such simultaneous magnetic pole switching operation can be carried out with respect to a plurality of sets of magnetic poles for improved stability of movement of the carriage.

For example, it is possible to simultaneously switching the set of magnetic poles $4_4$, $4_5$ other than the set of magnetic poles $4_2$, $4_3$. Specifically, the displacement sensor $8_2$ detects arrival of the carriage 3 as it moves thereto, and opens and closes switches through the selective signal generator 41 and the switch group 42 to switch the magnetic poles $4_2$, $4_4$ from an inoperative condition to an operative condition and the magnetic poles $4_3$, $4_5$ from an operative condition to an inoperative condition simultaneously gradually in the control time $t_0$. The stability of movement of the carriage can be increased by thus simultaneously gradually switching the two sets of magnetic poles $4_2$, $4_3$, $4_4$, $4_5$ which are arranged in the conveying direction.

In FIG. 25, the carriage 3 is lifted by three magnetic poles arranged in the conveying direction. If the carriage 3 is lifted by more magnetic poles, e.g., four or five magnetic poles, then three sets of magnetic poles can be switched simultaneously. Therefore, magnetic poles can simultaneously be switched from an operative condition to an inoperative condition and from an inoperative condition to an operative condition in various combinations. It is possible in such a case to select a suitable combination of magnetic poles for simultaneous switching, and to reduce, with a selected combination, more effectively any vibration of the carriage which is produced upon switching of levitation magnetic poles as the carriage moves.

In this embodiment, as described above, the levitation magnetic poles for lifting and moving the carriage of the magnetic levitation conveyor apparatus are simultaneously switched gradually between operative and inoperative conditions. Consequently, the carriage is prevented from vibrating upon switching of levitation magnetic poles as the carriage moves, and the levitation magnetic poles can smoothly be switched at the time the carriage is moved, stopped, or started, for thereby moving the carriage smoothly.

(8th embodiment)

Control of the lifting/landing of a carriage according to an eighth embodiment of the present invention will be described below with reference to FIGS. 31 through 33.

In the above magnetic levitation conveyor apparatus, only the power supply of a control device is turned on and off to lift the carriage off and land the carriage on a lower partition surface of the tunnel. Therefore, the carriage tends to be lifted or landed abruptly. Stated otherwise, when the carriage is lifted or landed, a workpiece carried by the carriage is subjected to a shock, and liable to suffer damage. Inasmuch as the magnetic levitation conveyor apparatus is designed for use in conveying various a workpiece such as a wafer, which is highly susceptible to cracks, in semiconductor fabrication factories, any damage to the workpiece poses a very serious problem. Abrupt lifting or landing is also responsible for producing dirt and dust particles, which are apt to lower the yield of semiconductors. When a workpiece such as a wafer is conveyed, it is preferable for the vertical height of the workpiece to be variable so that the workpiece can be received and transferred easily. In the magnetic levitation conveyor apparatus, it is desirable for the carriage to be lifted a distance that can freely be adjusted. If any workpiece is placed on the carriage, the carriage should preferably be lifted from a landed condition within a short period of time, so that the time required to convey a workpiece can be shortened.

The present embodiment is designed to solve the above problems, and discloses a magnetic levitation conveyor apparatus which can lessen shocks produced when a carriage is lifted and landed, and can freely adjust the distance that the carriage can be lifted and the time required to lift and land the carriage.

Figure 31:
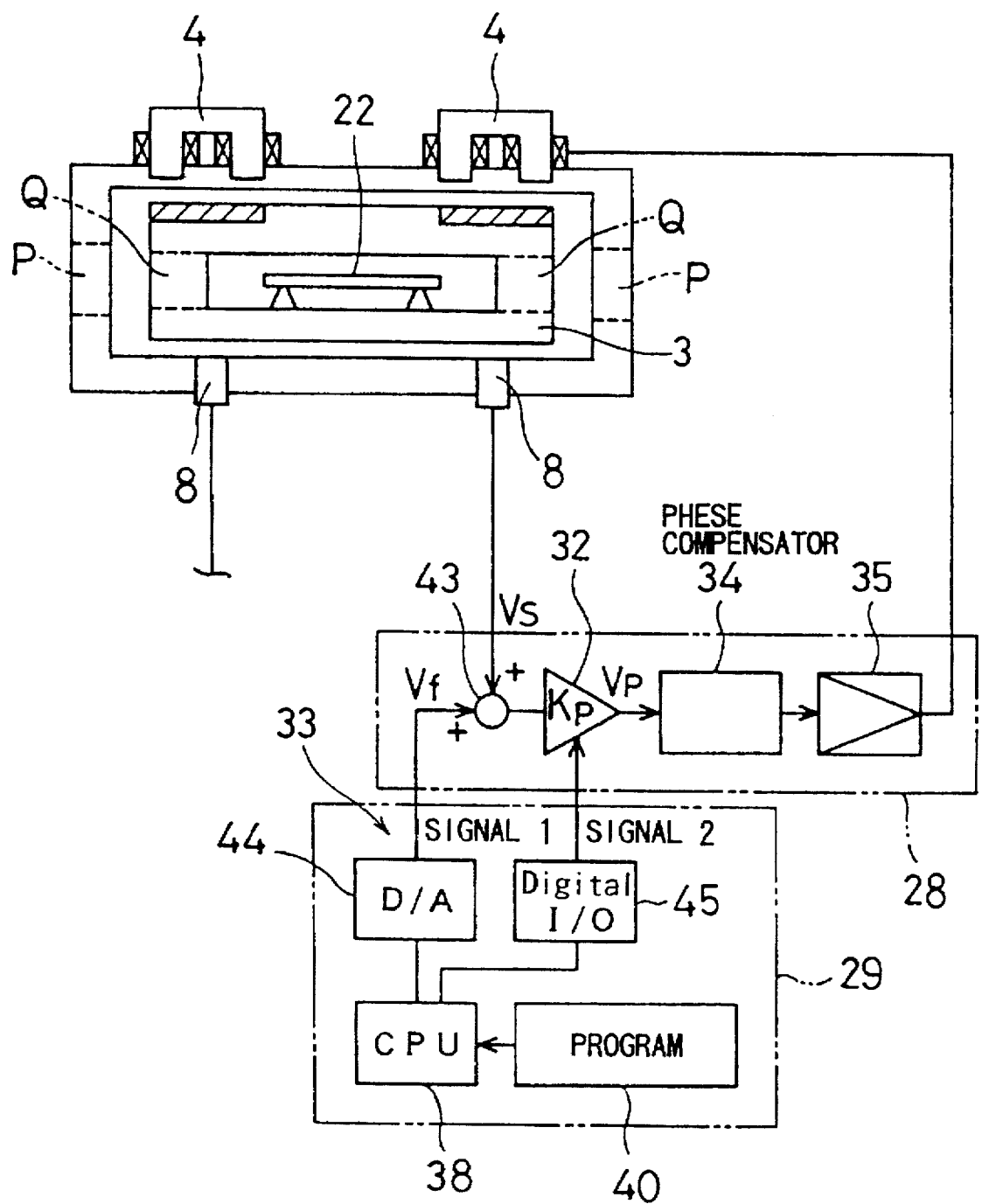
FIGS. 31 through 33 show a magnetic levitation conveyor apparatus according to an eighth embodiment of the present invention.

FIG. 31 shows a basic arrangement of a control system. Basic operation of the control system for controlling magnetic attractive forces produced by levitation electromagnets 4 to lift a carriage 3 up to a target position is the same as with the sixth and seventh embodiments described above, and will not be described below.

An output signal $V_s$ from displacement sensors 8 is compared with an offset voltage $V_f$ which is a target levitation value by an adder 43, and the difference is applied to a gain setting unit 32 for determining an amplification factor $K_p$ of a control system of a control circuit composed of components ranging from the displacement sensors 8 to a power amplifier 35. Specifically, an output signal from the gain setting unit 32 is led to a phase compensator 34 and then to the power amplifier 35 for increasing or reducing an exciting current to be supplied to coils wound around levitation electromagnets 4. The electromagnets 4 apply magnetic attractive forces generated by the exciting current flowing through the coils to the carriage 3, which is then lifted under the magnetic attractive forces. The carriage can be supported with greater magnetic bearing rigidity by setting a high amplification factor in a stable range with the gain setting unit 32.

In an offset voltage supply means 33, a command is given from a program 40 to a digital processing means (CPU) 38 to generate an offset voltage $V_{of}$. The digital processing means 38 has a function as a generating mechanism for determining an offset voltage.

Any of various programs indicated at 40 can freely be incorporated in the digital processing means 38, and the program 40 can freely be changed. The program 40 is generated such that the offset voltage applied from the offset voltage supply means to the adder 43 will have desired various characteristics (e.g., time characteristics). Since a process of generating such a program is a known software generation process, it will not be described below.

Figure 33:
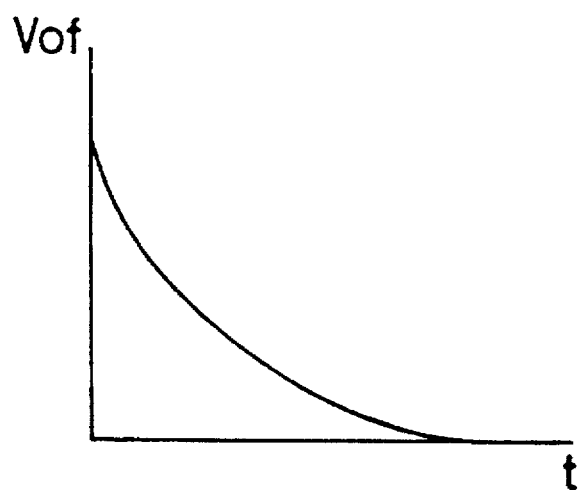

When the carriage is to be lifted, the offset voltage $V_{of}$ and time "t" should preferably be related to each other (time characteristics) as shown in FIG. 33. Upon elapse of a time $t_0$ in FIG. 33, the offset voltage $V_{of}$ becomes 0 V, and the carriage 3 is stably lifted in a reference levitated position which is fixed by the control circuit (compensating circuit) 28.

By generating a program which achieves such time characteristics of the offset voltage $V_{of}$ and incorporating the program in the digital processing means 38, the non-illustrated offset voltage generating mechanism is operated to apply the offset voltage $V_{of}$ of time characteristics shown in FIG. 33 to the adder 43.

Figure 32:
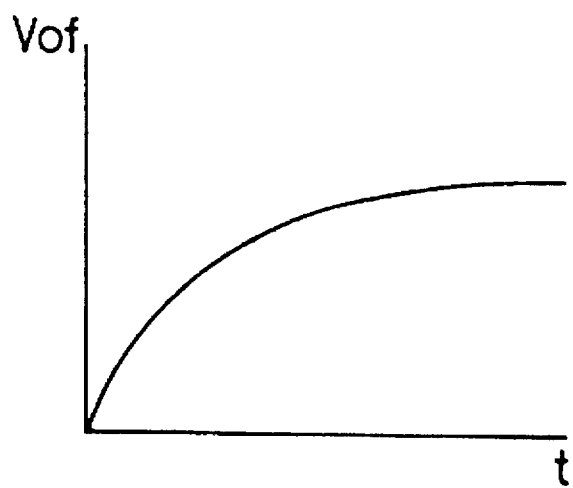

When the carriage is to be landed, the offset voltage $V_{of}$ should preferably have time characteristics as shown in FIG. 32. By carrying out the same processing as described above, the offset voltage $V_{of}$ of time characteristics shown in FIG. 32 is applied to the adder 43.

It is also possible to have the horizontal axis (time base) of FIGS. 32 and 33 represent the entire time required to fabricate a semiconductor, vary the offset voltage $V_{of}$ in a manner to correspond to a desired change in the lifted distance at the time the carriage arrives at each processing station, generate time characteristics over the overall fabrication process, and program such time characteristics. With such an arrangement, no shocks are produced when the carriage is lifted and landed, and a workpiece can smoothly be received and transferred at each processing station.

The levitated position of the carriage 3 is controlled such that vertical magnetic attractive forces applied to the carriage 3 by the electromagnets 4 and the gravity on the carriage 3 are equalized to each other. Specifically, since an input signal supplied to the phase compensator 34 determines an exciting current to be supplied to the electromagnets 4, if the ratio of a change in the levitated position of the carriage 3 to the distance between the carriage 3 and the magnetic pole surfaces of the electromagnets 4 is relatively small, then a change in leakage fluxes of a magnetic circuit composed of the electromagnets 4 and the carriage 3 is small, and if the weight of the carriage 3 remains unchanged, the input signal supplied to the phase compensator 34 as a result of the controlling operation remains generally unchanged.

The input signal (represented by $V_p$) supplied to the phase compensator 34 is determined by an output signal (represented by $V_s$) from the displacement sensors 8, an output signal 1 (offset voltage represented by $V_f$) supplied to the adder 43 from a digital-to-analog converter 44 of the control unit 29, which is an offset voltage/gain setting output supply means, and an amplification factor (represented by $K_p$) set by the gain setting unit 32 from an output signal 2 from a digital signal output means 45 of the control unit 29. The input signal $V_p$ is expressed according to the following equation:

$$V_p = K_p \times (V_s - V_f) \quad (1).$$

The D/A converter 44 and the digital signal output means 45 perform their functions in response to a command from the digital processing means (CPU) 38. The processing sequence carried out by the digital processing means 38 can freely be set up and modified according to the program 40. Consequently, the input voltage $V_p$ applied to the phase compensator 34 can freely be set according to the program 40.

As described above, when the ratio of a change in the levitated position of the carriage 3 to the distance between the carriage 3 and the magnetic pole surfaces of the electromagnets 4 is relatively small, the input voltage $V_p$ applied to the phase compensator 34 is maintained at a constant level. Therefore, in order to vary the levitated position of the carriage 3 (vary the sensor output voltage $V_s$) at the time the amplification factor $K_p$ is constant, the offset voltage $V_f$ may be varied under the condition defined by the equation (1). When the offset voltage $V_f$ is constant, the amplification factor $K_p$ of the gain setting unit 32 may be varied in the same fashion.

If the levitated position of the carriage 3 undergoes a large change, then leakage fluxes from the magnetic circuit composed of the electromagnets 4 and the carriage 3 varies greatly, and the number of effective magnetic fluxes for applying magnetic attractive forces to the carriage 3 is increased or reduced to a large extent. Therefore, the ratio between the exciting current supplied to the electromagnets 4 and the magnetic attractive forces acting on the carriage 3 varies largely.

If the distance between the carriage 3 and the magnetic pole surfaces of the electromagnets 4 increases greatly, then since more leakage fluxes are produced, it is necessary to increase the exciting current supplied to the electromagnets 4 for bearing the carriage 3. This results in a large reduction in the loop gain of the magnetic levitation control system which is composed of the electromagnets 4, the carriage 3, the displacement sensors 8, and the control circuit 28, thereby impairing stable levitation of the carriage 3.

When this happens, the carriage 3 cannot remain stably lifted only by adjusting the offset voltage $V_f$. However, when the amplification factor $K_p$ of the gain setting unit 32 is increased, the reduction in the loop gain of the magnetic levitation control system can be compensated for, thereby keeping stable levitation of the carriage 3. If the distance between the carriage 3 and the electromagnets 4 is reduced, then it can be compensated for by carrying out the above process inversely.

With the above arrangement of this embodiment, the levitated position of the carriage 3 can be set to any desired position by varying the amplification factor $K_p$ of the gain setting unit 32 and the offset voltage $V_f$.

Accordingly, in addition to the fact that shocks produced when the carriage is lifted and landed can be lessened, the distance that the carriage is lifted and the time required for the carriage to be lifted and landed can be adjusted. In the case where the magnetic levitation conveyor apparatus is incorporated in a semiconductor fabrication line, a workpiece such as a wafer are prevented from being damaged, and dirt and dust particles are prevented from being produced, resulting in an increased yield of semiconductors. At the same time, a workpiece can smoothly be received and transferred between lower stations and the carriage for increased conveying efficiency.

(9th embodiment)

A passive damper disposed in a conveyor passage according to a ninth embodiment will be described below with reference to FIG. 34. The passive damper according to this embodiment serves to absorb and dampen vibrations of a carriage when the carriage vibrates in a direction perpendicular to a conveyor passage when the carriage is moving in a tunnel while magnetically levitated.

The carriage suspended by levitation electromagnets is supported in a guiding direction by so-called guiding rigidity which is provided by spring forces produced by the electromagnets as described in detail with respect to the third embodiment. Therefore, if some external forces are applied to the carriage and the carriage is vibrated in a Y direction, then the vibrations of the carriage are not stopped as no dampening forces are imposed. Particularly when the moving carriage is to be stopped by an electromagnetic brake in the vicinity of a point where the carriage is to be stopped, the carriage suffers large vibrations and impinges upon a partition, producing metallic powder, or a waiting time has to be consumed before a workpiece is loaded into the carriage because a long period of time is needed to stop the vibrations of the carriage. The passive damper according to this embodiment is capable of quickly absorbing vibrations in a direction (guiding direction) perpendicular to the direction in which the magnetically levitated carriage is conveyed.

Figure 34:
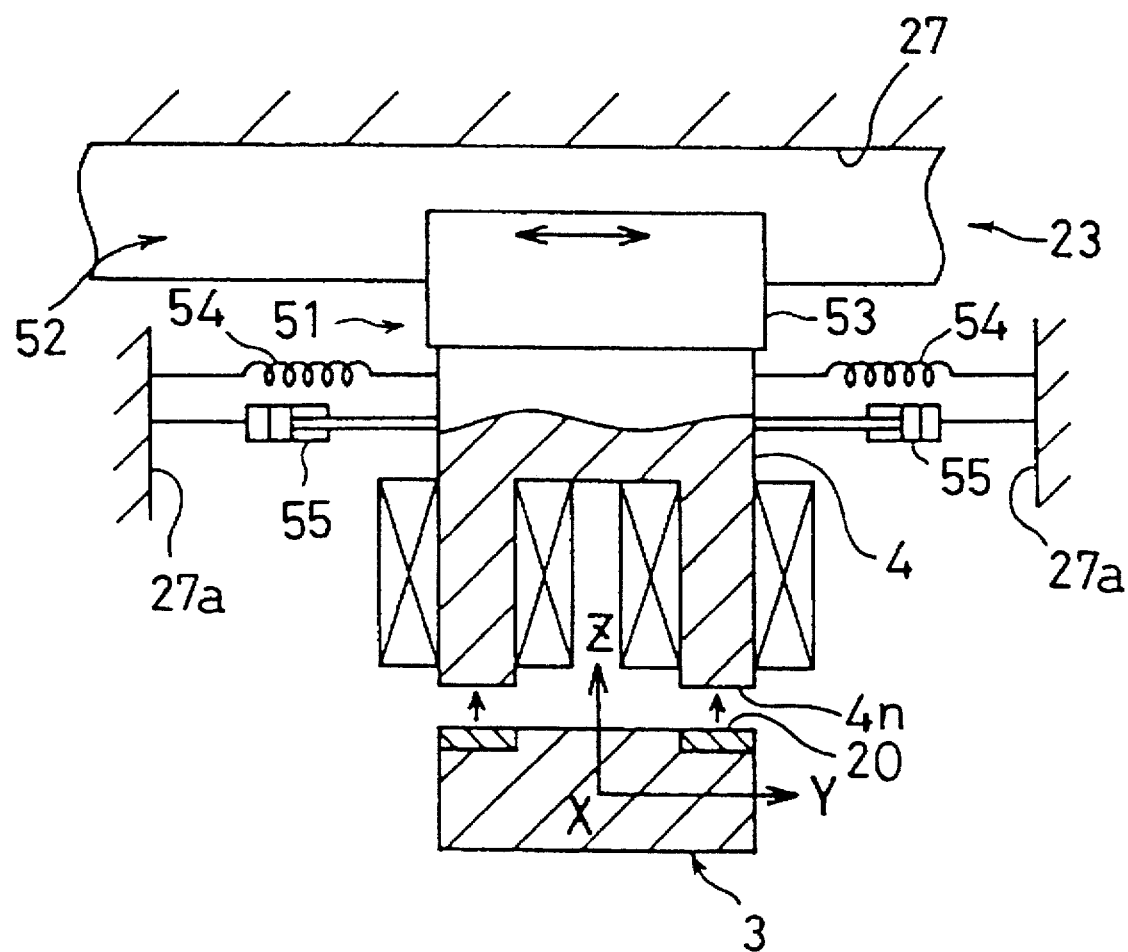
FIGS. 34 shows a magnetic levitation conveyor apparatus according to a ninth embodiment of the present invention, i.e., is a partial sectional side elevational view of a levitating electromagnet with a passive damper.

In a conveyor apparatus shown in FIG. 34, a carriage 3 disposed in a tunnel (not shown) defined by a partition is suspended by magnetic attractive forces generated by electromagnets 4 disposed in a conveyor passage 23, and moved in a conveying direction along the conveyor passage. In FIG. 34, X-, Y-, and Z-axes represent three-dimensional coordinate axes extending perpendicularly to each other. An X direction indicates the conveying direction, a Y direction indicates lateral directions perpendicular to the X direction, and a Z direction indicates the direction of magnetic attractive forces perpendicular to the X and Y directions, i.e., the direction normal to magnetic pole surfaces 4n of the electromagnets 4.

The conveyor apparatus has a passive damper comprising a support device 51 which supports the electromagnets 4 while holding them in a certain position with respect to the direction Z of attractive forces and the conveying direction X, and supports the electromagnets 4 movably with respect to the lateral directions Y perpendicular to the conveying direction X. The electromagnets 4, as a primary side, are arrayed at given intervals in the conveying direction X, and serve as magnetic bearings and are also called levitation magnetic poles. A magnetic member target (magnetic member) 20, as a secondary side, is mounted on the peripheral edge of an upper surface of the carriage 3, the magnetic member 20 being composed of a yoke which serves as a target to be levitated. The magnetic member 20 is positioned below the electromagnets 4 with a non-illustrated tunnel partition interposed therebetween so that the carriage 3 can be lifted out of contact with the tunnel under magnetic attractive forces produced by the electromagnets 4 which are energized. The electromagnets 4 as the primary side and the magnetic member 20 as the secondary side jointly constitute a magnetic bearing device composed of an array of magnetic bearings extending in the conveying direction X.

The support device 50 of the passive damper will be described below. A linear rail 52 extending in the lateral directions (Y direction) is disposed on a fixed wall 27 of a main frame at a stop position or the like in the conveyor passage. A linear bearing 53 is mounted on the upper end of each of the levitation electromagnets 4 for sliding movement to any desired position only in the Y direction along the linear rail 52. The linear rail 52 and the linear bearing 53 jointly serve as a linear guide support device 51 having a degree of freedom in the Y direction. Each of the levitation electromagnets 4 is movable with the linear bearing 53 only in the Y direction, and has no play and is not movable about the X and Z directions and not rotatable around the X-, Y-, and Z-axes. Therefore, each levitation electromagnet 4 has no degree of motion freedom about the X and Z directions and around the X-, Y-, and Z-axes, and has a degree of translation freedom that can be set as desired in the Y direction.

The support device 51 holds the levitation electromagnet 4 in a certain position in the Y direction with fixed walls 27a of the main frame that are disposed in confronting relation to the conveyor passage, and a pair of springs 54 and a pair of dashpots 55, as a dampening force applying means, which are disposed between the fixed walls 27a and the electromagnet 4 that is positioned between the fixed walls 27a. A lubricant applied between the linear rail 52 and the linear bearing 53 also serves as the dampening force applying means because the viscosity of the lubricant and the frictional resistance of sliding portions of the linear rail 52 and the linear bearing 53 produce dampening forces. When the electromagnet 4 vibrates in the Y direction through the linear guide unit, the lubricant can dampen vibrations of the electromagnet 4 in the Y direction. However, the lubricant alone is not effective enough to produce sufficient dampening forces. In this embodiment, desired appropriate dampening forces can be produced by spring forces from the springs 54 and a dampening action of the dashpots 55 which have a high dampening efficiency, thereby achieving a real passive stable axis (Y-axis). Specifically, while the electromagnet 4 is limited in its degree of translation freedom in the Y-axis direction by the springs 54 and the dashpots 55, the Y-axis can be made a good passive stable axis by suitably adjusting the springs 54 and the dashpots 55 which are restricting elements.

With the passive damper being disposed in the vicinity of a stop point in the conveyor passage, vibrations of the carriage which are produced in the vicinity of the stop point can quickly be absorbed and dampened.

(10th embodiment)

A vibration dampening mechanism (damper) using magnets in a tunnel according to a tenth embodiment of the present invention will be described below with reference to FIGS. 35 and 36.

Figure 35:
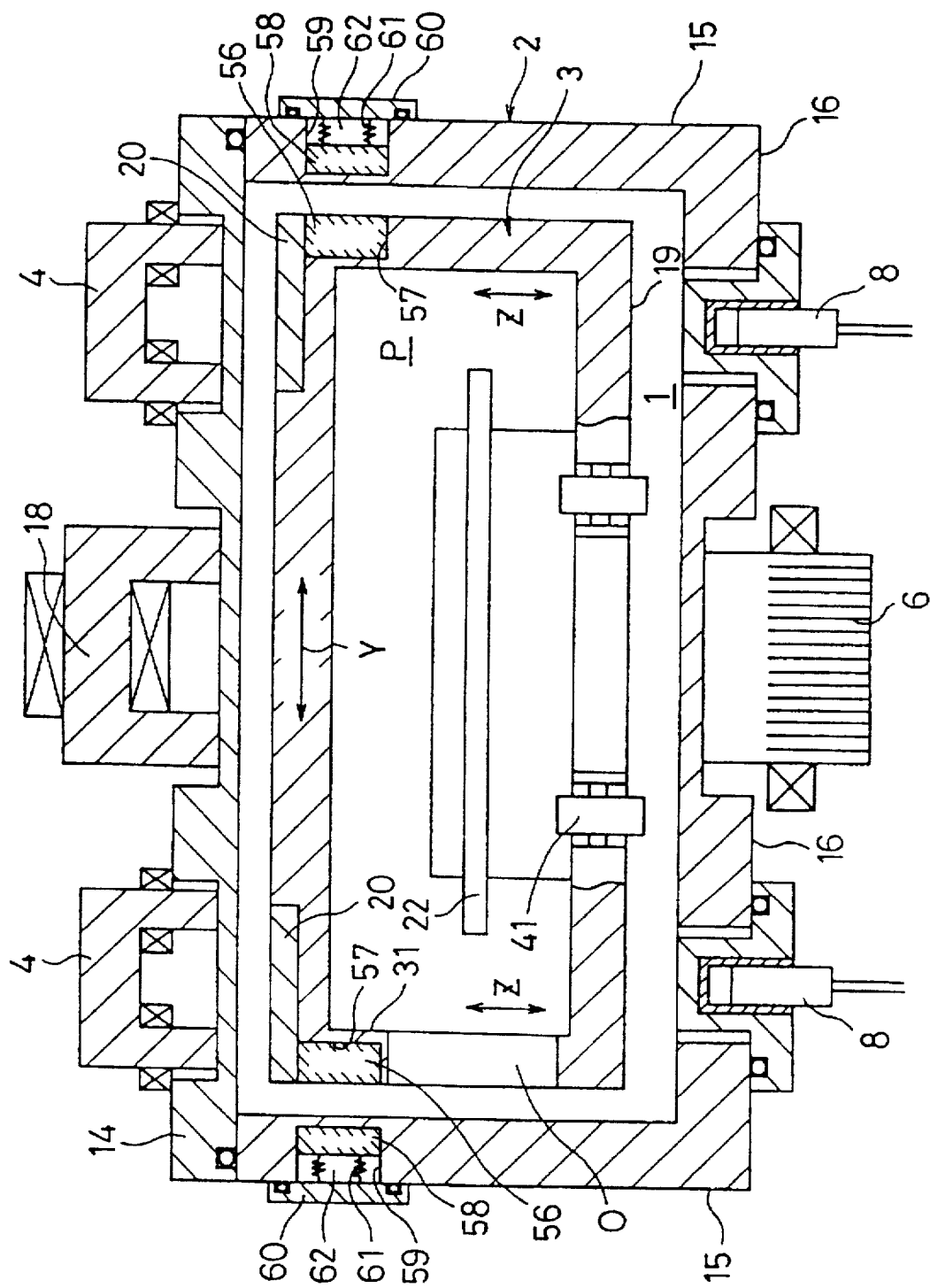
FIGS. 35 and 36 show a magnetic levitation conveyor apparatus according to a tenth embodiment of the present invention.
Figure 36:
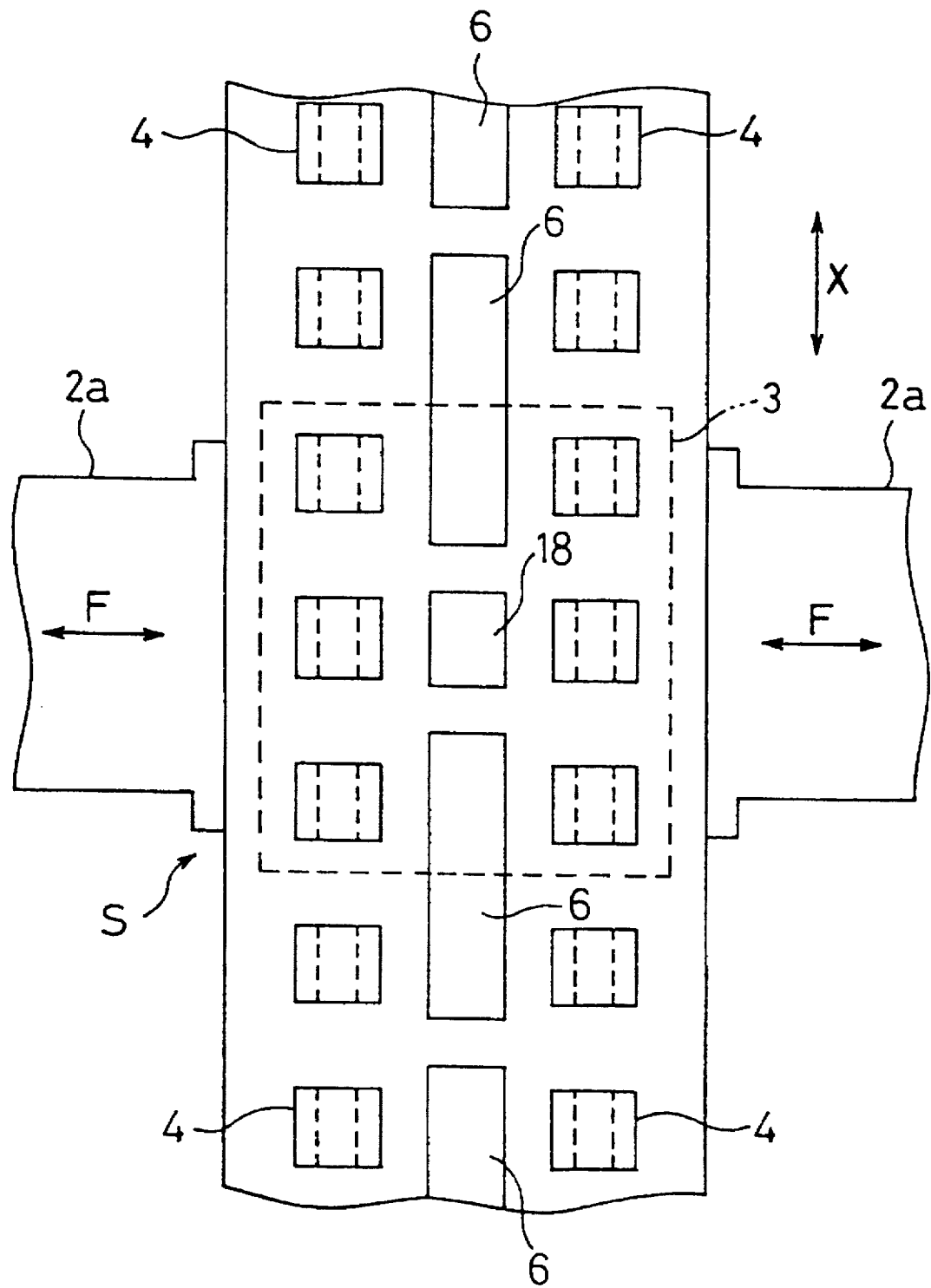

FIG. 35 is a sectional front elevational view of a magnetic levitation conveyor apparatus according to this embodiment, and FIG. 36 is a plan view of the magnetic levitation conveyor apparatus. A basic structure of the magnetic levitation conveyor apparatus has been described in detail with respect to the third embodiment. Like or corresponding parts are denoted by like or corresponding reference numerals, and will not be described in detail below.

A pair of permanent magnets 56 as first magnets is attached respectively to opposite sides of an outer shell 19 of the carriage 3 in the Y direction. The first permanent magnets 56 are fixedly mounted in respective recesses 57 defined in the sides of the carriage. The carriage 3 has a rectangular opening 0 for taking a wafer 22 into and out of the carriage 3.

Permanent magnets 58 as second magnets are attached respectively to opposite side walls 15 of the partition 2 for producing magnetic forces between themselves and the first permanent magnets 56 and applying dampening forces against vibrations of the carriage 3. The opposite side walls 15 have bottomed grooves 59 defined therein which open outwardly (toward the atmospheric side) and are aligned with the first permanent magnets 56. The second permanent magnets 58 are fitted respectively in the grooves 59 for back-and-forth movement in the Y direction. The grooves 59 have respective openings covered with lids 60 and fully closed by seals. The lids 60 are removably mounted on the side walls 15.

Springs 61 for producing spring forces in the Y direction are interposed between the lids 60 and the second permanent magnets 58 for normally biasing the second permanent magnets 58 toward inner surfaces of the side walls 15. Inner spaces of the grooves 59 in which the springs 61 are disposed are filled with oil 62 as a means for producing a dampening action. Such an arrangement including the second permanent magnets 58 serves to apply dampening forces against vibrations of the carriage 3. For producing a dampening action, resilient members such as of rubber may be employed in place of the oil 62. In such a modification, the springs 61 are interposed through the resilient members between the lids 60 and the second permanent magnets 58.

In this embodiment, the first and second permanent magnets 56, 58 have such magnetic poles which are repelled from each other.

In the magnetic levitation conveyor apparatus of the above arrangement, the carriage 3 is lifted in the tunnel 1 surrounded by the partition 2 by the electromagnets 4, and propelled and moved forward by the linear motors 6. At a stop position S, the carriage 3 is stopped by the electromagnetic brake 18, and a wafer 22 is taken into and out of the carriage 3 through the opening O using a robot arm or the like (not shown).

While the carriage 3 is moving in the tunnel 1, the carriage 3 is positioned in the Y direction by being pulled at all times toward the central position in the Y direction because the magnetic member 20 and the magnetic pole surfaces of the electromagnets 4 have equal widths. When the carriage 3 is in the central position in the Y direction, repulsive forces acting between the first permanent magnets 56 on the carriage 3 and the second permanent magnets 58 on the partition 2 balance each other, allowing the carriage 3 to move while kept in the central position. If the carriage 3 is displaced off the central position due to centrifugal forces acting thereon or vibrations produced thereon, then the carriage 3 is always pushed back to the central position in the Y direction by repulsive forces acting between the permanent magnets 56, 58. Therefore, the carriage 3 is prevented from contacting the inner surfaces of the partition 2. Since the second permanent magnets 58 on which magnetic forces from the first permanent magnets 56 act are attached to the tunnel partition through the springs and the dampening means, when the carriage 3 vibrates, the repulsive forces are varied and a resultant motion is transmitted to the permanent magnets 58. As the motion is dampened, the vibrational energy is absorbed, and the vibrations of the carriage 3 are dampened. Accordingly, even when the carriage 3 starts being vibrated, its vibrations are quickly dampened.

The first and second permanent magnets 56, 58 may comprise electromagnets rather than permanent magnets.

(11th embodiment)

A conveyor mechanism with a vertical tunnel according to an eleventh embodiment will be described below with reference to FIGS. 37 and 38.

Figure 37:
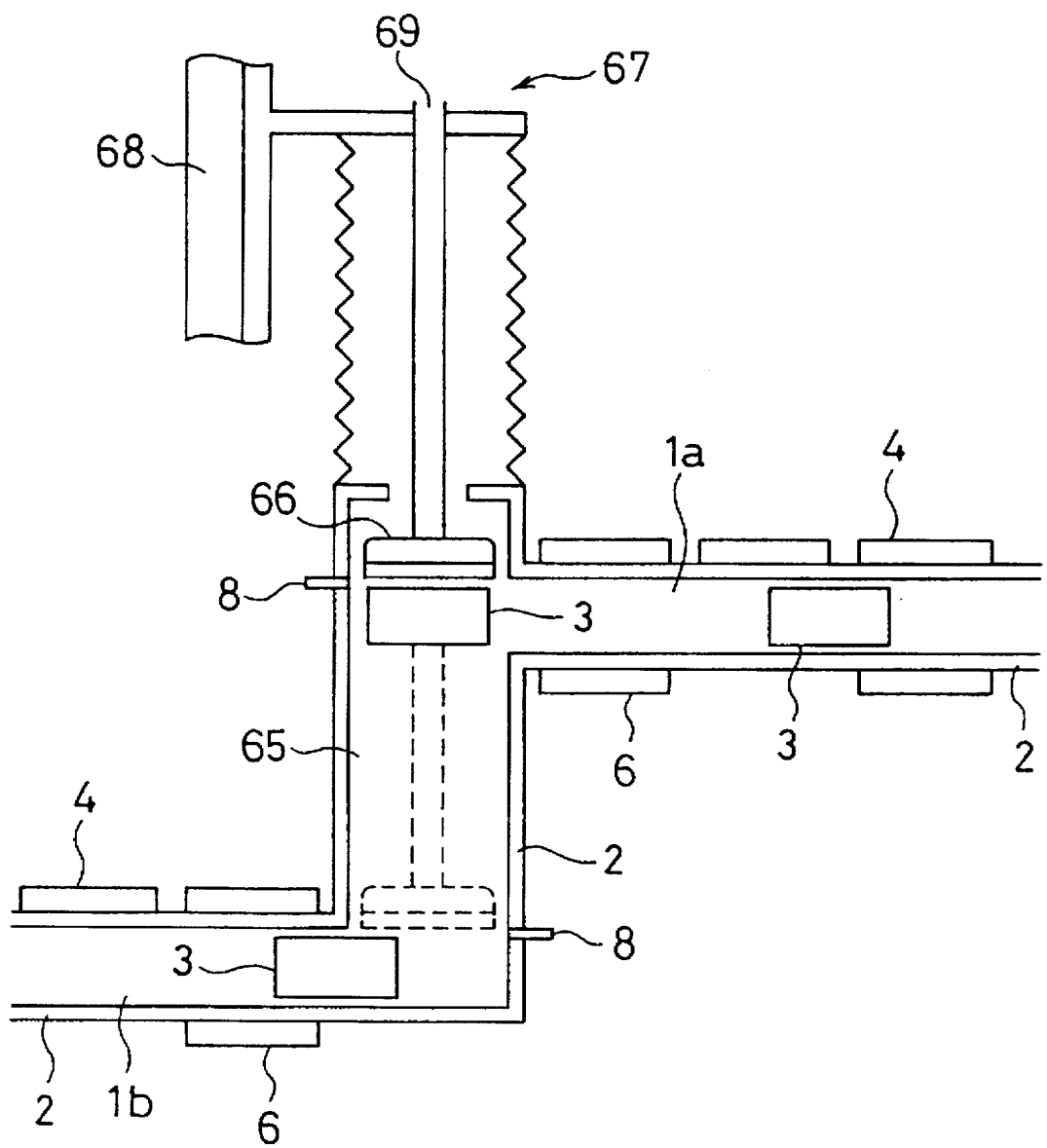
FIGS. 37 and 38 show a magnetic levitation conveyor apparatus according to an eleventh embodiment of the present invention.

In FIG. 37, a first conveyor passage 1a in which a carriage 3 moves is separated in space by a partition 2 which defines therein a highly purified space such as of a high vacuum or the like that serves as a tunnel.

The carriage 3 is lifted out of contact with the partition 2 under magnetic attractive forces generated by levitation electromagnets 4 disposed outside of the partition 2. The levitation electromagnets 4 magnetically attract and lift the carriage 3 which has a magnetic member. Linear motors 6 which comprise electromagnets generate an eddy current in an electrically conductive member mounted on a lower surface of the carriage 3 to propel the carriage 3 horizontally for thereby move the carriage 3 horizontally out of contact with the partition 2.

A second conveyor passage 1b differs in height from the first conveyor passage 1a, but is structurally similar thereto in that the carriage 3 in the tunnel is lifted by electromagnets 4 and moved horizontally by linear motors 6. The magnetic levitation conveyor apparatus includes a conveyor passage 65 as a vertical tunnel which connects the first conveyor passage 1a and the second conveyor passage 1b that have different heights.

The vertical conveyor passage 65 comprises a table 66 having a levitation mechanism and a linear motor for magnetically levitating the carriage 3 out of contact with the tunnel, and an elevator mechanism 67 for vertically moving the table 66. The elevator mechanism 67 vertically moves a shaft 69 with respect to a fixed side 68 while keeping a vacuum condition in the vertical conveyor passage 65 which is separated in space by a partition.

The carriage 3 which has been lifted in the first conveyor passage 1a by the levitation electromagnets 4 and moved therein by the linear motors 6 enters the vertical conveyor passage 65. The linear motor of the table 66 produces braking forces to stop the carriage 3 on the table 66 of the vertical conveyor passage 65. The carriage 3 is supported by the table 6 out of contact with the table 66 by levitation electromagnets. The table 66 is then lowered by the elevator mechanism 67. When the table 66 reaches a position horizontally aligned with the second conveyor passage 1b, a sensor 8 detects the position of the carriage, and stops the movement of the elevator mechanism 67. At this time, the carriage 3 is at the same height as the second conveyor passage 1b. In this manner, the carriage 3 can move between conveyor passages of different heights, e.g., from the first conveyor passage 1a to the second conveyor passage 1b or from the second conveyor passage 1b to the first conveyor passage 1a, while being held out of contact with the tunnel partition. The vertical conveyor passage 65 also defines a highly purified space such as of a high vacuum separated in space by the partition 2 which is of the same material as that of the conveyor passages 1a, 1b.

Figure 38:
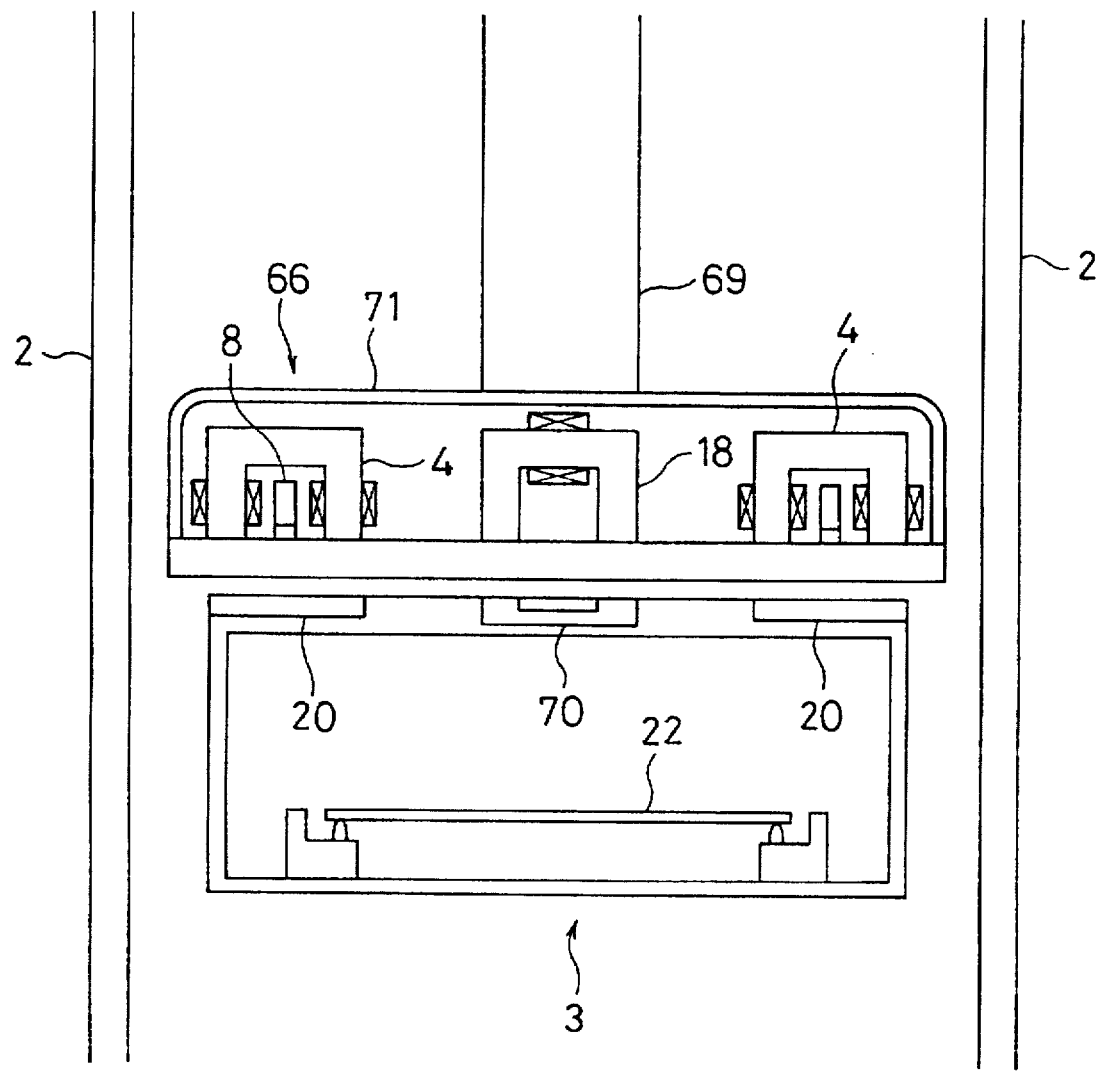

FIG. 38 shows a detailed structure of the table 66 and the carriage 3. The table 66 has levitation electromagnets 4 and a propulsion electromagnet 18. The carriage 3 serves to support and convey a semiconductor wafer 22, for example. To an upper surface of the carriage 3, there are fixed a magnetic member 20, which is a target of the levitation electromagnets 4, is fixed to an upper surface of the carriage 3, and a magnetic member 70, which is a target of the propulsion electromagnet 18.

When an electric current flows through excitation coils of the levitation electromagnets 4, the levitation electromagnets 4 generate magnetic attractive forces to attract the magnetic member 20 to lift the carriage 3 out of contact with the partition. The propulsion electromagnet 18 produces horizontal magnetic attractive forces to brake and stop horizontally the carriage 3 which has entered directly below the table 66. To move the carriage 3 into another conveyor passage, the propulsion electromagnet 18 can generate horizontal propulsive forces to propel the carriage 3 into the other conveyor passage. Sensors 8 disposed between magnetic poles of each of the levitation electromagnets 4 serve to detect the levitated position of the carriage 3. Based on the detected positional data of the carriage 3, the electric current flowing through the coils of the levitation electromagnets 4 is controlled to keep the carriage 3 in a suitable levitated position.

These electromagnets 4, 18 and sensors 8 are covered with a can 71, so that the high-vacuum space in the partition 2 will be prevented from being contaminated by any contaminants produced from these electromagnets and sensors.

In the above description, the workpiece to be conveyed is a semiconductor wafer. However, the present embodiment is also applicable to a wide variety of apparatus for conveying a workpiece in a tunnel while keeping the workpiece lifted out of contact with the tunnel, such as for conveying a liquid crystal substrate in the production of liquid crystal displays or the like. The highly purified environment is not limited to a vacuum condition, but may be a highly pure inert gas atmosphere or the like.

As described above, the conveyor apparatus according to this embodiment has a plurality of conveyor passages as tunnels which have different vertical heights and a vertical conveyor passage as a tunnel which interconnects the above conveyor passages. Therefore, the conveyor apparatus can move a workpiece between the conveyor passages which have different vertical heights while keeping the workpiece lifted out of contact with the partitions. Since the carriage can be moved vertically in the tunnel surrounded by the partition, the magnetic levitation conveyor apparatus can find an increased range of applications.

(12th embodiment)

A joint chamber for loading a conveyed workpiece into a processing device according to a twelfth embodiment of the present invention will be described below with reference to FIGS. 39 through 41.

Figure 41:
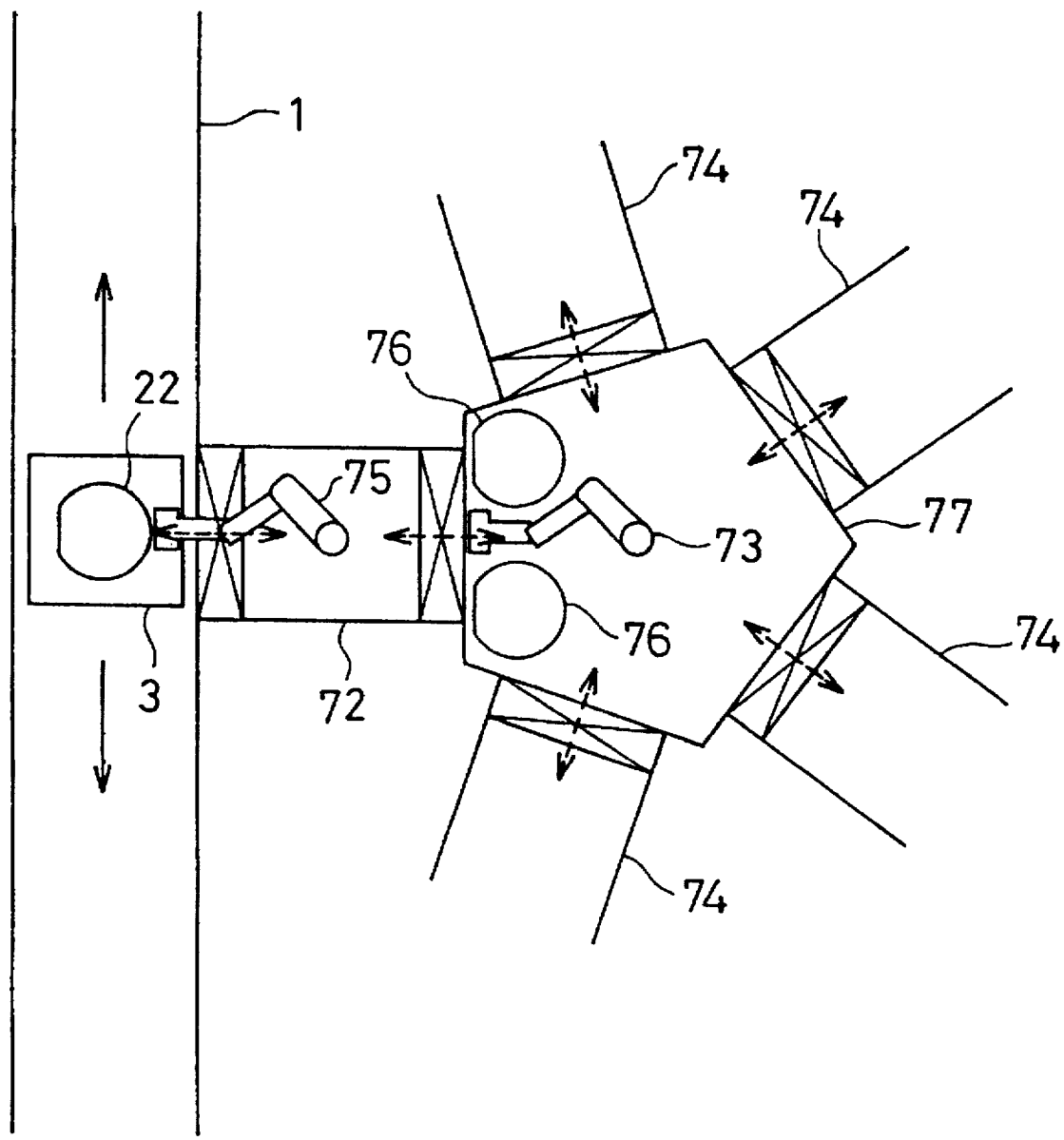

FIG. 41 shows a conventional arrangement for loading a conveyed workpiece into a processing device. A tunnel 1 is a conveyor passage of a magnetic levitation conveyor apparatus in which a carriage 3 supporting a workpiece such as a semiconductor wafer, a liquid crystal substrate, or the like moves while lifted out of contact with a partition of a closed space. The tunnel 1 defines therein a highly purified space which may be of a vacuum or filled with a highly pure $N_2$ gas or the like. Although not shown, there are disposed, outside of the partition of the tunnel 1, electromagnets having magnetic poles for magnetically levitating the carriage in the closed space, displacement sensors for measuring the gap between the partition surface of the closed space and the carriage, control circuits for controlling exciting currents supplied to the electromagnets based on signals from the sensors, accelerating/decelerating linear motors for moving the carriage, and a stop device for stopping the moving carriage.

In order that a conveyed workpiece such as a semiconductor wafer from the tunnel 1 can be loaded into processing chambers 74 for processing the workpiece by way of evaporation, photolithography, or the like, a chamber 72 is provided which serves as a buffer for keeping the workpiece clean between the tunnel 1 and the processing chamber 74.

If a substrate 22 such as a wafer is transferred between the carriage 3 and one of the processing chambers 74 with a robot 73 in an antechamber 77, then the robot 73 is required to have a long reach, and hence its robot hand suffers a rigidity problem. To avoid the above drawback, another handling robot 75 is disposed in the chamber 72 for transferring the substrate 22 from the carriage 3 in the closed space onto a support base 76, and the robot 73 in the antechamber 77 draws the substrate 22 from the support base 76 and transfers the substrate 22 into one of the processing chambers 74.

As described above, if the robot 73 in the antechamber 77 directly transfers the wafer from the carriage 3 in the closed space into one of the processing chambers 74, then the robot hand of the robot 73 is required to have a long reach, and hence suffers a rigidity problem. The handling robot 75 additionally disposed in the chamber 72 for transferring the substrate 22 into one of the processing chambers 74 through a two-step process is expensive and requires complex controls. Since the substrate 22 is transferred twice by the robot 75 in the chamber 72 and the robot 73 in the antechamber 77, the substrate 22 tends to be contaminated with more particles as the number of times that the substrate 22 is handled by the robots is increased.

Figure 39:
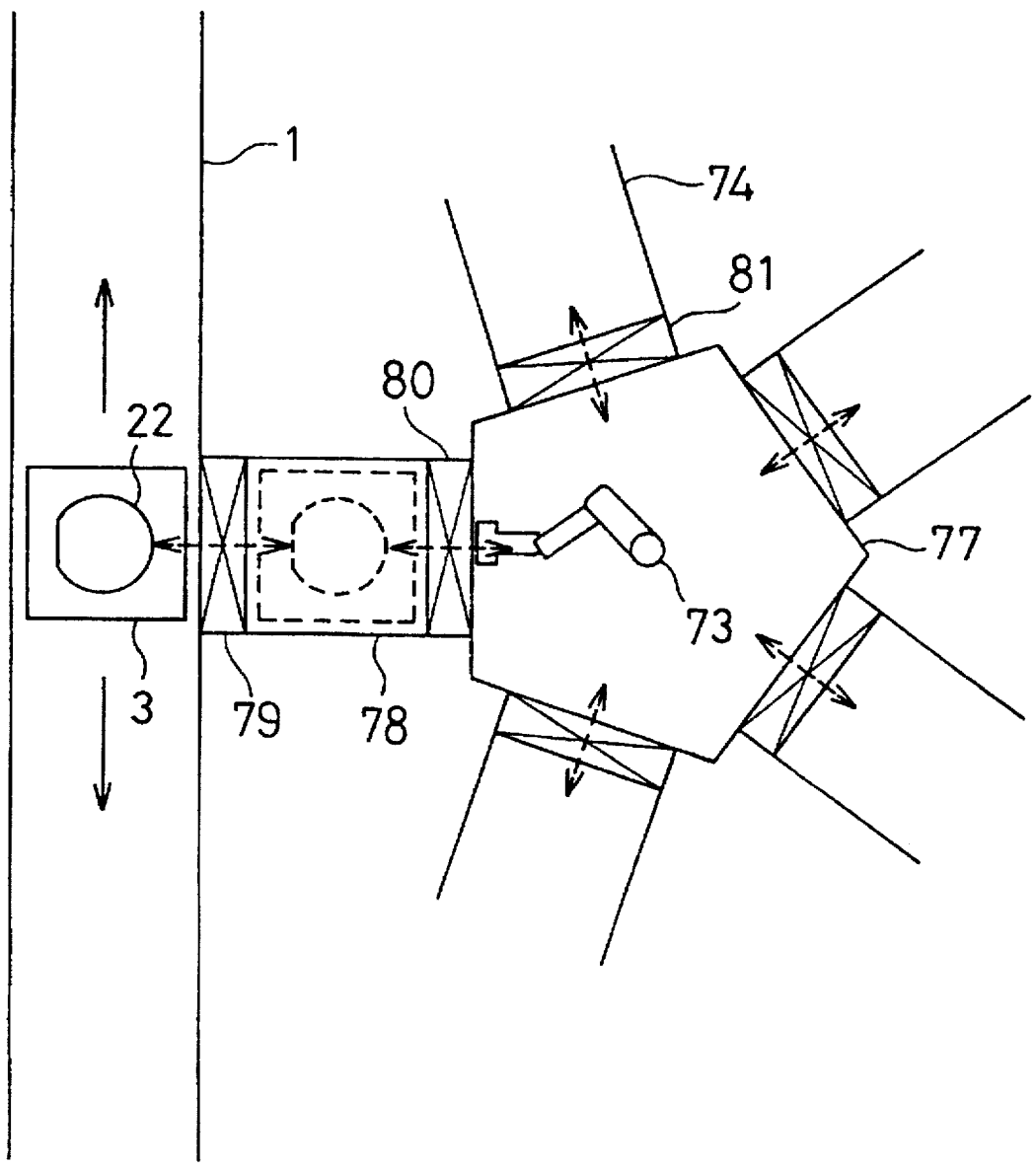
FIGS. 39 through 41 show a magnetic levitation conveyor apparatus according to a twelfth embodiment of the present invention.

FIG. 39 illustrates an embodiment in which a joint chamber is employed.

A joint chamber 78 connected to a tunnel 1 is disposed between the tunnel 1 and an antechamber 77, and is associated with a partition valve 79 on a tunnel 1 side and a partition valve 80 on an antechamber 77 side. The joint chamber 78 has a vacuum pump or a source of a highly pure inert gas. Therefore, a highly purified space of the same atmosphere as the tunnel 1 and processing chambers 74 can be created in the joint chamber 78. Outside of the joint chamber 78, there are disposed electromagnets having magnetic poles for magnetically levitating the carriage in the closed space, displacement sensors for measuring the gap between the partition surface of the joint chamber and the carriage, control circuits for controlling exciting currents supplied to the levitation electromagnets based on signals from the sensors, electromagnets serving as accelerating/ decelerating linear motors for moving the carriage, and an electromagnet serving as a stop device for stopping the carriage.

The joint chamber 78 operates as follows: With the valves 79, 80 closed, the joint chamber 78 is evacuated by the vacuum pump. When the degree of vacuum in the joint chamber 78 becomes equal to that in the tunnel 1, the valve 79 is opened to produce the same atmosphere in the joint chamber 78 as in the tunnel 1. The carriage 3 which supports a substrate 22 moves in the tunnel 1, and is stopped in front of the joint chamber 78 by the stop device. When the carriage 3 is accelerated toward the joint chamber 78 by the linear motors, the carriage 3 enters the joint chamber 78 while being magnetically levitated. The carriage 3 is then stopped in the joint chamber 78 by the stop device in the joint chamber 78.

Then, the valve 79 is closed and the valve 80 is opened to equalize the atmosphere in the joint chamber 78 to the atmosphere in the antechamber 77. A valve 81 in one of the processing chambers 74 is opened, and the substrate 22 is pulled from the carriage 3 by a robot 73 in the antechamber 77 and transferred into the processing chamber 74. Conversely, a substrate 22 can similarly be taken from the processing chamber 74 by the robot 73, and transferred to the carriage 3.

Figure 40:
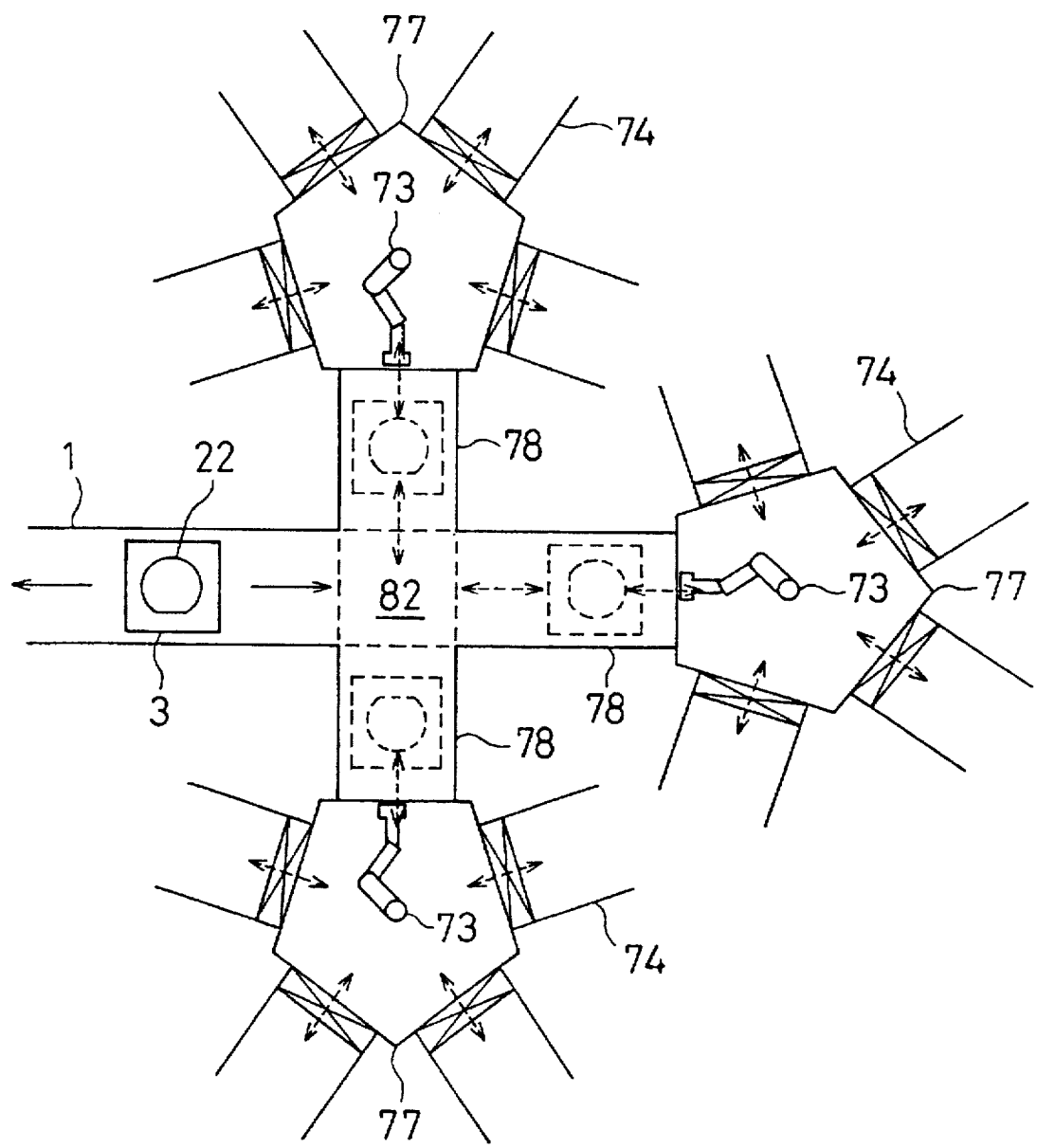

FIG. 40 shows a joint chamber according to another arrangement. In this arrangement, antechambers 77 are connected to a tunnel 1 in three directions. As shown in FIG. 40, the tunnel 1 has an end 82 connected to the antechambers 77 in three directions through respective three joint chamber 78. Each of the joint chambers 78 has levitation electromagnets and linear motors for magnetically levitating and moving a carriage 3. In each of the joint chambers 78, the carriage 3 can be moved and stopped while being held out of contact with the wall thereof. The carriage 3 which has been moved through the tunnel 1 that serves as a conveyor passage is stopped at the end 82, and moved into one of the joint chambers 78 directly connected to the closed space in the tunnel 1 while being held out of contact with the wall thereof. In the joint chamber 78, a workpiece 22 such as a wafer can be transferred between the carriage 3 and a corresponding processing chamber 74 by a robot 73 in the antechamber 77. The workpiece 22 can also be transferred between the processing chambers 74 through the three joint chambers 78 via a route composed of one of the joint chambers 78, the end 82, and another of the joint chambers 78, rather than via the tunnel 1.

As described above, the conveyor apparatus according to this embodiment has the joint chamber for loading a workpiece directly into the processing device, and the joint chamber has the means for levitating the carriage and moving and stopping the carriage while held out of contact with the partition. Accordingly, the wafer can be transferred to and from the processing chamber with a single robot in the antechamber. The substrate can thus be loaded directly into the processing device while being kept in the same purified atmosphere as in the tunnel, without requiring an increased number of handling robots and suffering the problem of particle contamination.

Industrial applicability

As described above, the magnetic levitation conveyor apparatus according to the present invention can move a carriage in a tunnel defined by a partition while stably levitating the carriage out of contact with the partition. Therefore, the magnetic levitation conveyor apparatus can convey a workpiece on the carriage in a highly purified space such as of a vacuum or a nitrogen gas atmosphere through a conveyor passage including an orthogonal branch, without being contaminated by dirt and dust particles which would otherwise be produced by contact with the partition. The magnetic levitation conveyor apparatus is suitable for use in semiconductor or liquid crystal substrate fabrication factories which require workpieces to be conveyed in magnetic levitation conveyor apparatus in a highly purified space and have a number of various processing devices.

We claim:

1. A magnetic levitation conveyor apparatus, comprising:
   a tunnel defined by a partition;
   a carriage movable in a levitated state through said tunnel for conveying a workpiece;
   levitation electromagnets having at least two rows of magnetic poles disposed on an upper portion of said partition of said tunnel for lifting the carriage out of contact with the partition;
   electromagnets serving as linear motors and having at least one row of magnetic poles disposed on a lower portion of said partition of said tunnel for moving said carriage out of contact with the partition;
   at least two rows of displacement sensors disposed on said partition for detecting a levitated portion of said carriage; and
   control circuits for controlling exciting currents supplied to said levitation electromagnets based on output signals from said displacement sensors,
   said carriage having, on an upper surface thereof, two parallel magnetic elements corresponding to said two rows of magnetic poles of the levitation electromagnets, and also having, on a lower surface thereof, an electrically conductive member corresponding to the magnetic poles of the electromagnets serving as the linear motors.

2. A magnetic levitation conveyor apparatus according to claim 1, wherein said levitation electromagnets, said linear motors, and said displacement sensors are disposed outside of said partition, and housed in respective thin-wall casings extending through said partition and partly exposed in said tunnel.

3. A magnetic levitation conveyor apparatus according to claim 1, wherein said partition includes at least upper and lower partitions, each of said upper and lower partitions comprises an inner shielding thin plate and an outer thick reinforcing plate which is rigid enough to reinforce said thin plate, said levitation electromagnets and said linear motors being disposed outside of said tunnel and extending through said reinforcing plate so as to be positioned adjacent to said thin plate.

4. A magnetic levitation conveyor apparatus according to claim 1, wherein said tunnel has substantially orthogonal branched passages having at least two rows of levitation electromagnets, and wherein said carriage has two parallel magnetic elements perpendicular to said magnetic elements thereof corresponding to said two rows of levitation electromagnets.

5. A magnetic levitation conveyor apparatus according to claim 1, wherein said tunnel maintains a vacuum therein.

6. A magnetic levitation conveyor apparatus according to claim 1, wherein said tunnel maintains a nitrogen gas atmosphere therein.

7. A magnetic levitation conveyor apparatus according to claim 1, wherein the two parallel magnetic elements and the two parallel magnetic elements perpendicular thereto on the upper surface of said carriage jointly serve as a magnetic member having a shape of a substantially centrally open rectangle.

8. A magnetic levitation conveyor apparatus according to claim 7, wherein each of said levitation electromagnets has a cross-sectionally C-shaped magnetic pole, said magnetic member has surfaces each having grooves defined therein and extending in a direction in which said carriage is movable and in a direction perpendicular thereto, said grooves corresponding to magnetic pole surfaces of the cross-sectionally C-shaped magnetic pole of each of said levitation electromagnets.

9. A magnetic levitation conveyor apparatus according to claim 7, wherein each of said levitation electromagnets has a cross-sectionally C-shaped magnetic pole, said magnetic member has corners spaced from sides thereof by gaps in a direction in which said carriage is movable and in a direction perpendicular thereto, providing ridges corresponding to magnetic pole surfaces of the cross-sectionally C-shaped magnetic pole of each of said levitation electromagnets.

10. A magnetic levitation conveyor apparatus according to claim 1, wherein said levitation electromagnets include levitation electromagnets arrayed along a main conveyor passage and levitation electromagnets arrayed along a branched conveyor passage, said levitation electromagnets arrayed along the main and branched conveyor passages being disposed adjacent to each other in a branched point of the tunnel having substantially orthogonal branched passages, further including switching means for switching the levitation electromagnets in an operative condition into an inoperative condition and the levitation electromagnets in an inoperative condition in a different conveying direction into an operative condition for thereby changing the direction of movement of said carriage between said main and branched conveyor passages.

11. A magnetic levitation conveyor apparatus according to claim 1, further comprising a group of switches for supplying and cutting off currents to said levitation electromagnets to control switching of the levitation electromagnets as said carriage moves, a selective signal generator for outputting a signal to select levitation electromagnets and displacement sensors which are to be turned on and off, and open and close those of said switches which are associated with the selected levitation electromagnets and displacement sensors, a gain setting unit for setting gains of the control circuits, a target levitation voltage setting unit for setting a target levitation voltage which is a target levitation value, and means for simultaneously gradually varying the gains of the control circuits or the target levitation voltages as target levitation values through said gain setting unit and/or said target levitation voltage setting unit, with respect to at least one levitation electromagnet to be turned off which are selected by said selective signal generator, when the levitation electromagnets are switched by the control circuits as the carriage is moved by said linear motors.

12. A magnetic levitation conveyor apparatus according to claim 1, further comprising a target levitation voltage setting unit for setting a target levitated position of said carriage, and/or a gain setting unit for setting gains of the control circuits, said target levitation voltage setting unit and/or said gain setting unit including digital-to-analog converting means and digital processing means, said digital processing means having a modifiable processing program for lessening shocks produced when said carriage is lifted and landed.

13. A magnetic levitation conveyor apparatus according to claim 1, further comprising a support device for supporting each of said levitation electromagnets held in a predetermined position with respect to directions in which said carriage is lifted and moved, and supporting each of said levitation electromagnets movably in lateral directions perpendicular to the direction in which said carriage is moved, said support device having dampening force applying means including springs and dashpots disposed between each of said levitation electromagnets and fixed walls of said tunnel.

14. A magnetic levitation conveyor apparatus according to claim 1, further comprising first magnets attached to respective opposite sides of said carriage, and second magnets attached to respective opposite side walls of said partition for producing magnetic forces between themselves and said first magnets, said second magnets being associated with dampening means.

15. A magnetic levitation conveyor apparatus according to claim 1, further comprising a plurality of tunnels having different heights, a vertical tunnel interconnecting said tunnels, said vertical tunnel including a table having levitation electromagnets and linear motors for magnetically lifting said carriage, and an elevator mechanism for vertically moving said table.

16. A magnetic levitation conveyor apparatus according to claim 1, further comprising a joint chamber connected to said tunnel for loading the workpiece directly into a processing device, electromagnets disposed outside of said joint chamber for magnetically lifting said carriage, electromagnets disposed outside of said joint chamber and serving as linear motors for moving said carriage, and electromagnet disposed outside of said joint chamber for stopping said carriage, and partition valves disposed at respective front and rear ends of said joint chamber.

* * * * *

UNITED STATES PATENT AND TRADEMARK OFFICE
CERTIFICATE OF CORRECTION

PATENT NO.:   5,641,054
DATED     :   June 24, 1997
INVENTOR(S):  Satoshi MORI et al.

It is certified that error appears in the above-identified patent and that said Letters Patent is hereby corrected as shown below:

Column 30, line 31, change "comers" to --corners--.

Signed and Sealed this

Seventh Day of October, 1997

Attest:

BRUCE LEHMAN

Attesting Officer

Commissioner of Patents and Trademarks